(12) United States Patent
Kim et al.

(10) Patent No.: US 8,344,368 B2
(45) Date of Patent: Jan. 1, 2013

(54) FUSED CYCLIC COMPOUND AND ORGANIC ELECTRONIC DEVICE

(75) Inventors: Kong-Kyeom Kim, Daejeon (KR); Jae-Chol Lee, Daejeon (KR); Ji-Eun Kim, Daejeon (KR); Hyun Nam, Daejeon (KR); Jun-Gi Jang, Daejeon (KR); Byung-Sun Jeon, Seoul (KR)

(73) Assignee: LG Chem, Ltd., Seoul (KR)

(*) Notice: Subject to any disclaimer, the term of this patent is extended or adjusted under 35 U.S.C. 154(b) by 242 days.

(21) Appl. No.: 12/945,673

(22) Filed: Nov. 12, 2010

(65) Prior Publication Data

US 2011/0278549 A1    Nov. 17, 2011

(30) Foreign Application Priority Data

Nov. 13, 2009  (KR) .................. 10-2009-0109940

(51) Int. Cl.
*H01L 29/08* (2006.01)

(52) U.S. Cl. ............. 257/40; 257/13; 257/57; 257/66; 257/72; 257/98

(58) Field of Classification Search .............. None
See application file for complete search history.

(56) References Cited

U.S. PATENT DOCUMENTS

| | | | |
|---|---|---|---|
| 5,645,948 A | 7/1997 | Shi et al. | |
| 2003/0165715 A1 | 9/2003 | Yoon et al. | |
| 2004/0219386 A1 | 11/2004 | Thoms | |
| 2007/0134511 A1* | 6/2007 | Kawamura et al. | 428/690 |
| 2007/0200490 A1 | 8/2007 | Kawamura et al. | |
| 2007/0247059 A1 | 10/2007 | Cho | |
| 2007/0262706 A1 | 11/2007 | Yoon | |
| 2008/0093982 A1 | 4/2008 | Cho | |
| 2008/0303414 A1 | 12/2008 | Cho | |
| 2009/0200542 A1 | 8/2009 | Cho | |

FOREIGN PATENT DOCUMENTS

| | | |
|---|---|---|
| KR | 10-2003-0067773 | 8/2003 |
| KR | 10-2006-0051606 | 5/2006 |
| KR | 10-2008-0096733 | 11/2008 |
| WO | WO 2005/097756 | 10/2005 |
| WO | WO 2006/003842 | 1/2006 |

* cited by examiner

*Primary Examiner* — Kyoung Lee
(74) *Attorney, Agent, or Firm* — McKenna Long & Aldridge, LLP

(57) ABSTRACT

The present invention relates to a new fused cyclic compound, and an organic electronic device using the same.

Since the compound according to an exemplary embodiment of the present invention may be used as a material of an organic material layer of the organic electronic device and in particular may effectively inject, transport or extract a hole, it is possible to provide an organic electronic device having excellent efficiency and performance.

16 Claims, No Drawings

FUSED CYCLIC COMPOUND AND ORGANIC ELECTRONIC DEVICE

This application claims priority to Korean Patent Application No. 10-2009-0109940, filed on Nov. 13, 2009, which is incorporated by reference in its entirety herein.

DISCLOSURE

1. Technical Field

The present invention relates to a new compound, and an organic electronic device using the same.

2. Background Art

An organic electronic device means a device that requires exchanging of electric charges between electrodes using holes and/or electrons and organic materials. The organic electronic device may be largely divided into the following categories according to an operation principle. First, there is an electronic device in which an exiton is formed in an organic layer by a photon that flows from an external light source to the device, the exiton is separated into electrons and holes, and the electrons and the holes are transferred to the other electrodes and used as a current source (voltage source). Second, there is an electronic device in which holes and/or electrons are injected into an organic material semiconductor forming an interface in respects to the electrode by applying a voltage or a current to two or more electrodes, and the device is operated by the injected electrons and holes.

As examples of the organic electronic device, there are an organic light emitting diode, an organic solar cell, an organic photoconductor (OPC), an organic transistor and the like, and all of the devices require a hole injection or transport material, an electron injection or transport material or a light emitting material in order to drive the device. Hereinafter, an organic light emitting diode will be mainly described in detail. However, in the organic electronic devices, the hole injection or transport material, the electron injection or transport material or the light emitting material are operated on the basis of the similar principle.

In general, an organic light emitting phenomenon means a phenomenon that converts electric energy into light energy by using an organic material. The organic light emitting diode using the organic light emitting phenomenon has a structure which generally comprises an anode, a cathode, and an organic layer disposed therebetween. Herein, most organic material layers have a multilayered structure that comprises different materials in order to increase efficiency and stability of the organic light emitting diode, and may comprise, for example, a hole injection layer, a hole transport layer, a light emitting layer, an electron transport layer, an electron injection layer and the like. In the organic light emitting diode structure, if a voltage is applied between two electrodes, holes are injected from an anode and electrons are injected from a cathode to the organic material layer, and when the injected holes and the electrons meet each other, an exciton is formed, and light is emitted when the exciton falls to a bottom state. It is known that this organic light emitting diode has properties such as magnetic light emission, high brightness, high efficiency, low driving voltage, a wide viewing angle, high contrast, high speed response and the like.

In the organic light emitting diode, the material that is used as the organic material layer may be classified into a light emitting material and an electric charge transport material, for example, a hole injection material, a hole transport material, an electron transport material, an electron injection material, and the like according to a function thereof. In addition, the light emitting material may be classified into blue, green, and red light emitting materials and yellow and orange light emitting materials in order to implement better natural colors according to the emission color. Meanwhile, in the case where only one material is used as a light emitting material, by interaction between molecules, there are problems in that the maximum light emitting wavelength moves to the long wavelength, the color purity is lowered, or efficiency of the device is lowered due to reduced effect of light emission. Therefore, in order to increase color purity and increase emission efficiency through transferring of energy, a host/dopant system may be used as the light emitting material.

In order to allow the organic light emitting diode to sufficiently show the above excellent properties, a material constituting the organic material layer in the device, for example, the hole injection material, the hole transport material, the light emitting material, the electron transport material, the electron injection material and the like should be supported by stable and efficient materials. However, the development of a stable and efficient organic material layer material for organic light emitting diodes has not yet been made. Therefore, there is a demand for developing a new material, and the necessity for developing the new material is similarly applied to the other organic electronic device.

DISCLOSURE

Technical Problem

The present invention has been made in an effort to provide a new compound that can be used in an organic electronic device and an organic electronic device using the same.

Technical Solution

An exemplary embodiment of the present invention provides a compound of the following Formula 1:

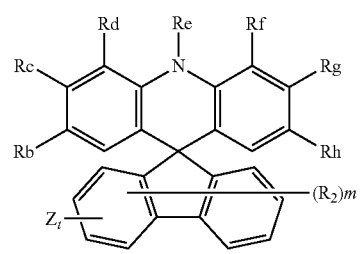

[Formula 1]

wherein
t is 1 or 2, and Z is represented by the following Formula 2a or Formula 2b;

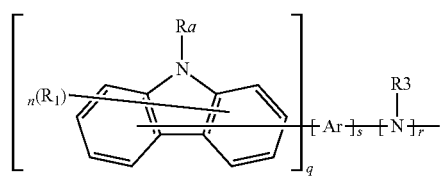

[Formula 2a]

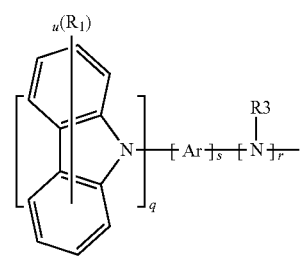

[Formula 2b]

n and m are independently an integer of 1 to 7, and u is an integer of 1 to 8, s is an integer of 0 to 10, and r is 0, 1 or 2, q is an integer of 1 to 3, and when q is 2 or more, substituent groups in a bracket are the same as or different from each other, $R^1$ to $R^3$ are independently selected from the group consisting of hydrogen, deuterium, a substituted or unsubstituted aryl group, a substituted or unsubstituted heterocyclic group and a substituted or unsubstituted arylamine group, in the case where n or u is 2 or more, $R^1$s are the same as or different from each other and adjacent $R^1$s may be connected to each other to form a monocycle or a fused cycle including an aliphatic cycle, an aromatic cycle or a hetero cycle, and in the case where m is 2 or more, $R^2$s are the same as or different from each other, and adjacent $R^1$s may be connected to each other to form a monocycle or a fused cycle including an aliphatic cycle, an aromatic cycle or a hetero cycle, Ar is selected from the group consisting of a substituted or unsubstituted arylene group, a substituted or unsubstituted heterocyclic group and a substituted or unsubstituted arylamine group, and in the case where s is 2 or more, Ar are the same as or different from each other, Ra to Rh are independently selected from the group consisting of hydrogen, deuterium, a substituted or unsubstituted alkyl group, a substituted or unsubstituted aryl group, a substituted or unsubstituted heterocyclic group and a substituted or unsubstituted arylamine group, and adjacent groups of Ra to Rh may be connected to each other to form a monocycle or fused cycle including an aliphatic cycle, an aromatic cycle or a hetero cycle.

Another exemplary embodiment of the present invention provides an organic electronic device which comprises a first electrode, a second electrode, and one or more organic material layers that are disposed between the first electrode and the second electrode, wherein one or more layers of the organic material layers comprise the compound represented by Formula 1.

Advantageous Effects

According to the exemplary embodiments of the present invention, since the compound may be used as a material of an organic material layer of the organic electronic device and in particular may effectively inject, transport or extract a hole, it is possible to provide an organic electronic device having excellent efficiency and performance.

BEST MODE

An exemplary embodiment of the present invention provides a compound of Formula 1.

In Formula 1, Re and Rf may be independently selected from the group consisting of hydrogen, deuterium, a substituted or unsubstituted alkyl group, a substituted or unsubstituted aryl group, a substituted or unsubstituted heterocyclic group and a substituted or unsubstituted arylamine group, and may be connected to each other to form a monocycle or fused cycle including an aliphatic cycle, an aromatic cycle or a hetero cycle.

In Formula 1, an example of forming a cyclic group by connecting $R^e$ and $R^f$ to each other may be represented by the following Formula 3 or 4.

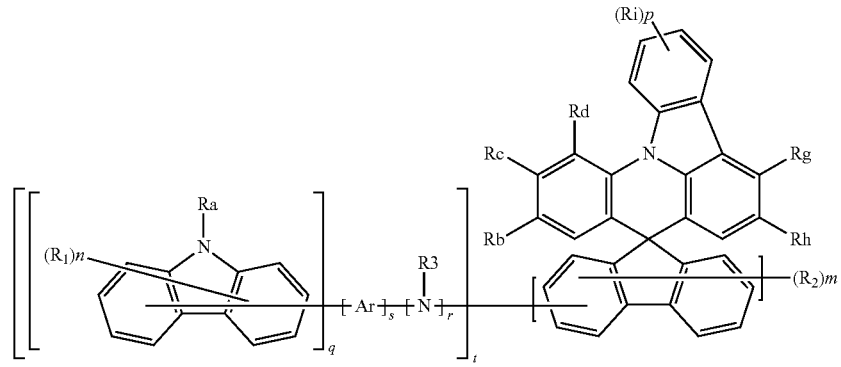

[Formula 3]

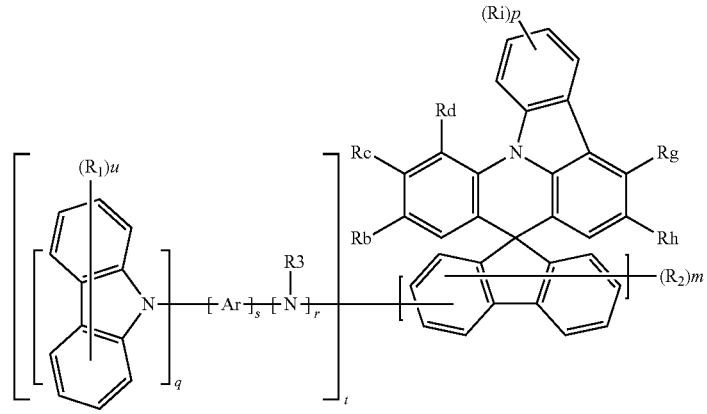

[Formula 4]

In Formulas 3 and 4, n, m, u, s, r, q, $R^1$ to $R^3$, Ar, Ra to Rd, and Rg are the same as those defined in Formula 1, p is an integer in the range of 1 to 4, and Ri is independently selected from the group consisting of hydrogen, deuterium, a substituted or unsubstituted alkyl group, a substituted or unsubstituted aryl group, a substituted or unsubstituted heterocyclic group and a substituted or unsubstituted arylamine group, or may be connected to the adjacent substituent group to form a monocycle or fused cycle including an aliphatic cycle, an aromatic cycle or a hetero cycle, and in the case where p is 2 or more, R is are the same as or different from each other.

The compound of Formula 1 may be represented by the following Formulas 5 to 20.

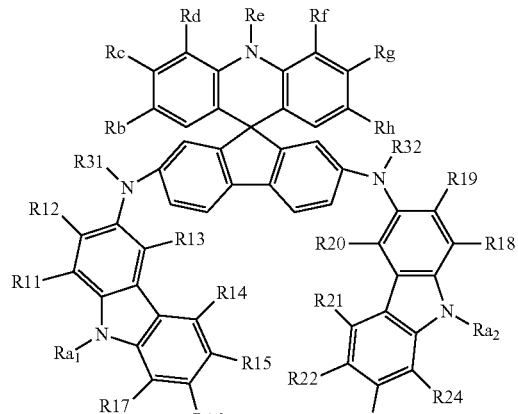

[Formula 5]

[Formula 6]

[Formula 7]

[Formula 8]

[Formula 9]

[Formula 10]

-continued
[Formula 11]
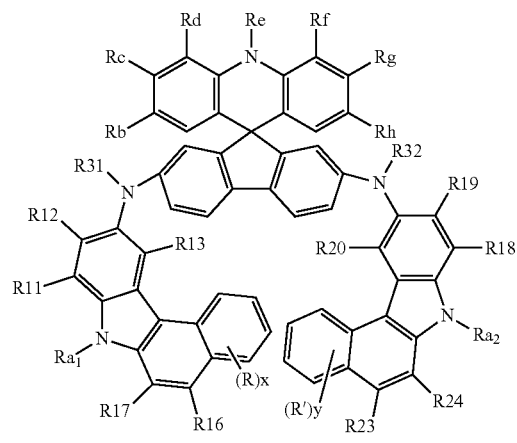
[Formula 12]
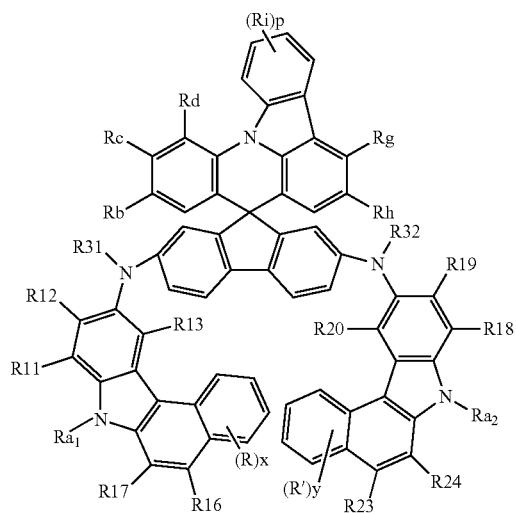
[Formula 13]
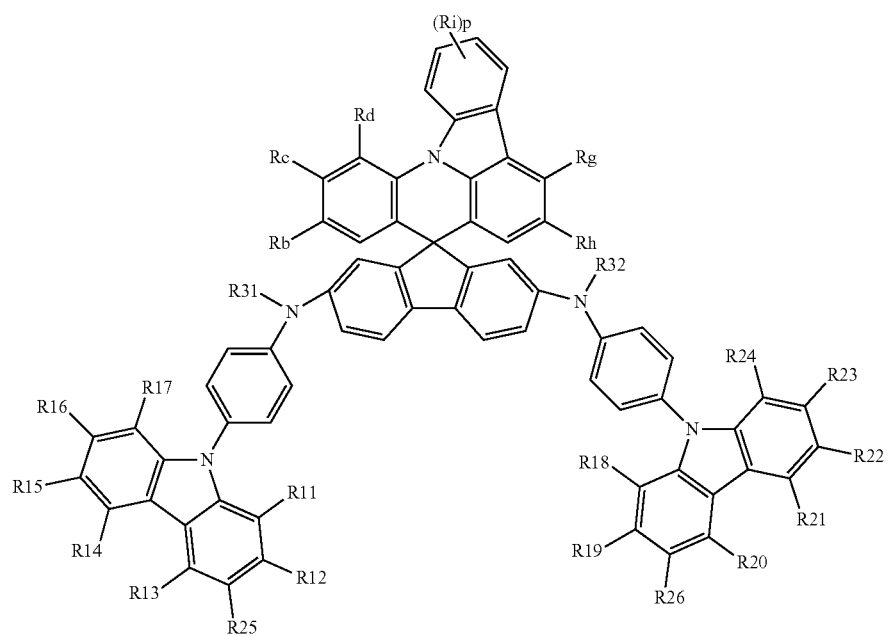

-continued
[Formula 14]
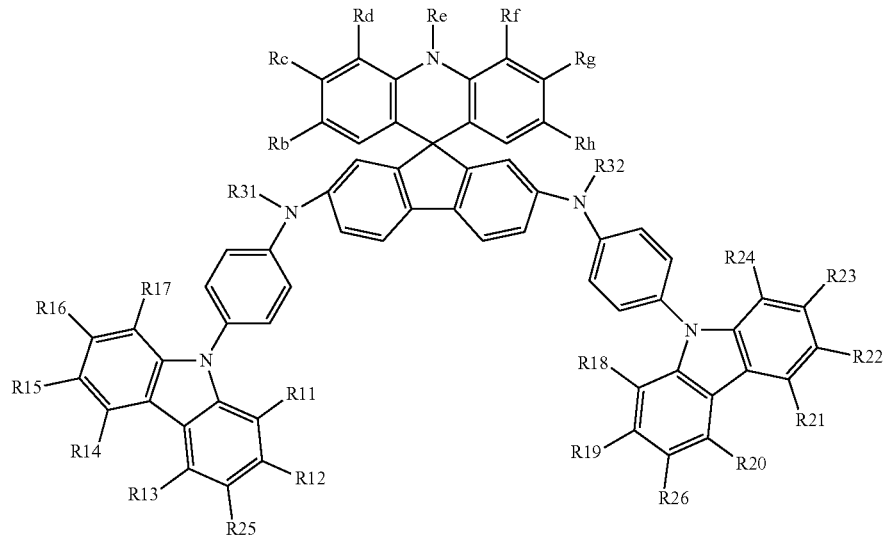
[Formula 15]
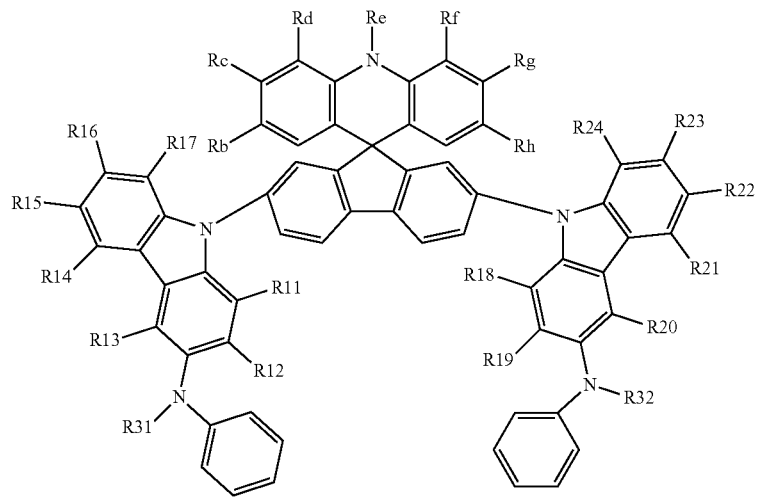
[Formula 16]
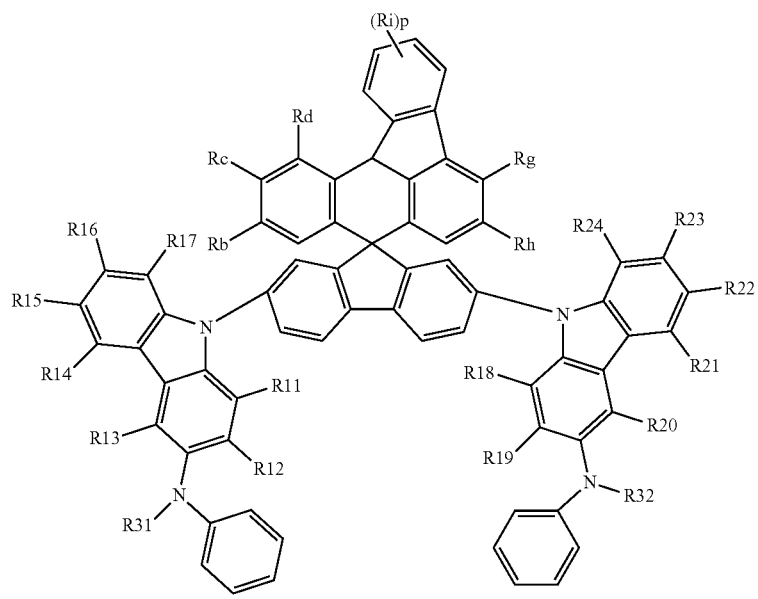

[Formula 17]
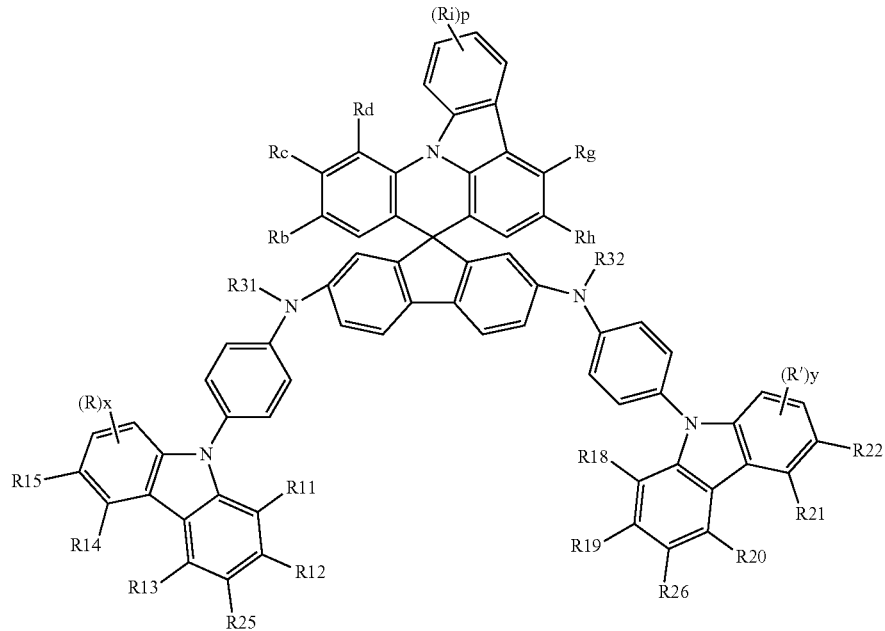
[Formula 18]
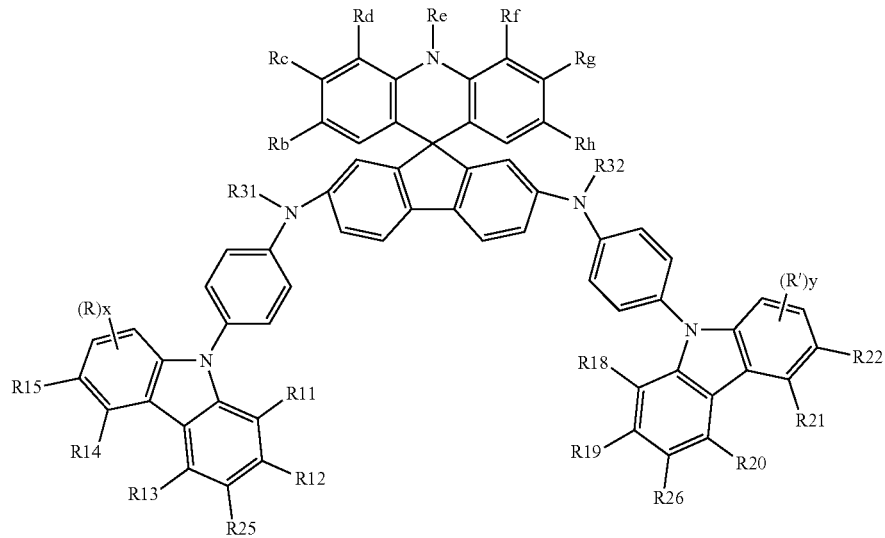

-continued

[Formula 19]

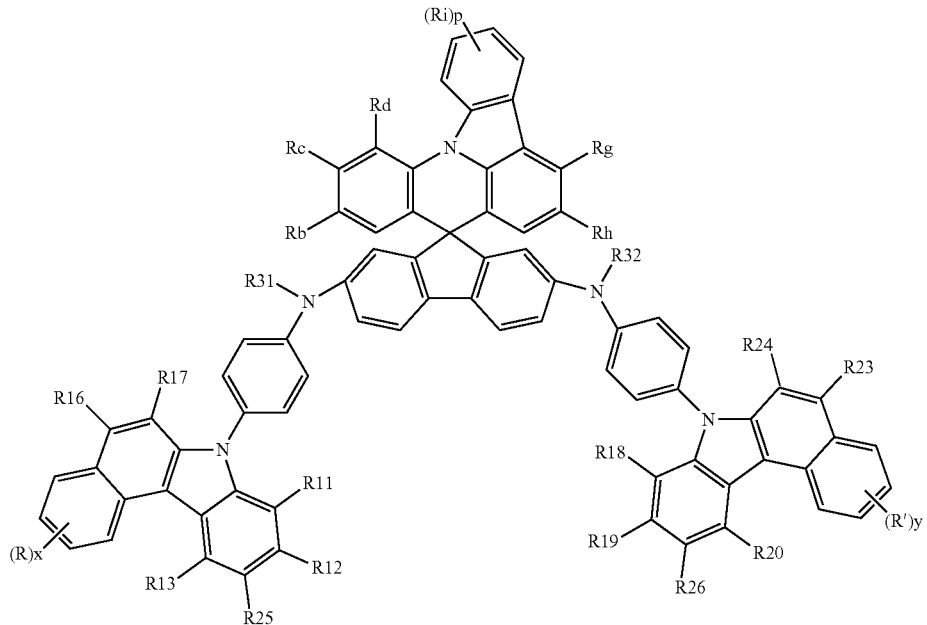

[Formula 20]

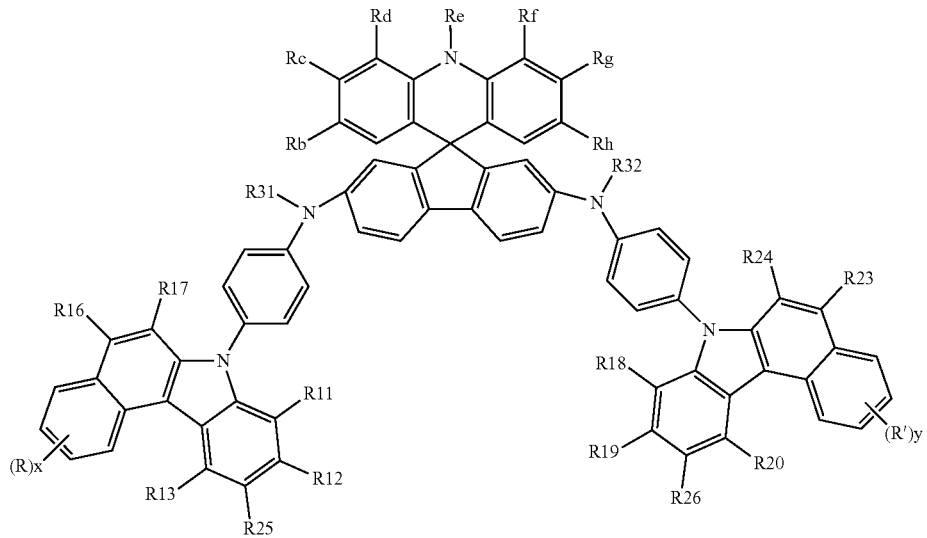

In Formulas 5 to 20,

Rb to Rh are the same as those defined in Formula 1,

Ri and p are the same as those defined in Formulas 3 and 4,

Ra1, Ra2, R11 to R26, R31, R32, R, and R' are independently selected from the group consisting of hydrogen, deuterium, a substituted or unsubstituted alkyl group, a substituted or unsubstituted aryl group, a substituted or unsubstituted heterocyclic group and a substituted or unsubstituted arylamine group, and may be connected to adjacent groups to form a monocycle or a fused cycle including an aliphatic cycle, an aromatic cycle or a hetero cycle, and x and y are independently an integer of 1 to 4, in the case where x is 2 or more, Rs are the same as or different from each other, and in the case where y is 2 or more, R's are the same as or different from each other.

In Formulas 1 to 20, it is preferable that the alkyl group has 1 to 20 carbon atoms, and the group includes a straight-chained or branched-chained alkyl group.

In Formulas 1 to 20, the aryl group may be a monocycle or a polycycle, and the number of carbon atoms is not particularly limited, but preferably 6 to 60. Examples of the monocyclic aryl group include phenyl group, biphenyl group, terphenyl group, stilben group and the like, and examples of the polycyclic aryl group include naphthyl group, anthracenyl group, phenanthrenyl group, pyrenyl group, perylenyl group, tetracenyl group, cryxenyl group, fluorenyl group, acenaphthacenyl group, triphenylene group, fluoranthrene group and the like, but the scope of the exemplary embodiment of the present invention is not limited thereto.

In Formulas 1 to 20, the arylene group may be a monocycle or a polycycle, and the number of carbon atoms is not particularly limited, but preferably 6 to 60. As detailed examples thereof, there is a divalent group of the aryl group, but the scope of the exemplary embodiment of the present invention is not limited thereto.

In Formulas 1 to 20, the heterocyclic group is a heteroatom, includes O, N or S, and may be a monocycle or a polycycle, and the number of carbon atoms thereof is not particularly limited, but preferably 2 to 60. As examples of the heterocyclic group, there are a thiophene group, a furan group, a pyrrole group, an imidazole group, a thiazole group, an oxazol group, an oxadiazol group, a triazol group, a pyridyl group, a bipyridyl group, a triazine group, an acridyl group, a pyridazine group, a quinolinyl group, an isoquinoline group, an indole group, a benzoxazole group, a benzimidazole group, a benzthiazol group, a benzcarbazole group, a benzthiophene group, a dibenzothiophene group, a benzfuranyl group, or a dibenzofuranyl group, but the examples thereof are not limited thereto.

In Formulas 1 to 20, the arylamine group is an amine group that is substituted by one or two aryl groups, and it is preferable that the number of carbon atoms thereof is 6 to 60. The aryl group included in the arylamine group is the same as that described above.

In the exemplary embodiment of the present invention, "a substituted or unsubstituted" means that a matter is a substituted or unsubstituted by at least one substituent group of a halogen group; deuterium; a $C_{1-20}$ alkyl group; a $C_{2-20}$ alkenyl group; a $C_{2-20}$ alkynyl group; a nitrile group; a nitro group; a hydroxyl group; a $C_{3-60}$ cycloalkyl group; a $C_{1-20}$ alkoxy group; a $C_{6-60}$ aryloxy group; a $C_{1-20}$ alkylthioxy group; a $C_{6-60}$ arylthioxy group; a $C_{1-20}$ alkylsulfoxy group; a $C_{6-60}$ arylsulfoxy group; a silyl group; a boron group; a $C_{1-20}$ alkylamine group; a $C_{7-60}$ aralkylamine group; a $C_{6-60}$ arylamine group; a $C_{6-60}$ aryl group; a fluorenyl group; a carbazole group; an acetylene group; and a heterocyclic group including one or more of N, O, and S atoms.

In the exemplary embodiment of the present invention, R3, R31 and R32 are preferably a substituted or unsubstituted aryl group or a substituted or unsubstituted heterocyclic group, and more preferably a substituted or unsubstituted aryl group, for example, phenyl.

In the exemplary embodiment of the present invention, Ar is preferably a substituted or unsubstituted arylene group or a substituted or unsubstituted heterocyclic group, and more preferably a substituted or unsubstituted arylene group, for example, phenylene.

In the exemplary embodiment of the present invention, Ra, Ra1, Ra2 and Rd are preferably a substituted or unsubstituted aryl group or a substituted or unsubstituted heterocyclic group, and more preferably a substituted or unsubstituted aryl group, for example, phenyl or biphenyl.

In the exemplary embodiment of the present invention, it is preferable that t is 2.

In the exemplary embodiment of the present invention, R1, R2, R11 to R26, Rb, Rc, and Re to Ri may be hydrogen.

It is preferable that the compound of Formula 1 is represented by the following Structural Formulas, but the scope of the exemplary embodiment of the present invention is not limited thereto.

[Structural Formula 1]

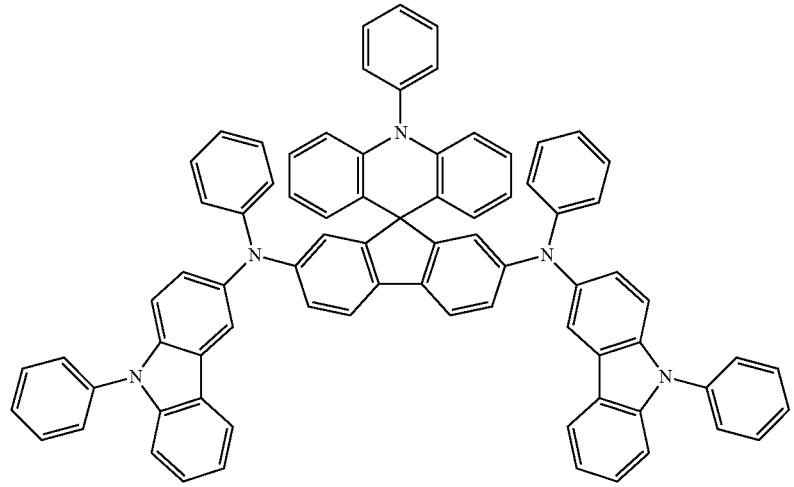

[Structural Formula 2]

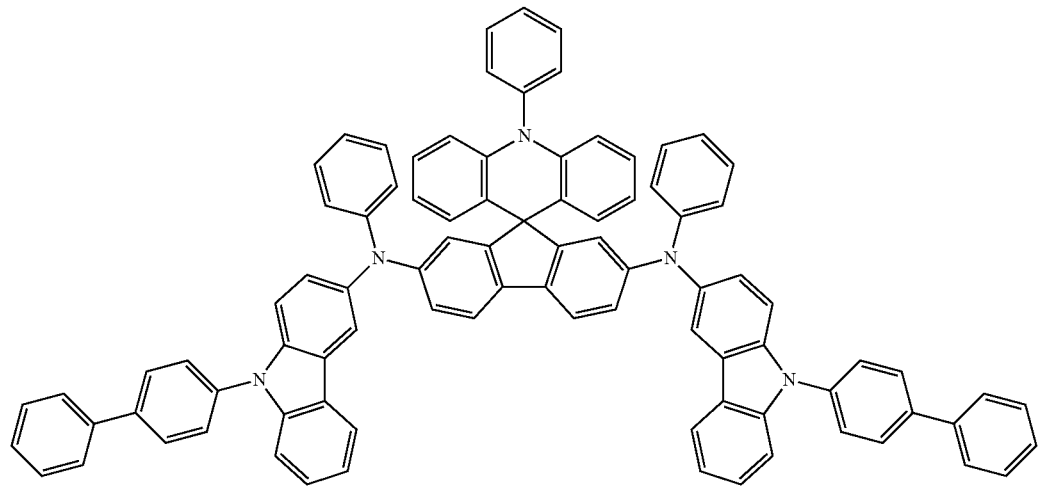

[Structural Formula 3]
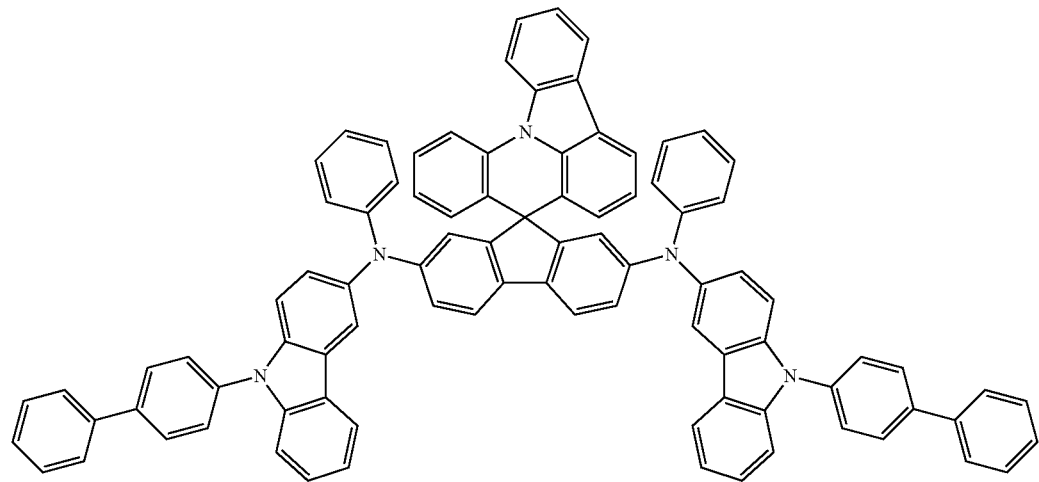
[Structural Formula 4]
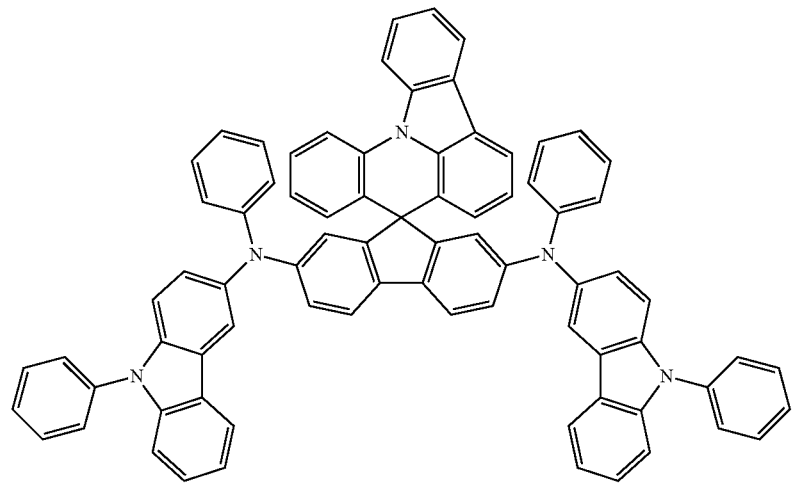
[Structural Formula 5]
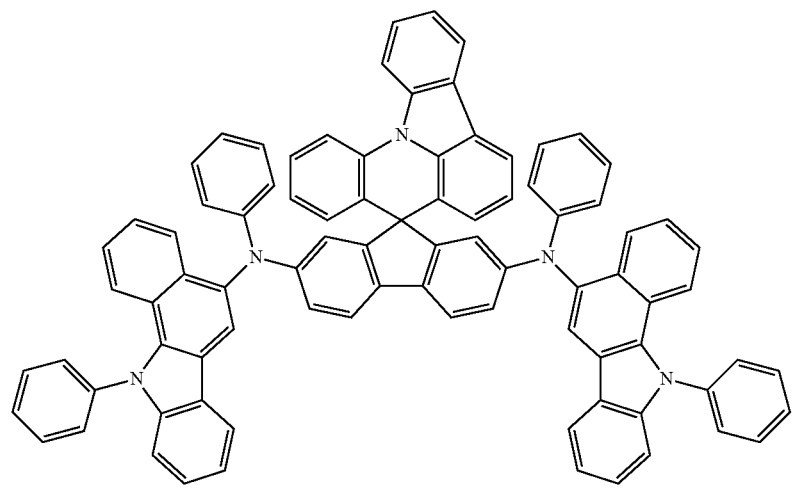

-continued
[Structural Formula 6]
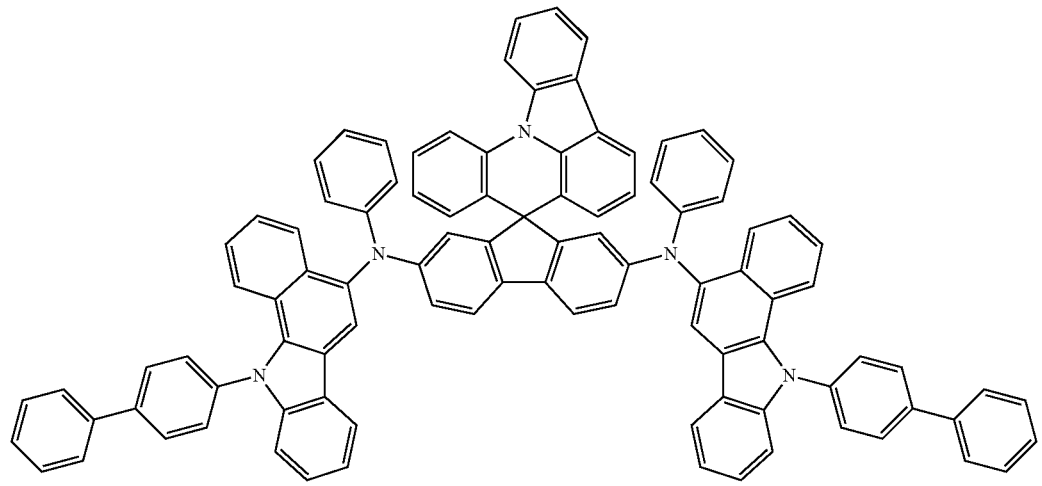
[Structural Formula 7]
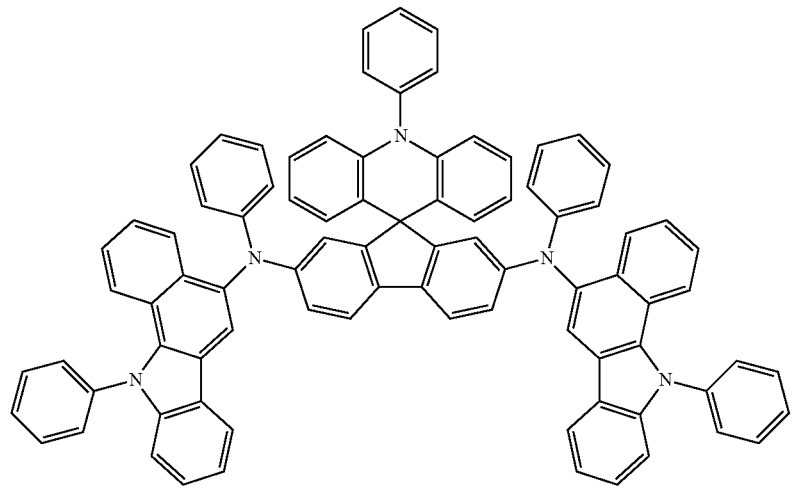
[Structural Formula 8]
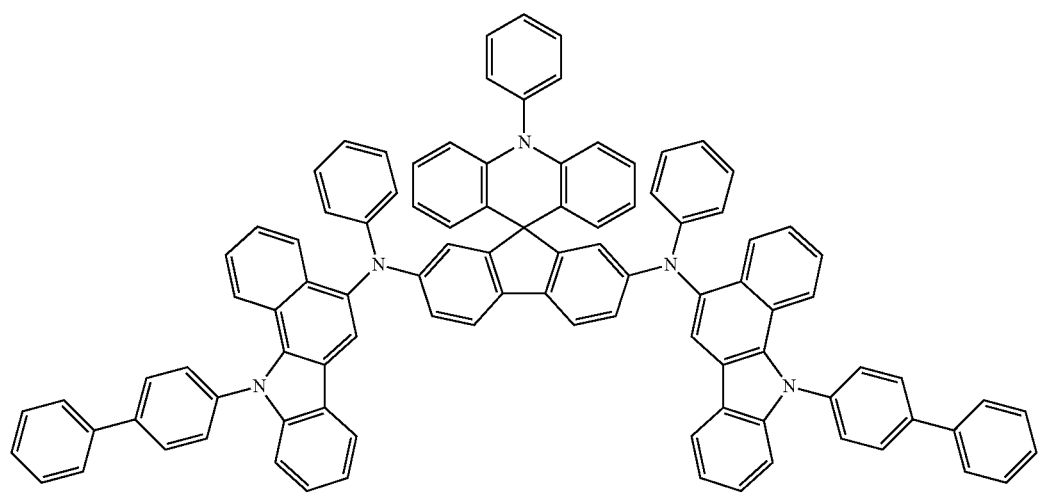

-continued
[Structural Formula 9]
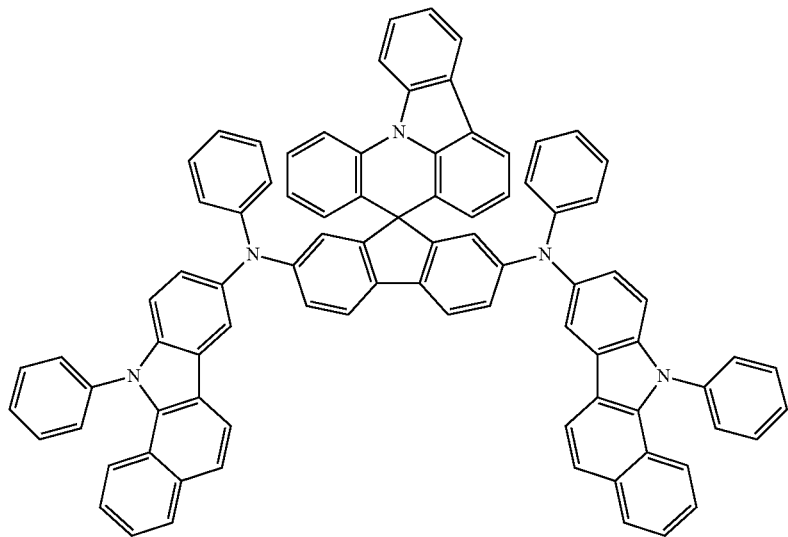
[Structural Formula 10]
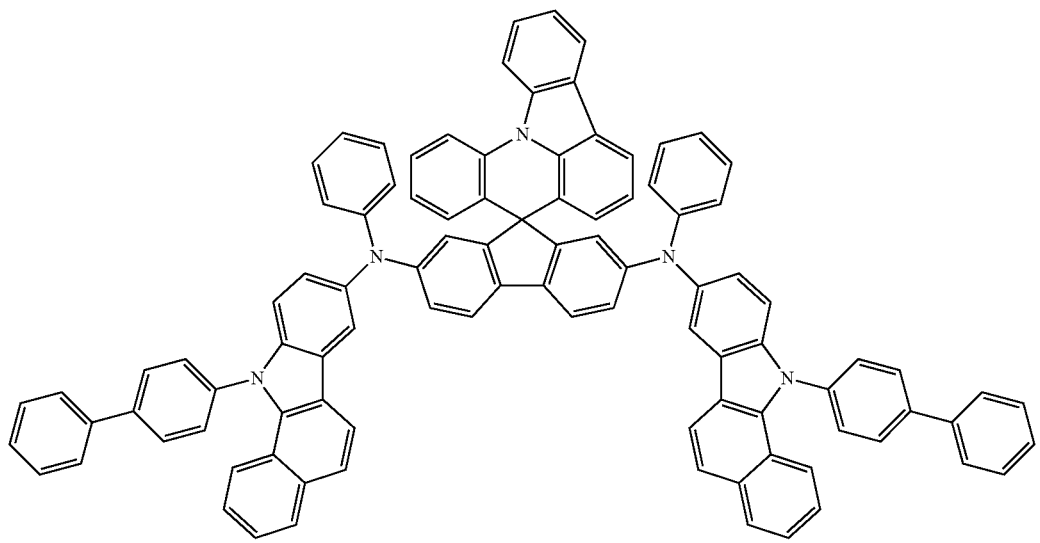
[Structural Formula 11]
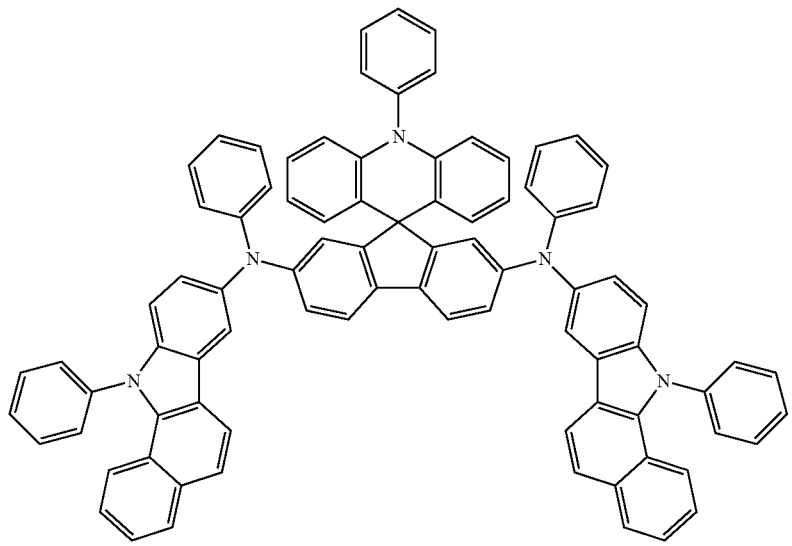

[Structural Formula 12]
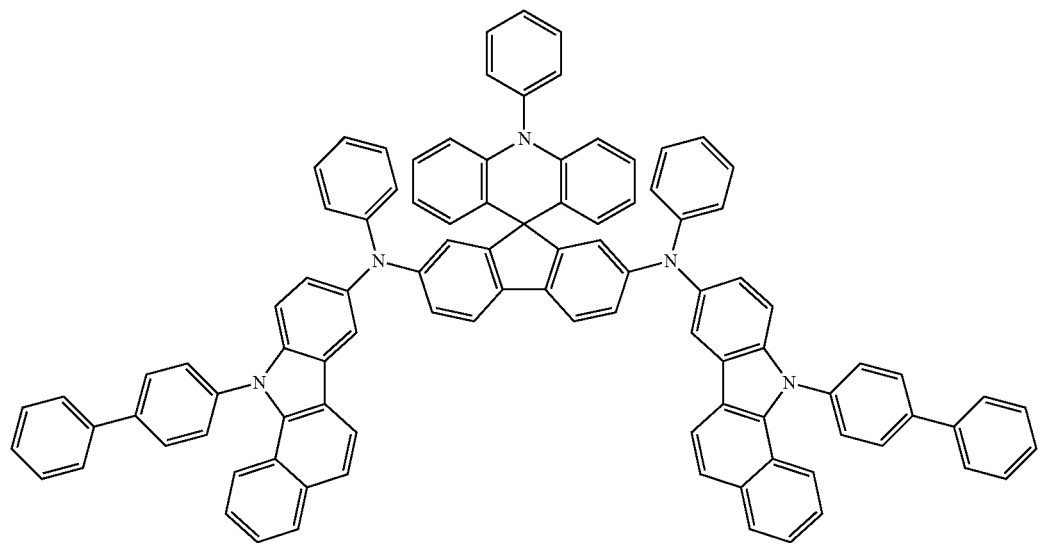
[Structural Formula 13]
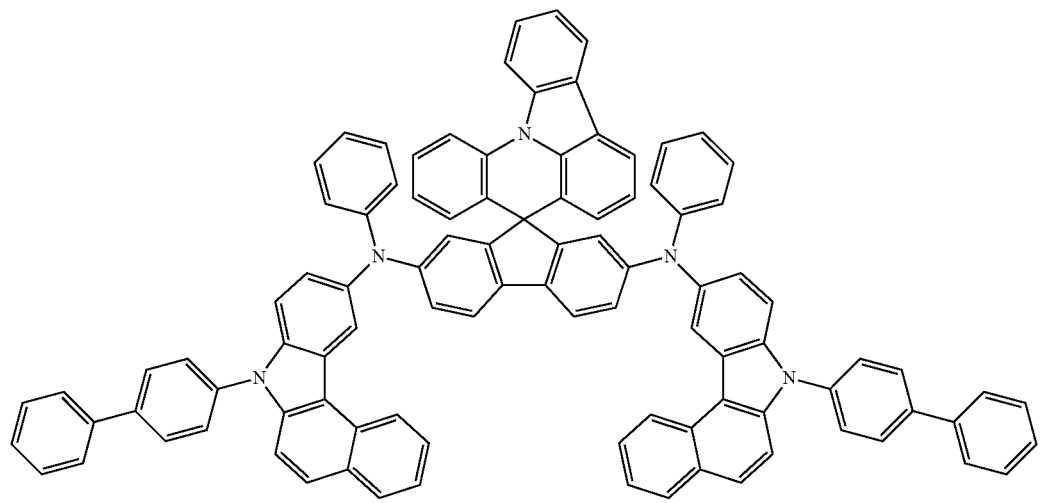
[Structural Formula 14]
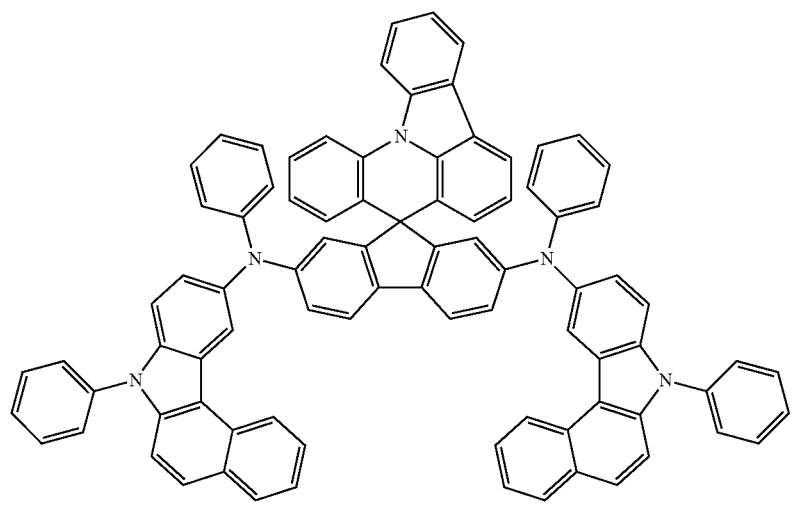

-continued
[Structural Formula 15]
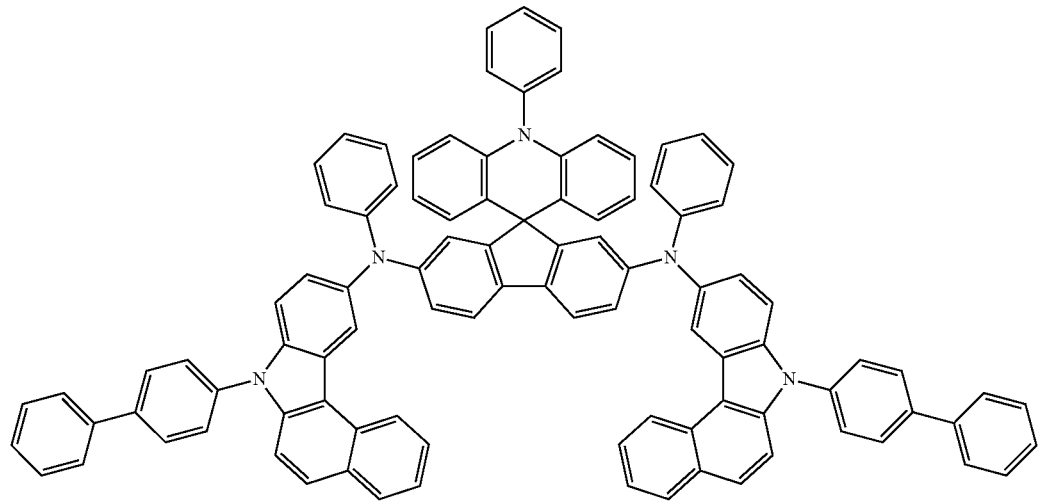
[Structural Formula 16]
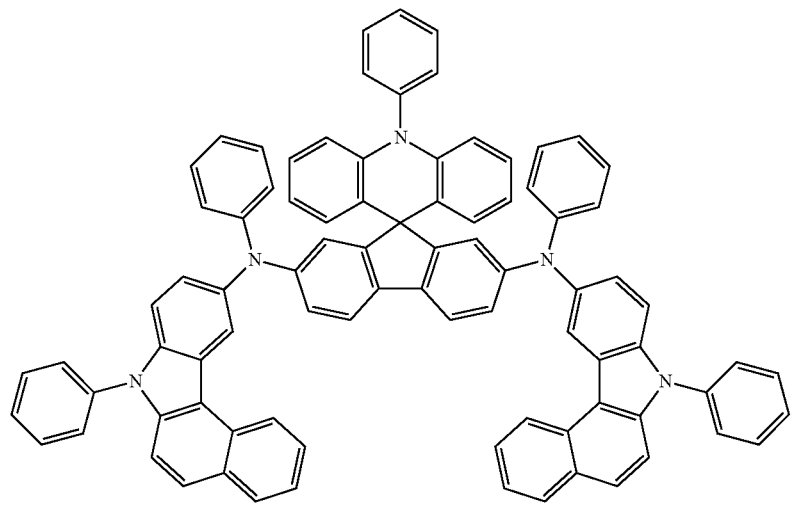
[Structural Formula 17]
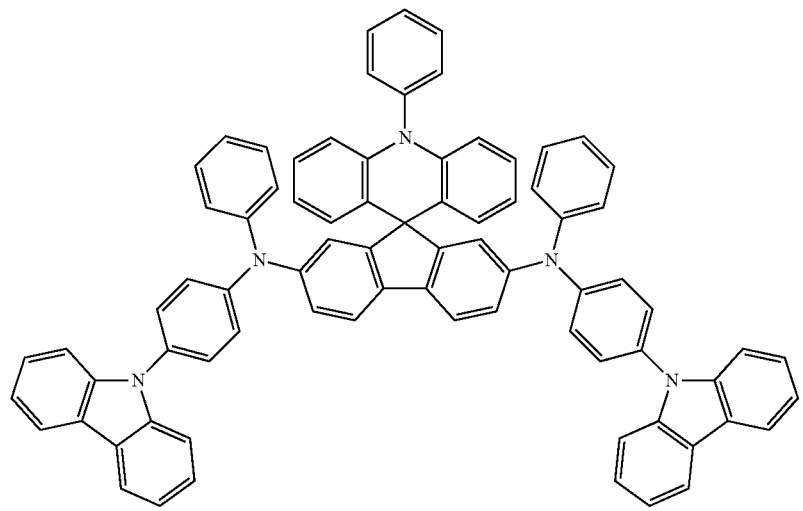

[Structural Formula 18]
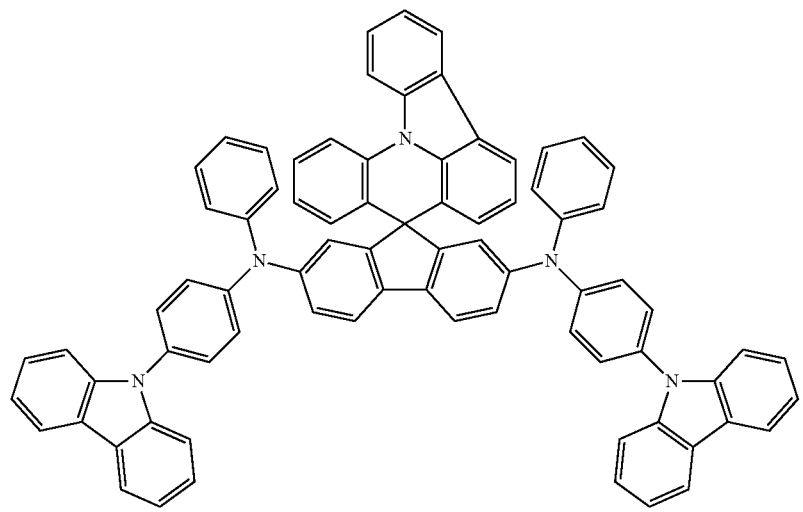
[Structural Formula 19]
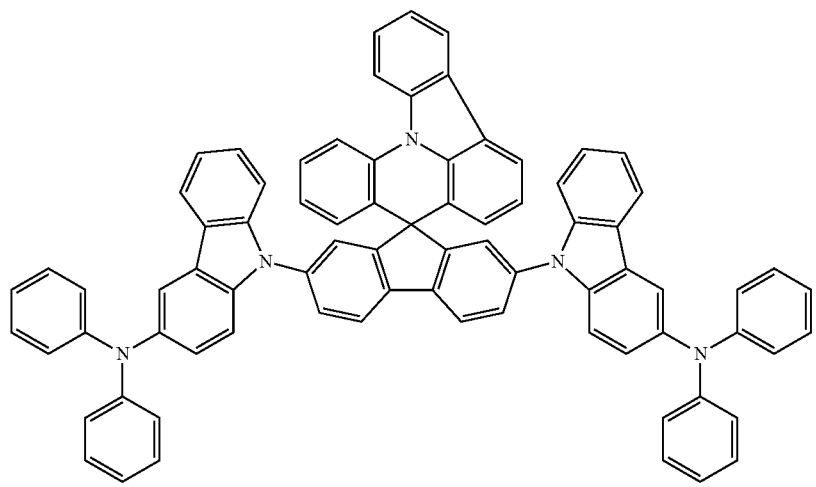
[Structural Formula 20]
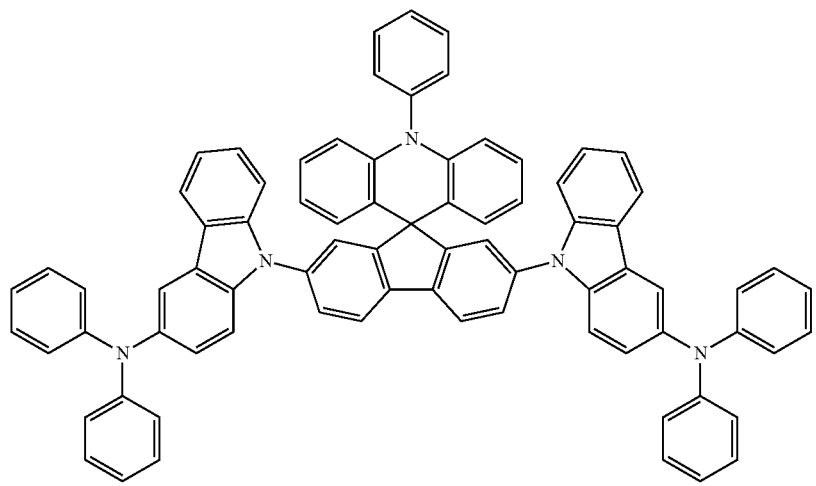

[Structural Formula 21]
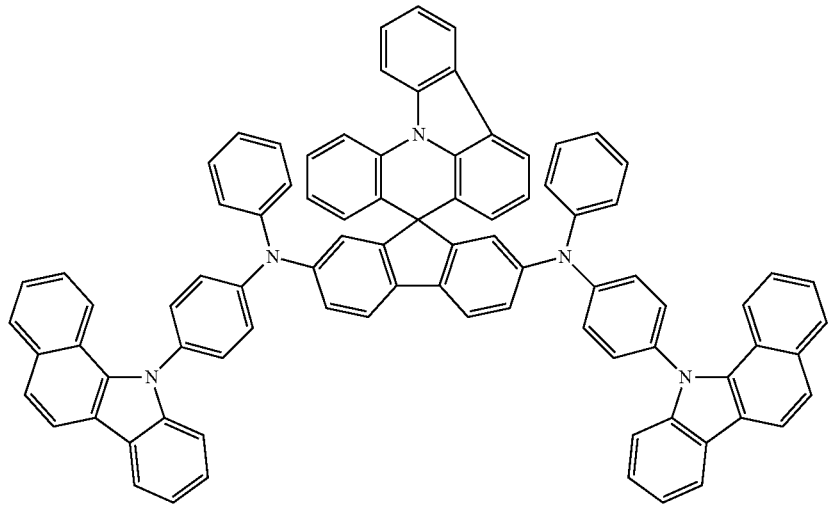
[Structural Formula 22]
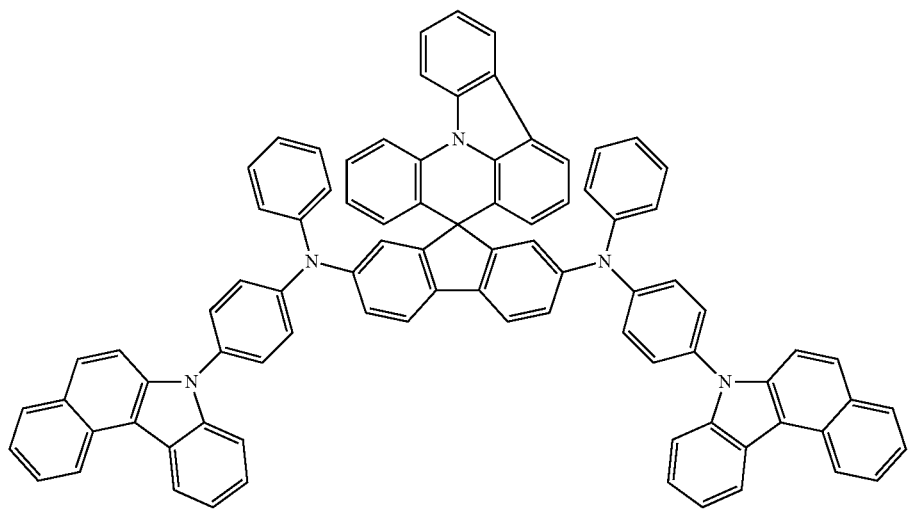
[Structural Formula 23]
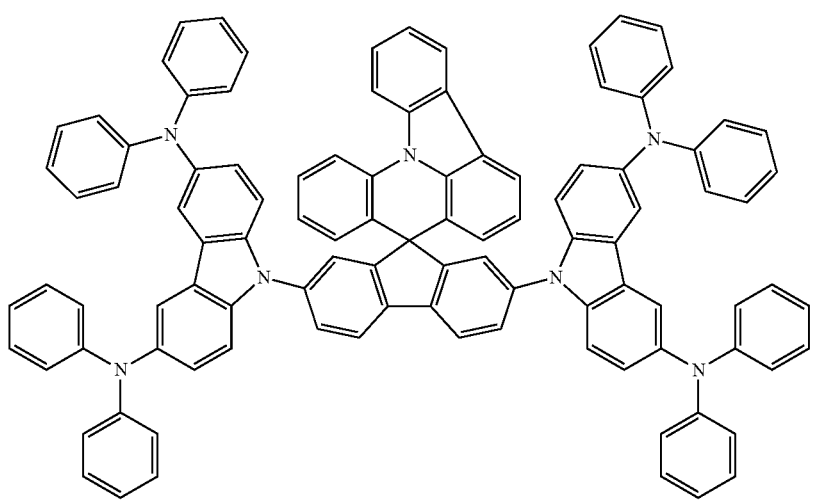

[Structural Formula 24]
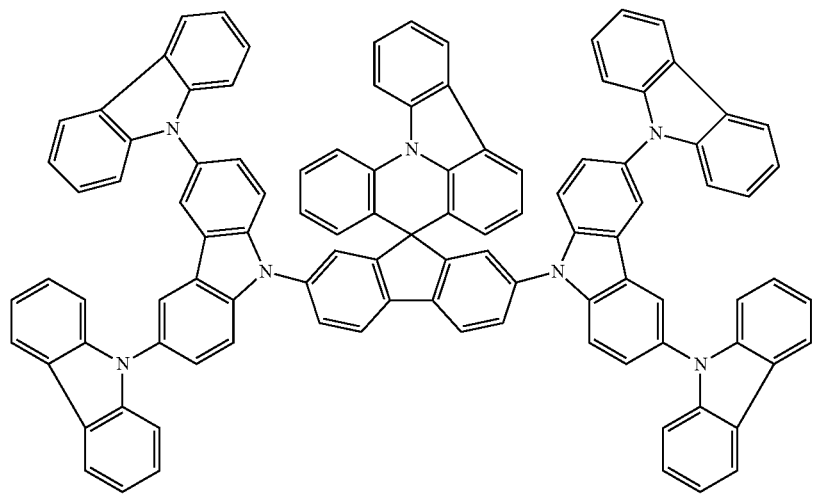
[Structural Formula 25]
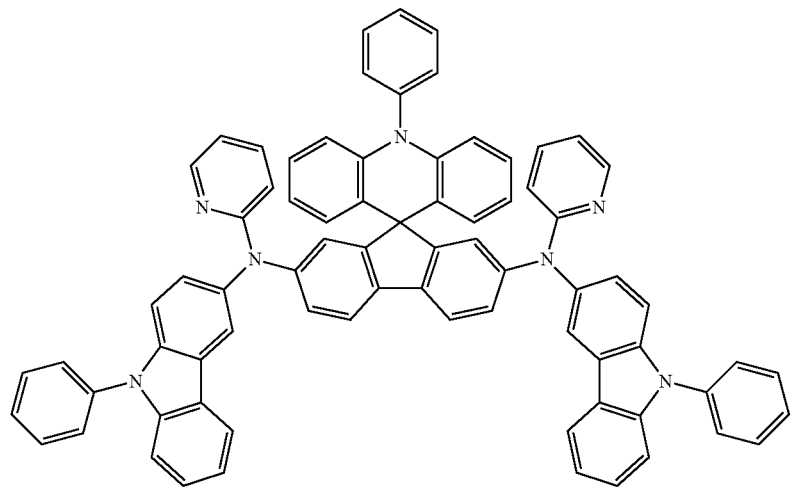
[Structural Formula 26]
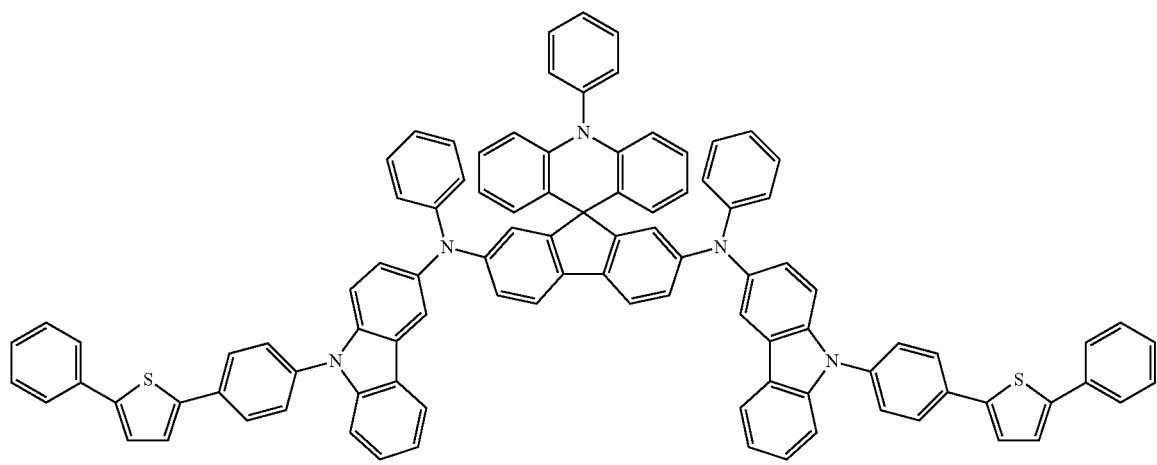

[Structural Formula 27]
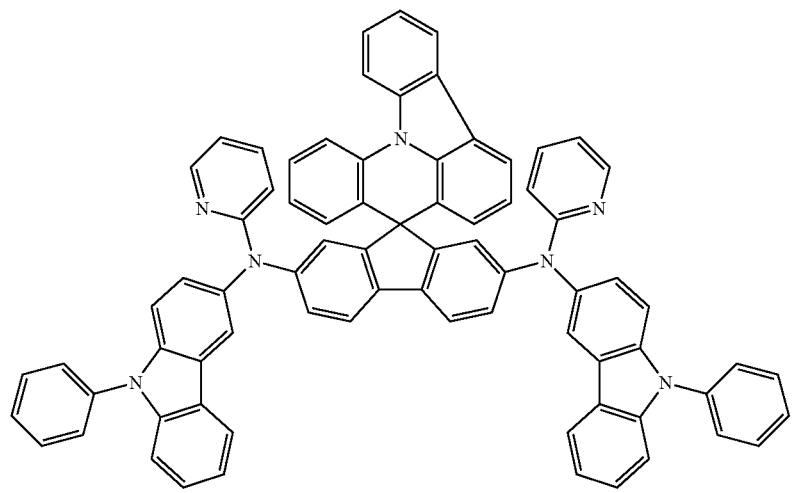
[Structural Formula 28]
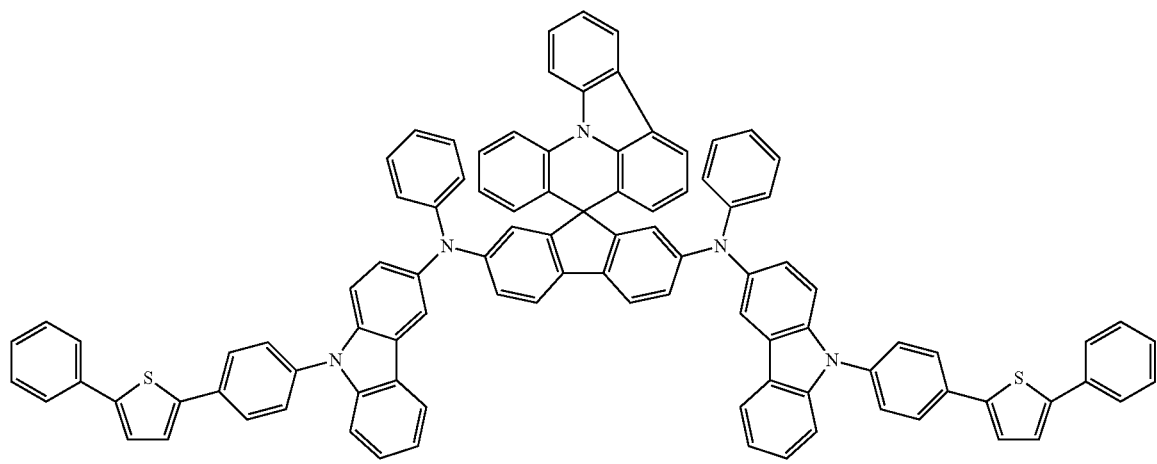
[Structural Formula 29]
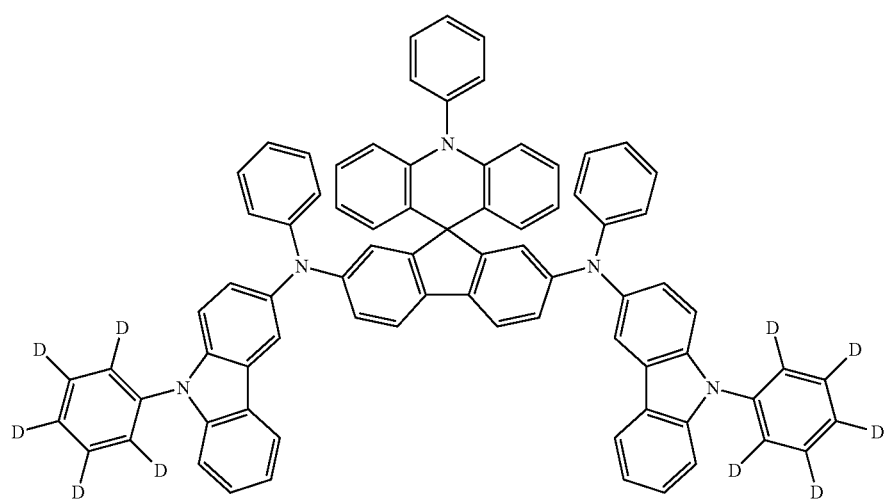

[Structural Formula 30]
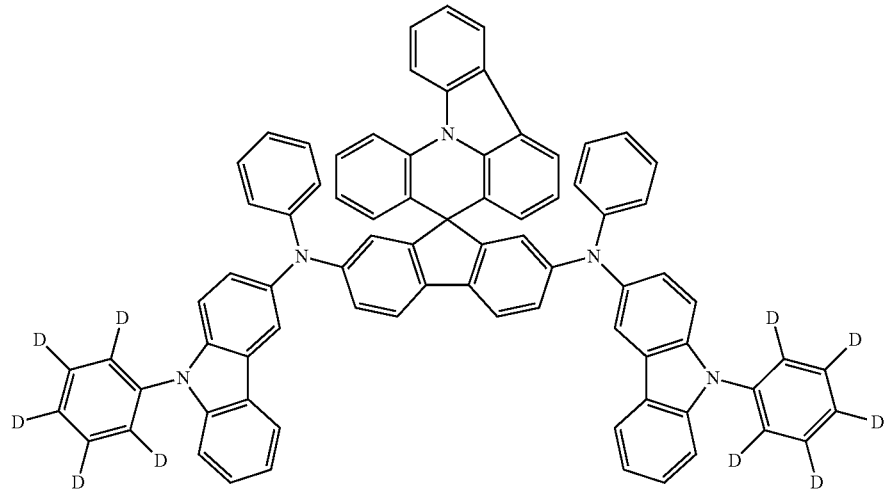
[Structural Formula 31]
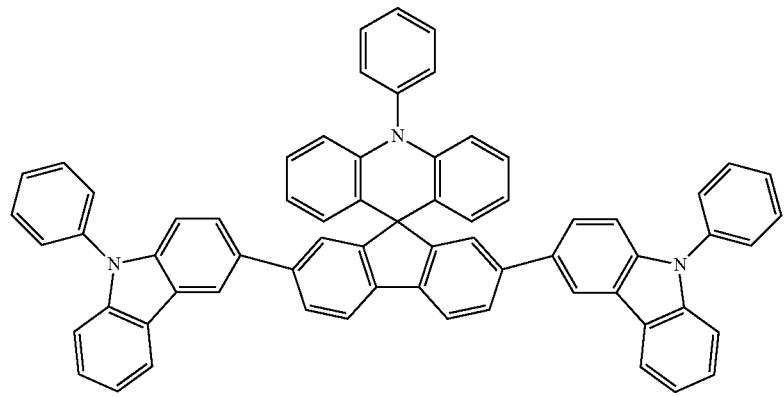
[Structural Formula 32]
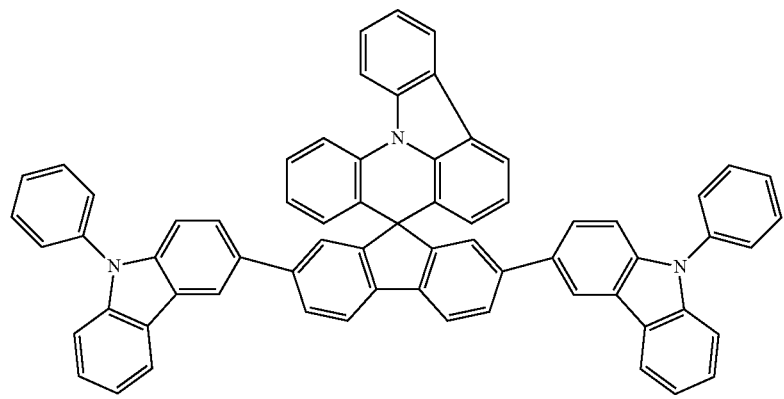

[Structural Formula 33]
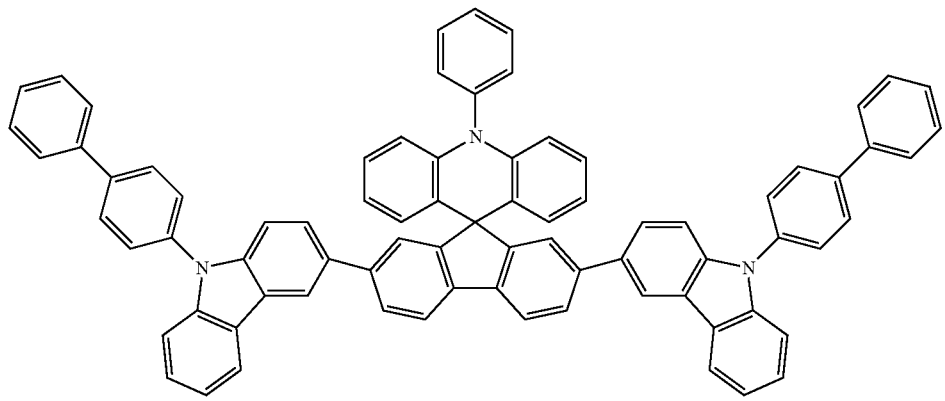
[Structural Formula 34]
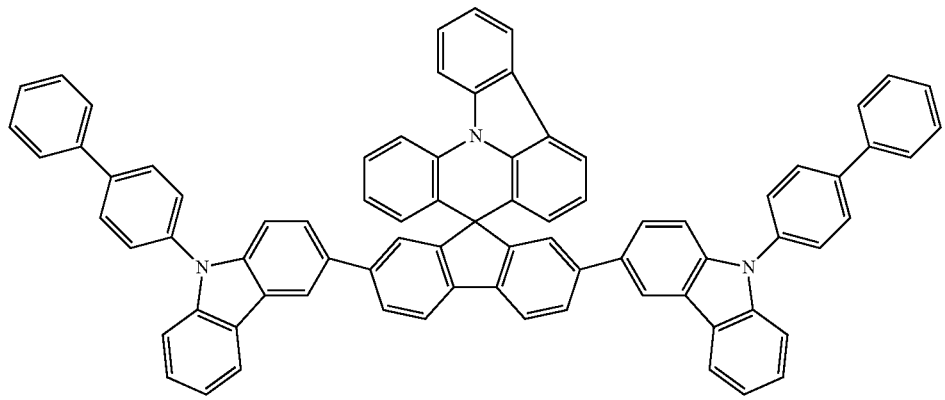
[Structural Formula 35]
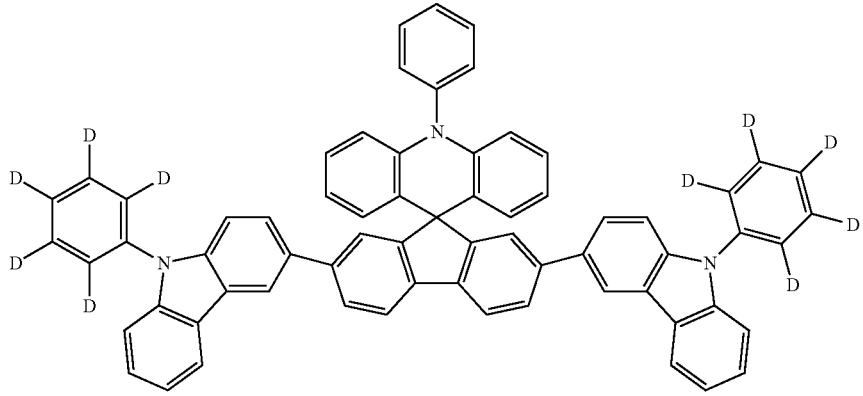
[Structural Formula 36]
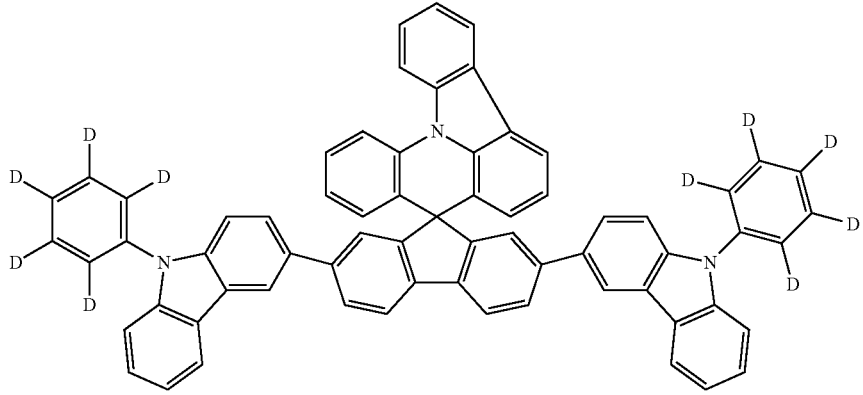

[Structural Formula 37]

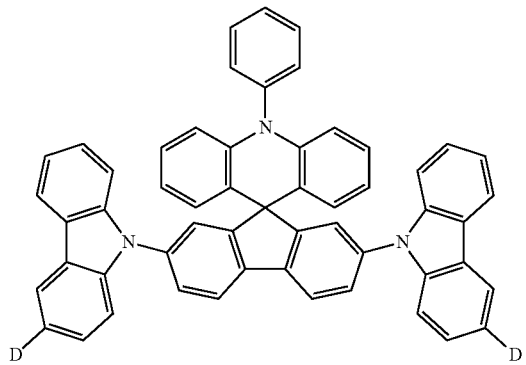

[Structural Formula 38]

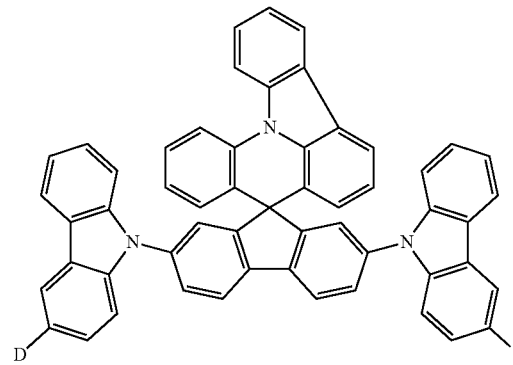

[Structural Formula 39]

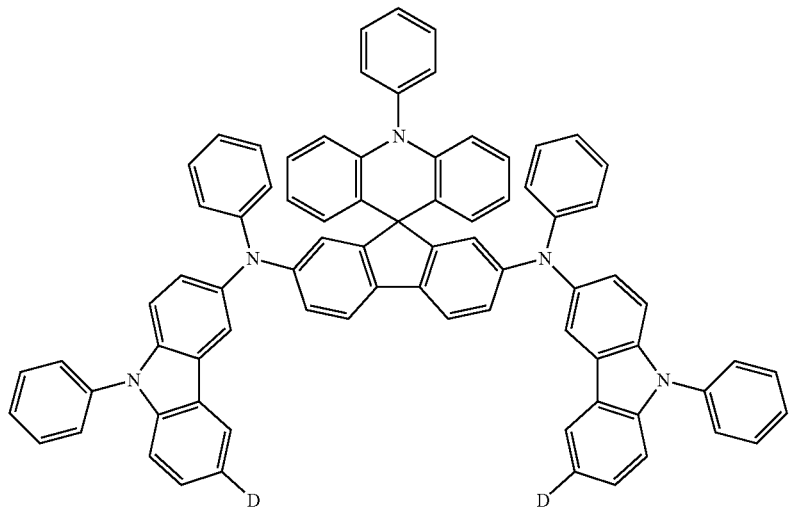

[Structural Formula 40]

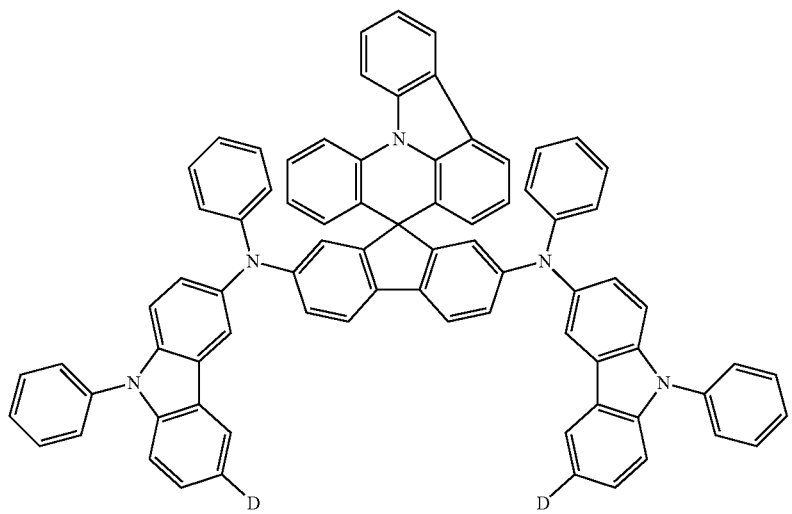

The compound of Formula 1 may be manufactured by introducing a carbazole group or an amine group where a carbazole group is substituted in a spiro structure of Formula. If necessary, before or after the carbazole group or the amine group where the carbazole group is substituted is introduced, the substituent group may be further introduced. A method known in the art may be used as a reaction used when the compound of Formula 1 is manufactured. A detailed method is described in the following Preparation Example, and the person with ordinary skill may determine the manufacturing method of the compound of Formula 1 through the Preparation Example.

In addition, the present invention provides an organic electronic device which comprises a first electrode, a second electrode, and one or more organic material layers that are disposed between the first electrode and the second electrode, wherein one or more layers of the organic material layers comprise the compound of Formula 1.

The compound according to the exemplary embodiment of the present invention may be used as the material of the organic material layer in the organic electronic device. In particular, the compound according to the exemplary embodiment of the present invention may be used as the hole injection, transport or extraction material in the organic electronic device.

The organic electronic device may be selected from the group consisting of an organic light emitting diode, an organic solar cell, an organic photoconductor (OPC) drum and an organic transistor.

In addition, the organic electronic device may be an organic light emitting diode.

In addition, the organic light emitting diode may be an organic light emitting diode that has a positive direction structure, in which an anode, one or more organic material layers and a cathode are sequentially layered on a substrate.

In addition, the organic light emitting diode may be an organic light emitting diode that has a negative direction structure, in which a cathode, one or more organic material layers, and an anode are sequentially layered on a substrate.

The organic material layer of the organic light emitting diode may comprise a hole injection layer, a hole transport layer, a light emitting layer, and an electron injection and/or transport layer.

The organic electronic device according to the exemplary embodiment of the present invention may be manufactured by using a manufacturing method and a material of a general organic electronic device, except that one or more organic material layers are formed by using the above compounds.

Hereinafter, the organic light emitting diode will be described.

In the exemplary embodiment of the present invention, the organic light emitting diode may have a structure comprising a first electrode, a second electrode, and an organic material layer that is disposed therebetween. The organic material layer of the organic light emitting diode according to the present invention may have a single layer structure comprising one layer or a multilayered structure that comprises two or more layers including a light emitting layer. In the case where the organic material layer of the organic light emitting diode according to the present invention has the multilayered structure, for example, this may be a structure in which a hole injection layer, a hole transport layer, a light emitting layer, an electron transport layer and the like are layered. However, the structure of the organic light emitting diode is not limited thereto, and may comprise the smaller number of organic material layers. For example, the organic light emitting diode according to the exemplary embodiment of the present invention may have a positive direction structure in which a substrate, an anode, a hole injection layer, a hole transport layer, an organic light emitting layer, an electronic transport layer, and a cathode are sequentially layered. However, the present invention is not limited thereto, and includes a negative direction structure of organic light emitting diode. That is, the organic light emitting diode according to the present invention may have a structure in which a substrate, a cathode, an electronic transport layer, an organic light emitting layer, a hole transport layer, a hole injection layer, and an anode are sequentially layered.

In the case where the organic light emitting diode according to the present invention has the organic material layer having a multilayered structure, the compound of Formula 1 may be comprised in a light emitting layer, a hole injection layer, a hole transport layer, a layer that performs simultaneously hole transport and light emission, a layer that performs simultaneously electron transport and light emission, an electronic transport layer, and an electron transport and/or injection layer. In the exemplary embodiment of the present invention, it is preferable that the compound of Formula 1 is particularly comprised in the hole injection layer, the hole transport layer, or the hole injection and transport layer. In the exemplary embodiment of the present invention, it is more preferable that the compound of Formula 1 is particularly comprised in the hole injection layer.

In this case, it is preferable that the organic light emitting diode according to the exemplary embodiment of the present invention includes an electron transport layer comprising a compound having a functional group selected from an imidazole group, an oxazole group, a thiazol group, a quinoline group and a phenanthroline group. For example, the compound of the following Formula 21 or 22 may be used as the material of the electron transport layer.

[Formula 21]

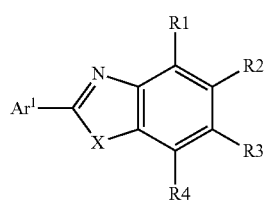

In Formula 21, $R^1$ to $R^4$ may be the same as or different from each other, are each independently a hydrogen atom; a $C_1$ to $C_{30}$ alkyl group substituted or unsubstituted by one or more groups selected from the group consisting of a halogen atom, an amino group, a nitrile group, a nitro group, a $C_1$ to $C_{30}$ alkyl group, a $C_2$ to $C_{30}$ alkenyl group, a $C_1$ to $C_{30}$ alkoxy group, a $C_3$ to $C_{30}$ cycloalkyl group, a $C_3$ to $C_{30}$ heterocycloalkyl group, a $C_5$ to $C_{30}$ aryl group, and a $C_2$ to $C_{30}$ heteroaryl group; a $C_3$ to $C_{30}$ cycloalkyl group substituted or unsubstituted by one or more groups selected from the group consisting of a halogen atom, an amino group, a nitrile group, a nitro group, a $C_1$ to $C_{30}$ alkyl group, a $C_2$ to $C_{30}$ alkenyl group, a $C_1$ to $C_{30}$ alkoxy group, a $C_3$ to $C_{30}$ cycloalkyl group, a $C_3$ to $C_{30}$ heterocycloalkyl group, a $C_5$ to $C_{30}$ aryl group, and a $C_2$ to $C_{30}$ heteroaryl group; a $C_5$ to $C_{30}$ aryl group substituted or unsubstituted by one or more groups selected from the group consisting of a halogen atom, an amino group, a nitrile group, a nitro group, a $C_1$ to $C_{30}$ alkyl group, a $C_2$ to $C_{30}$ alkenyl group, a $C_1$ to $C_{30}$ alkoxy group, a $C_3$ to $C_{30}$ cycloalkyl group, a $C_3$ to $C_{30}$ heterocycloalkyl group, a $C_5$ to $C_{30}$ aryl group, and a $C_2$ to $C_{30}$ heteroaryl group; or a $C_2$ to $C_{30}$ heteroaryl group substituted or unsubstituted by one or more groups selected from the group consisting of a halogen atom, an amino group, a nitrile group, a nitro group, a $C_1$ to $C_{30}$ alkyl group, a $C_2$ to $C_{30}$ alkenyl group, a $C_1$ to $C_{30}$ alkoxy group, a $C_3$ to $C_{30}$ cycloalkyl group, a $C_3$ to $C_{30}$ heterocycloalkyl group, a $C_5$ to $C_{30}$ aryl group, and a $C_2$ to $C_{30}$ heteroaryl group, and may form aliphatic, aromatic, aliphatichetero or aromatichetero fused cycle or a spiro bond in conjunction with the adjacent group; $Ar^1$ is a hydrogen atom, a substituted or unsubstituted aromatic cycle or a substituted or unsubstituted aromatic hetero cycle; X is O, S or $NR^a$; and $R^a$ is hydrogen, $C_1$-$C_7$ aliphatic hydrocarbon, aromatic cycle or aromatic hetero cycle, and

[Formula 22]

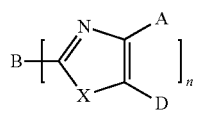

in Formula 22, X is O, S, $NR^b$ or $C_1$-$C_7$ divalent hydrocarbon group; A, D and $R^b$ are each a hydrogen atom, a nitrile group (—CN), a nitro group (—NO$_2$), C$_1$-C$_{24}$ alkyl, C$_5$-C$_{20}$ aromatic cycle or substituted aromatic cycle comprising at least one hetero atom, halogen, alkylene that can form a blending cycle in conjunction with the adjacent cycle, or alkylene comprising at least one hetero atom; A and D may be connected to each other to form aromatic or hetero aromatic cycle; B is substituted or unsubstituted alkylene or arylene connecting a plurality of hetero cycles as connection units to be conjugated or non-conjugated in the case where n is 2 or more, and a substituted or unsubstituted alkyl or aryl in the case where n is 1; and n is an integer of 1 to 8.

An example of the compound of Formula 21 as the compound adopted for the organic material layer comprises a compound known in Korean Unexamined Patent Application Publication No. 2003-0067773, and an example of the compound of Formula 22 comprises a compound disclosed in U.S. Pat. No. 5,645,948 and a compound disclosed in WO05/097756. The contents of the documents are incorporated in the present specification.

The organic light emitting diode according to the present invention may be manufactured by using the general manufacturing method and the material of the organic light emitting diode, except that the compound of Formula 1 is used in one or more layers of the organic material layers of the organic light emitting diode. For example, the organic light emitting diode according to the present invention may be manufactured by forming an anode by depositing metal or metal oxides having the conductivity or an alloy thereof on a substrate by using a PVD (physical vapor deposition) method such as sputtering or e-beam evaporation, forming the organic material layer that comprises a hole injection layer, a hole transport layer, a light emitting layer and an electron transport layer thereon, and depositing the material that is capable of being used as a cathode thereon. In addition to this method, as described above, in order to manufacture the organic light emitting diode having the negative direction structure, an organic light emitting diode may be manufactured by sequentially depositing a cathode material, an organic material layer, and an anode material on a substrate.

The organic material layer may be manufactured in the smaller number of layers by using various polymer materials and by using not a deposition method but a solvent process, for example, spin coating, dip coating, doctor blading, screen printing, inkjet printing, heat transferring method or the like.

As the anode material, in general, it is preferable to use the material having a large work function so as to smoothly perform hole injection into the organic material layer. As examples of the anode material that can be used in the present invention, there are metal or an alloy thereof such as vanadium, chrome, copper, zinc, gold and the like; metal oxides such as zinc oxides, indium oxides, indium tin oxides (ITO), indium zinc oxides (IZO) and the like; a combination of metal and oxides such as ZnO:Al or SnO$_2$:Sb; and conductive polymers such as poly(3-methylthiophene), poly[3,4-(ethylene-1,2-dioxy)thiophene](PEDT), polypyrole, and polyaniline, but it is not limited thereto.

As the cathode material, in general, it is preferable to use the material having a small work function so as to smoothly perform electron injection into the organic material layer. As detailed examples of the cathode material, there are metal such as magnesium, calcium, sodium, potassium, titanium, indium, yttrium, lithium, gadolinium, aluminum, silver, tin, and lead or an alloy thereof; and a multilayered structure material such as LiF/Al or LiO$_2$/Al, but it is not limited thereto.

The hole injection material is a material that is capable of well receiving holes from the anode at a low voltage, and it is preferable that the HOMO (highest occupied molecular orbital) of the hole injection material is a value between the work function of the anode material and the HOMO of the organic material layer around them. As detailed examples of the hole injection material, there are metal porphyrine, oligo thiophene, arylamine-based organic material, hexanitrile-hexaazatriphenylene-based organic material, quinacridone-based organic material, perylene-based organic material, anthraquinone and polyaniline and poly thiophene-based conductive polymers, but it is not limited thereto.

The hole transport material is a material that can receive the holes from the anode or the hole injection layer and transfer the received holes to the light emitting layer, and it is preferable to use the material having the large mobility to the holes. As detailed examples thereof, there are an arylamine-based compound, a carbazole-based compound, an anthracene-based compound, a pyrene-based compound, a conductive polymer, and a block copolymer in which a conjugate portion and a non-conjugate portion are simultaneously included, but it is not limited thereto.

The light emitting material is a material that can receive the holes and the electrons from the hole transport layer and the electron transport layer, respectively, combines the received holes and electrons, such that light in a range of visible rays is emitted, and it is preferable to use the material having excellent photon efficiency to fluorescence or phosphorescence. As detailed examples thereof, there are a 8-hydroxy-quinoline aluminum complex (Alq$_3$); a carbazole-based compound; a dimerized styryl compound; a bis-methyl-8-hydroxyquinoline paraphenylphenol aluminum complex (Balq); a 10-hydroxybenzoquinoline-metal compound; benzoxazole, benzthiazole and benzimidazole-based compounds; an anthracene-based compound; a pyrene-based compound; a poly(p-phenylenevinylene) (PPV)-based polymer; a spiro compound; polyfluorene, and lubrene, but it is not limited thereto.

The electron transport material is a material that can receive well the electrons from the cathode and transfer the received electrons to the light emitting layer, and it is preferable to use the material having the large mobility to the electrons. As detailed examples thereof, there are a 8-hydroxy-quinoline Al complex; a complex comprising Alq$_3$; an organic radical compound; a hydroxyflabon-metal complex; an anthracene-based compound; a pyrene-based compound; benzoxazole, benzthiazole and benzimidazole-based compounds; a pyridyl-based compound; a phenanthroline-based compound; a quinoline-based compound; and a quinazoline-based compound, and the compounds thereof may form an electron transport layer by doping metal or a metal compound, but are not limited thereto.

The organic light emitting diode according to the present invention may be a front side light emitting type, a rear side light emitting type, or a both sides light emitting type according to the used material.

The compound according to the present invention may be operated even in an organic electronic device such as an organic solar cell, an organic photoconductor, and an organic transistor, in a principle similar to a principle applied to the organic light emitting diode.

Hereinafter, preferable Examples will be described in order to help understanding of the present invention. The following Examples are set forth to illustrate but are not to be construed to limit the present invention.

In order to synthesize the compound represented by Formula 1, the compounds of the following Formulas a to d may be used as a starting material.

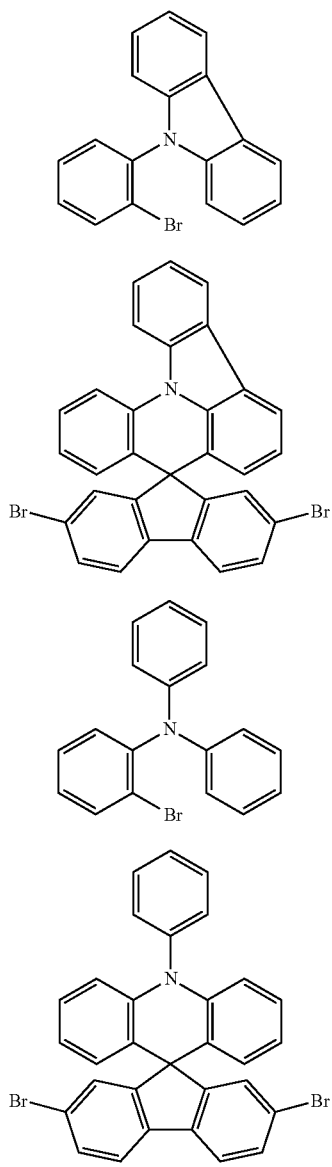

[Formula a]

[Formula b]

[Formula c]

[Formula d]

Preparation Example 1

Preparation of the Starting Material Represented by Formula a

Carbazole (1.672 g, 10 mmol), 1-bromo-2-iodobenzene (1.5 mL, 12 mmol), potassium carbonate ($K_2CO_3$, 2.7646 g, 20 mmol), copper iodide (CuI, 95 mg, 0.5 mmol), and 25 mL of xylene were refluxed under the nitrogen atmosphere. After cooling to normal temperature, the product was extracted with ethyl acetate and water was removed with anhydrous magnesium sulfate ($MgSO_4$), and the solvent was removed under reduced pressure. After the compound passing through the silica gel column by using the hexane solvent was obtained, the solvent was removed under the reduced pressure and vacuum dried to obtain the desired white solid compound (800 mg, 25% yield).

MS: [M+H]+=323.

Preparation Example 2

Preparation of the Starting Material Represented by Formula b

After the starting material (6.96 g, 21.6 mmol) represented by Formula a was dissolved in 300 ml of purified THF and cooled to −78° C., n-BuLi (2.5 Min hexane, 8.64 ml, 21.6 mmol) was slowly dropped thereonto. After the agitation at the same temperature for 30 min, 2,7-dibromo-9-fluorenone (6.08 g, 18.0 mmol) was added thereto. After the agitation at the same temperature for 40 min, the temperature was increased to normal temperature and the agitation was additionally performed for 3 hours. After the reaction was finished by the ammonium chloride ($NH_4Cl$) aqueous solution, extraction was performed with ethylether. After water was removed with anhydrous magnesium sulfate ($MgSO_4$) from the organic material layer, the organic solvent was removed. The obtained solid was dispersed in ethanol, agitated overnight, filtered, and vacuum dried to obtain 10.12 g (96.7% yield) of the intermediate material. After the obtained solid was dispersed in 10 ml of acetic acid, 10 drops of concentrated sulfuric acid were added thereto and refluxed for 4 hours. The obtained solid was filtered, washed with ethanol, and vacuum dried to obtain Formula b (9.49 g, 96.8% yield).

MS: [M+H]+=563.

Preparation Example 3

Preparation of the Starting Material Represented by Formula c

Diphenylamine (1.692 g, 10 mmol), 1-bromo-2-iodobenzene (1.5 mL, 12 mmol), potassium carbonate ($K_2CO_3$, 2.7646 g, 20 mmol), copper iodide (CuI, 95 mg, 0.5 mmol), and 25 mL of xylene were refluxed under the nitrogen atmosphere. After cooling to normal temperature, the product was extracted with ethyl acetate and water was removed with anhydrous magnesium sulfate ($MgSO_4$), and the solvent was removed under reduced pressure. After the compound passing through the silica gel column by using the hexane solvent was obtained, the solvent was removed under the reduced pressure and vacuum dried to obtain the desired white solid compound c (2.27 g, 70% yield).

MS: [M+H]+=324.

Preparation Example 4

Preparation of the Starting Material Represented by Formula d

After the starting material (7.0 g, 21.6 mmol) represented by Formula c was dissolved in 300 ml of purified THF and cooled to −78° C., n-BuLi (2.5 Min hexane, 8.64 ml, 21.6 mmol) was slowly dropped thereonto. After the agitation at the same temperature for 30 min, 2,7-dibromo-9-fluorenone (6.08 g, 18.0 mmol) was added thereto. After the agitation at the same temperature for 40 min, the temperature was increased to normal temperature and the agitation was additionally performed for 3 hours. After the reaction was finished by the ammonium chloride ($NH_4Cl$) aqueous solution, extraction was performed with ethylether. After water was removed with anhydrous magnesium sulfate ($MgSO_4$) from the organic material layer, the organic solvent was removed. The obtained solid was dispersed in ethanol, agitated overnight, filtered, and vacuum dried to obtain the intermediate material. After the obtained solid was dispersed in 10 ml of acetic acid, 10 drops of concentrated sulfuric acid were added thereto and refluxed for 4 hours. The obtained solid was filtered, washed with ethanol, and vacuum dried to obtain Formula d (10.98 g, 90% yield).

MS: [M+H]+=564.

Example 1

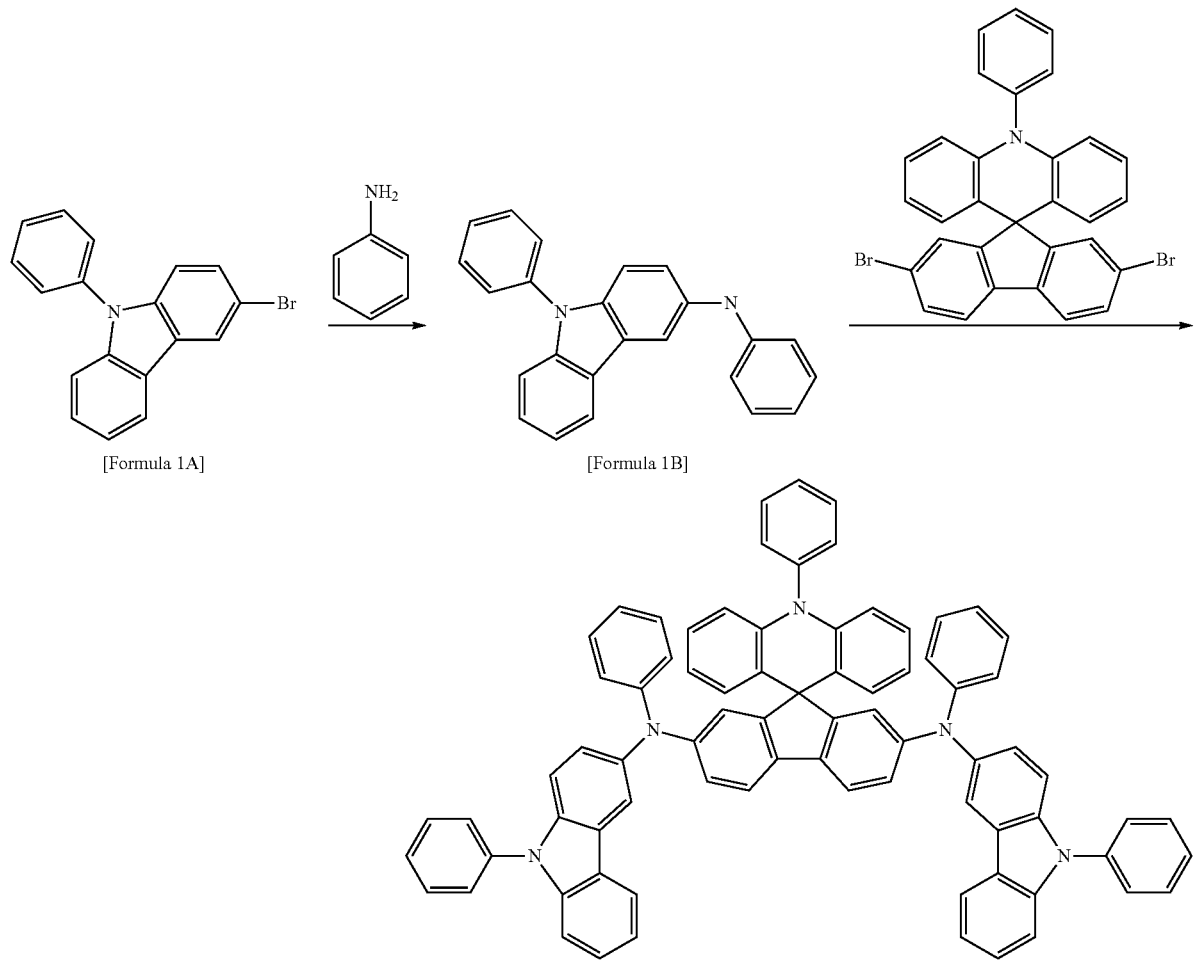

Formula 1A (15 g, 46.55 mmol) and aniline (13 g, 139.66 mmol) were dissolved in 150 ml of toluene, sodium-tertiary-butoxide (6.7 g, 69.82 mmol), and Pd[P(t-Bu)$_3$]$_2$ (0.24 g, 0.46 mmol) were added thereto, and refluxed for 5 hours under the nitrogen atmosphere. Distilled water was put into the reaction solution, the reaction was terminated, and the organic layer was extracted. After the column separation was carried out with normal-hexane/tetrahydrofurane=10/1 solvent, the agitation was performed in petroleum ether, and vacuum dried to obtain Formula 1B (13 g, yield 83.5%).

MS: [M+H]$^+$=334

Formula 1B (10.41 g, 31.13 mmol) and Formula d (8 g, 14.15 mmol) were dissolved in 150 ml of toluene, sodium-tertiary-butoxide (4.0 g, 42.45 mmol), and Pd[P(t-Bu)$_3$]$_2$ (0.07 g, 0.14 mmol) were added thereto, and refluxed for 5 hours under the nitrogen atmosphere. Distilled water was put into the reaction solution, the reaction was terminated, and the organic layer was extracted. After the column separation was carried out with normal-hexane/tetrahydrofurane=10/1 solvent, the agitation was performed in petroleum ether, and vacuum dried to obtain Structural Formula 1 (11.4 g, yield 75%).

MS: [M+H]$^+$=1072

Example 2

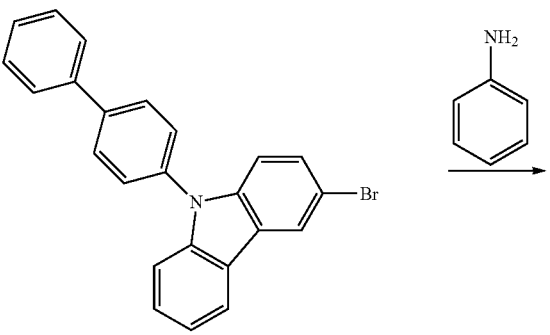

[Formula 2A]

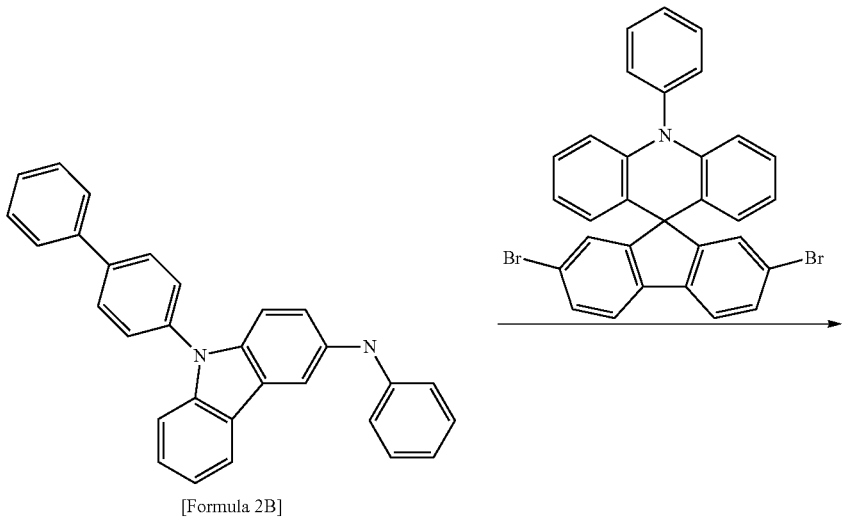

[Formula 2B]

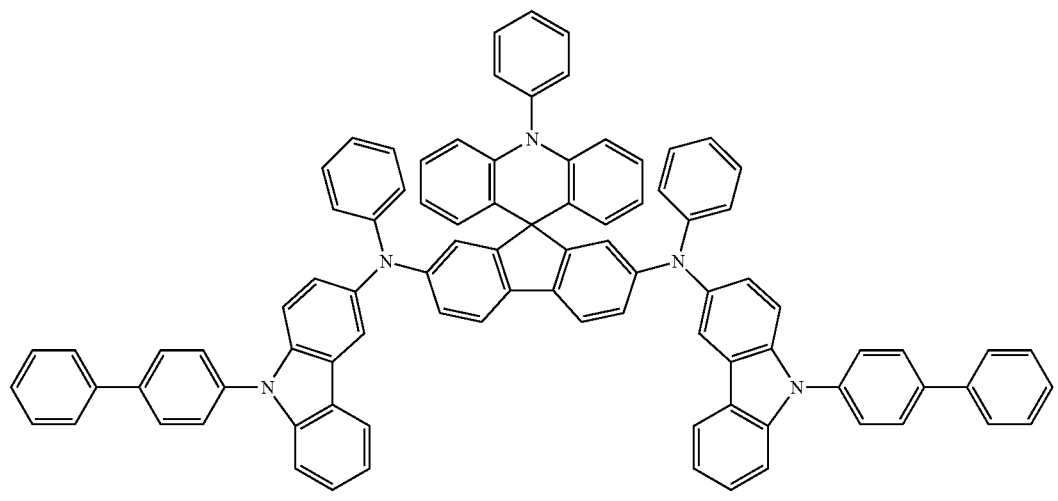

[Structural Formula 2]

Formula 2A (18.5 g, 46.55 mmol) and aniline (13 g, 139.66 mmol) were dissolved in 150 ml of toluene, sodium-tertiary-butoxide (6.7 g, 69.82 mmol) and Pd[P(t-Bu)₃]₂ (0.24 g, 0.46 mmol) were added thereto, and refluxed for 5 hours under the nitrogen atmosphere. Distilled water was put into the reaction solution, the reaction was terminated, and the organic layer was extracted. After the column separation was carried out with normal-hexane/tetrahydrofurane=10/1 solvent, the agitation was performed in petroleum ether, and vacuum dried to obtain Formula 2B (16 g, yield 83.7%).

MS: [M+H]⁺=410

Formula 2B (12.78 g, 31.13 mmol) and Formula d (8 g, 14.15 mmol) were dissolved in 150 ml of toluene, sodium-tertiary-butoxide (4.0 g, 42.45 mmol) and Pd[P(t-Bu)₃]₂ (0.07 g, 0.14 mmol) were added thereto, and refluxed for 5 hours under the nitrogen atmosphere. Distilled water was put into the reaction solution, the reaction was terminated, and the organic layer was extracted. After the column separation was carried out with normal-hexane/tetrahydrofurane=10/1 solvent, the agitation was performed in petroleum ether, and vacuum dried to obtain Structural Formula 2 (13.51 g, yield 78%).

MS: [M+H]⁺=1224

Example 3

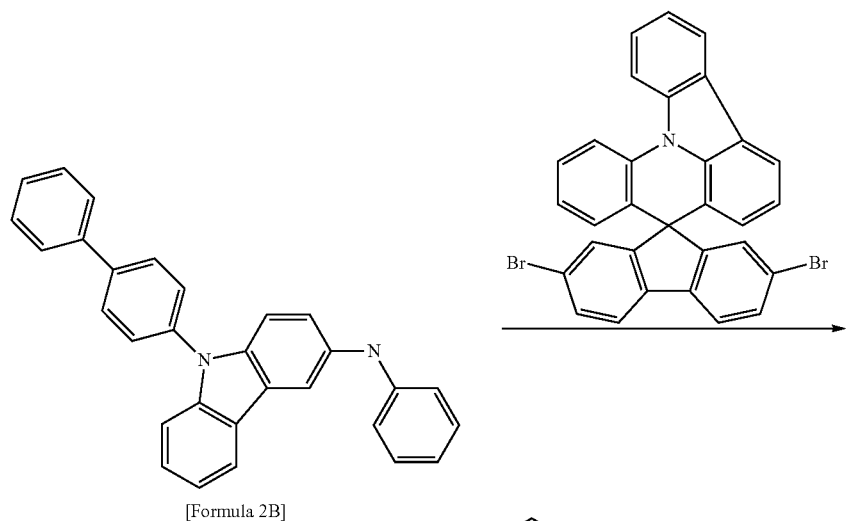

[Formula 2B]

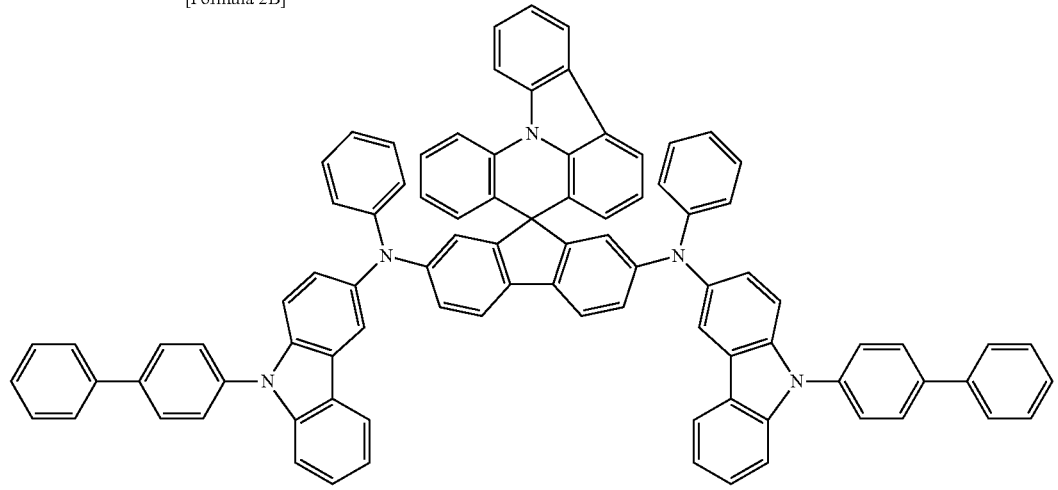

[Structural Formula 3]

Formula 2B (10.41 g, 31.13 mmol) and Formula b (7.97 g, 14.15 mmol) were dissolved in 150 ml of toluene, sodium-tertiary-butoxide (4.0 g, 42.45 mmol) and Pd[P(t-Bu)$_3$]$_2$ (0.07 g, 0.14 mmol) were added thereto, and refluxed for 5 hours under the nitrogen atmosphere. Distilled water was put into the reaction solution, the reaction was terminated, and the organic layer was extracted. After the column separation was carried out with normal-hexane/tetrahydrofurane=10/1 solvent, the agitation was performed in petroleum ether, and vacuum dried to obtain Structural Formula 3 (14 g, yield 81%).

MS: [M+H]$^+$=1222

Example 4

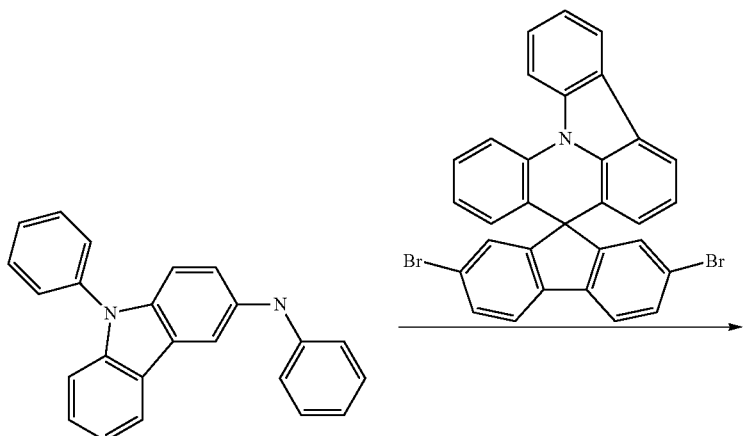

[Formula 1B]

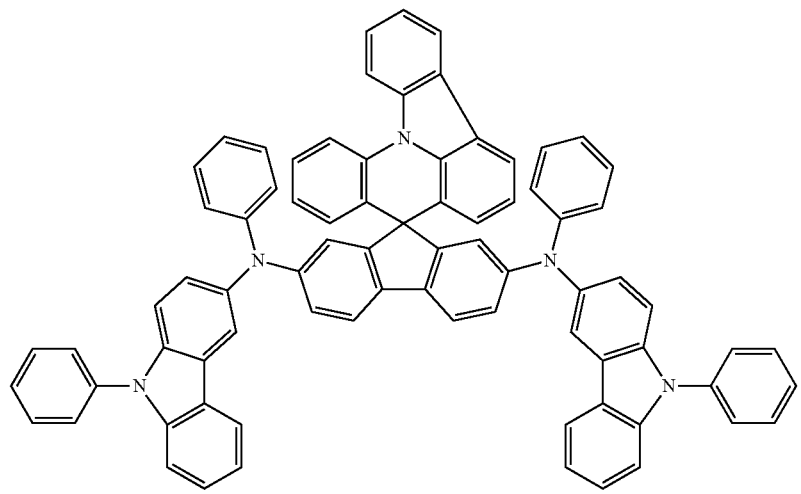

[Structural Formula 4]

Formula 1B (10.41 g, 31.13 mmol) and Formula b (7.97 g, 14.15 mmol) were dissolved in 150 ml of toluene, sodium-tertiary-butoxide (4.0 g, 42.45 mmol) and Pd[P(t-Bu)$_3$]$_2$ (0.07 g, 0.14 mmol) were added thereto, and refluxed for 5 hours under the nitrogen atmosphere. Distilled water was put into the reaction solution, the reaction was terminated, and the organic layer was extracted. After the column separation was carried out with normal-hexane/tetrahydrofurane=10/1 solvent, the agitation was performed in petroleum ether, and vacuum dried to obtain Structural Formula 4 (11.96 g, yield 79%).

MS: [M+H]$^+$=1070

Example 5

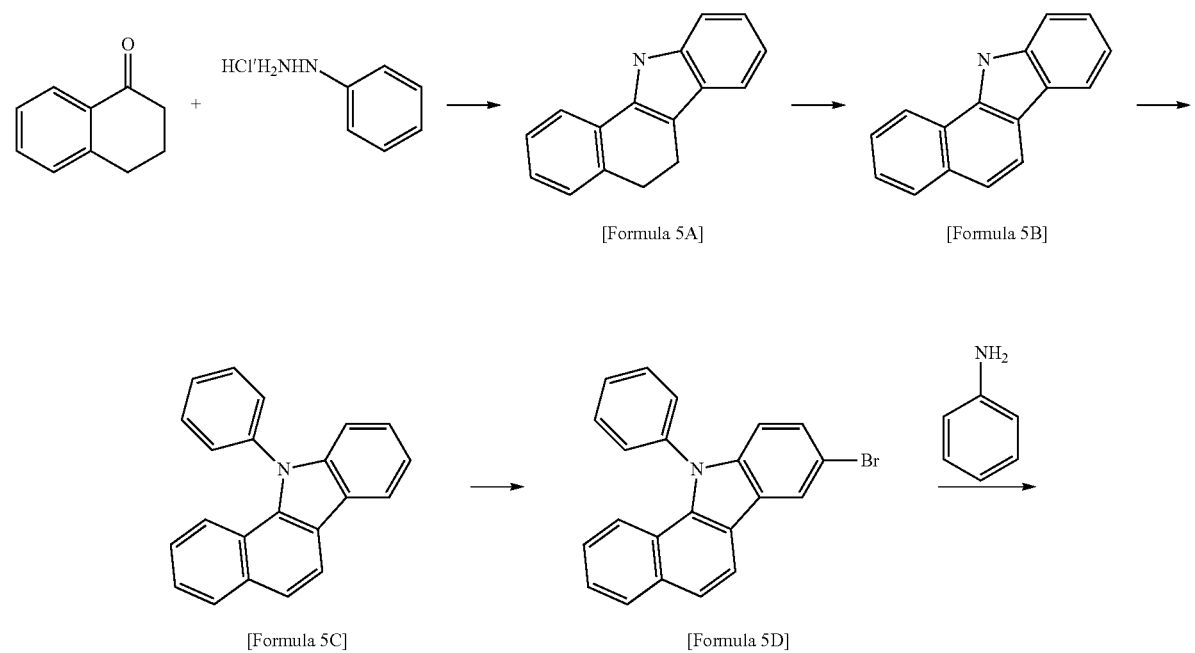

[Formula 5A]  [Formula 5B]

[Formula 5C]  [Formula 5D]

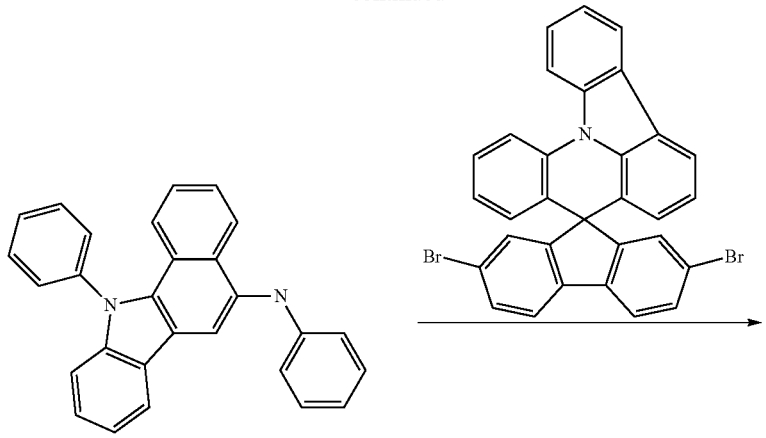

[Formula 5E]

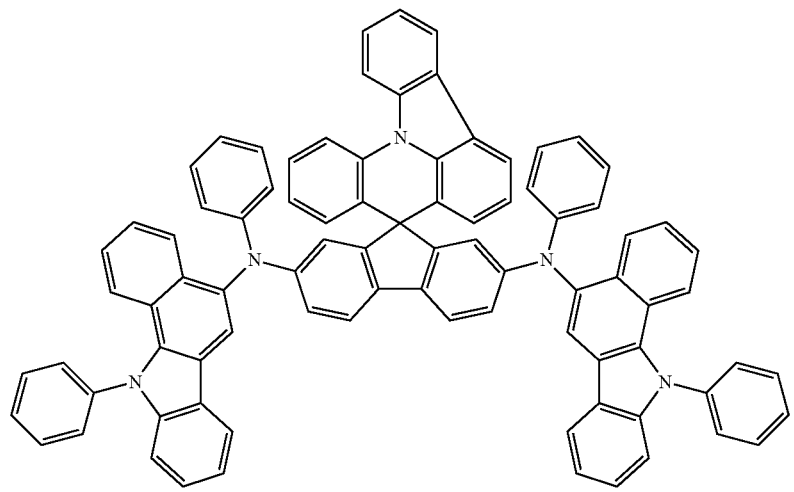

[Structural Formula 5]

α-tetralone (18 g, 123 mmol) and phenylhydrazinium chloride (11 g, 76 mmol) were put into a small amount of acetic acid, and refluxed in 150 mL of ethanol for 2 hours under nitrogen atmosphere. The product generated after being cooled to normal temperature was filtered and dried to obtain Formula 5A (17.6 g, yield 65%). MS: [M+H]$^+$=219

Compound 5A (17.6 g, 80.5 mmol) and tetrachloro-1,4-benzoquinone (27.45 g, 111.7 mmol) were refluxed under the nitrogen atmosphere in 300 ml of xylene for 2 hours. NaOH (10%) and water were put into the reaction solution, the termination was carried out, and the organic layer was extracted. The reaction solution was concentrated and recrystallized with EtOH to obtain Formula 5B (16.7 g, yield 96%). MS: [M+H]$^+$=217

Compound 5B (8.4 g, 38.6 mmol) and bromobenzene (7.3 g, 46.3 mmol) were dissolved in 200 ml of xylene, sodium-tertiary-butoxide (5.6 g, 57.9 mmol) and Pd[P(t-Bu)$_3$]$_2$ (0.19 g, 0.386 mmol) were added thereto, and refluxed for 5 hours under the nitrogen atmosphere. Distilled water was put into the reaction solution, the reaction was terminated, and the organic layer was extracted. After the column separation was carried out with normal-hexane/tetrahydrofurane=10/1 solvent, the agitation was performed in petroleum ether, and vacuum dried to obtain Formula 5C (10.19 g, yield 90%). MS: [M+H]$^+$=293

Compound 5C (10.19 g, 34.7 mmol) was dissolved in chloroform (300 mL), and N-bromo succinimide (6.18 g, 34.7 mmol) was added thereto, and agitated for 5 hours at normal temperature. Distilled water was put into the reaction solution, the reaction was terminated, and the organic layer was extracted. The reaction solution was concentrated and recrystallized with EtOH to obtain Formula 5D (5.63 g, yield 43%). MS: [M+H]$^+$=372

Formula 5D (17.3 g, 46.55 mmol) and aniline (13 g, 139.66 mmol) were dissolved in 150 ml of toluene, sodium-tertiary-butoxide (6.7 g, 69.82 mmol) and Pd[P(t-Bu)$_3$]$_2$ (0.24 g, 0.46 mmol) were added thereto, and refluxed for 5 hours under the nitrogen atmosphere. Distilled water was put into the reaction solution, the reaction was terminated, and the organic layer was extracted. After the column separation was carried out with normal-hexane/tetrahydrofurane=10/1 solvent, the agitation was performed in petroleum ether, and vacuum dried to obtain Formula 5E (12 g, yield 67%). MS: [M+H]$^+$=384

Formula 5E (11.97 g, 31.13 mmol) and Formula b (7.97 g, 14.15 mmol) were dissolved in 150 ml of toluene, sodium-tertiary-butoxide (4.0 g, 42.45 mmol) and Pd[P(t-Bu)$_3$]$_2$ (0.07 g, 0.14 mmol) were added thereto, and refluxed for 5 hours under the nitrogen atmosphere. Distilled water was put into the reaction solution, the reaction was terminated, and the organic layer was extracted. After the column separation was carried out with normal-hexane/tetrahydrofurane=10/1 solvent, the agitation was performed in petroleum ether, and vacuum dried to obtain Structural Formula 5 (11.26 g, yield 68%).

MS: [M+H]$^+$=1170

Example 6

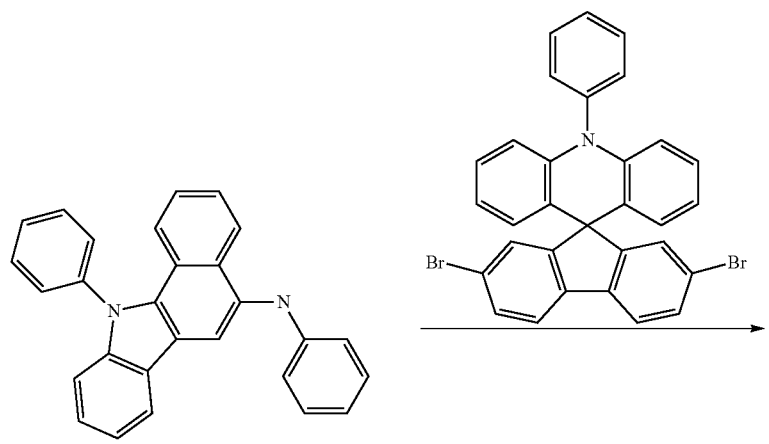

[Formula 5E]

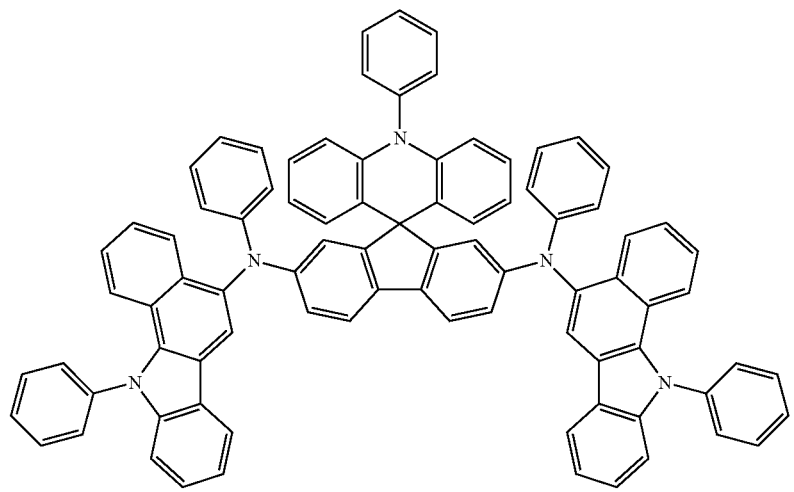

[Structural Formula 7]

Formula 5E (11.97 g, 31.13 mmol) and Formula d (8 g, 14.15 mmol) were dissolved in 150 ml of toluene, sodium-tertiary-butoxide (4.0 g, 42.45 mmol) and Pd[P(t-Bu)$_3$]$_2$ (0.07 g, 0.14 mmol) were added thereto, and refluxed for 5 hours under the nitrogen atmosphere. Distilled water was put into the reaction solution, the reaction was terminated, and the organic layer was extracted. After the column separation was carried out with normal-hexane/tetrahydrofurane=10/1 solvent, the agitation was performed in petroleum ether, and vacuum dried to obtain Structural Formula 7 (11.11 g, yield 67%).

MS: [M+H]$^+$=1172

Example 7

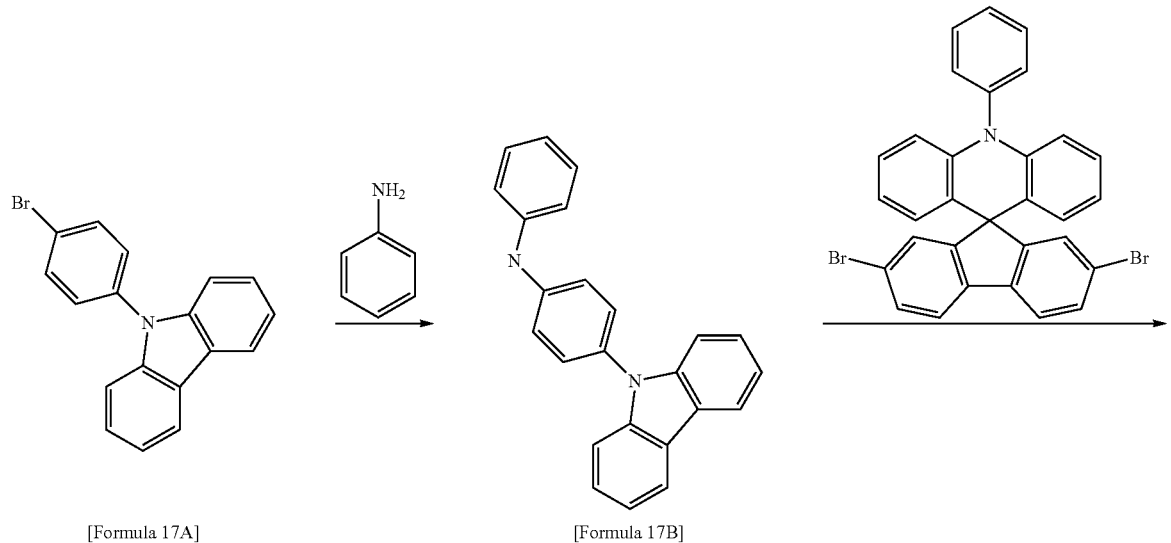

[Formula 17A]   [Formula 17B]

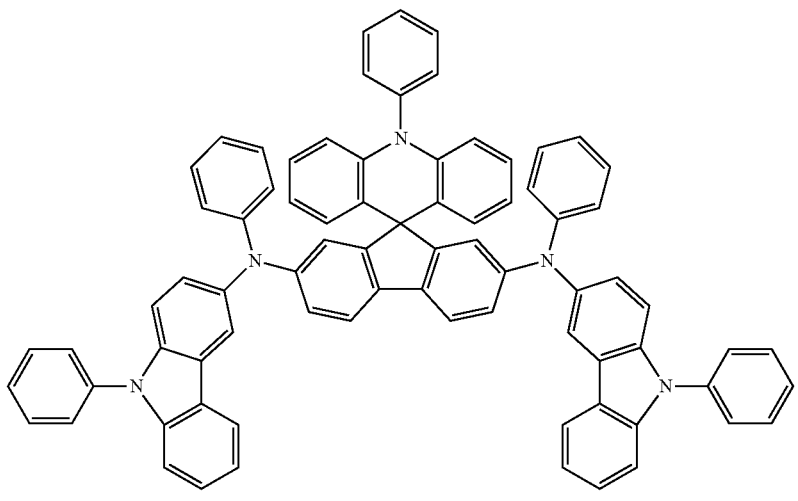

[Structural Formula 17]

Formula 17A (15 g, 46.55 mmol) and aniline (13 g, 139.66 mmol) were dissolved in 150 ml of toluene, sodium-tertiary-butoxide (6.7 g, 69.82 mmol) and Pd[P(t-Bu)$_3$]$_2$ (0.24 g, 0.46 mmol) were added thereto, and refluxed for 5 hours under the nitrogen atmosphere. Distilled water was put into the reaction solution, the reaction was terminated, and the organic layer was extracted. After the column separation was carried out with normal-hexane/tetrahydrofurane=10/1 solvent, the agitation was performed in petroleum ether, and vacuum dried to obtain Formula 17B (13 g, yield 83.5%). MS: [M+H]$^+$= 334

Formula 17B (10.41 g, 31.13 mmol) and Formula d (8 g, 14.15 mmol) were dissolved in 150 ml of toluene, sodium-tertiary-butoxide (4.0 g, 42.45 mmol) and Pd[P(t-Bu)$_3$]$_2$ (0.07 g, 0.14 mmol) were added thereto, and refluxed for 5 hours under the nitrogen atmosphere. Distilled water was put into the reaction solution, the reaction was terminated, and the organic layer was extracted. After the column separation was carried out with normal-hexane/tetrahydrofurane=10/1 solvent, the agitation was performed in petroleum ether, and vacuum dried to obtain Structural Formula 17 (10.47 g, yield 69%).

MS: [M+H]$^+$=1072

Example 8

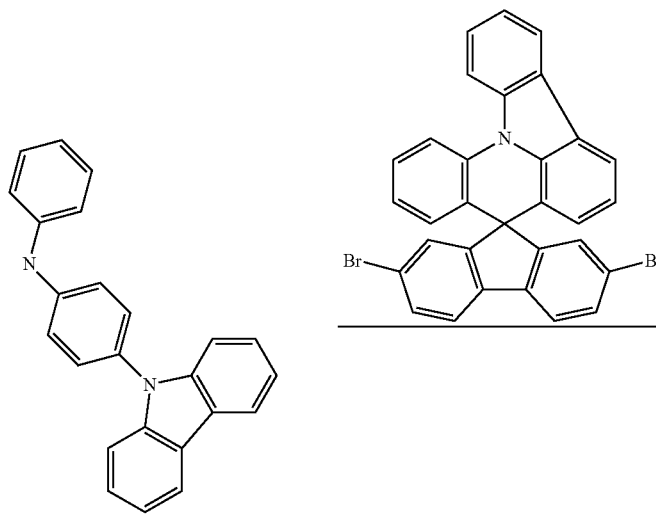

[Formula 17B]

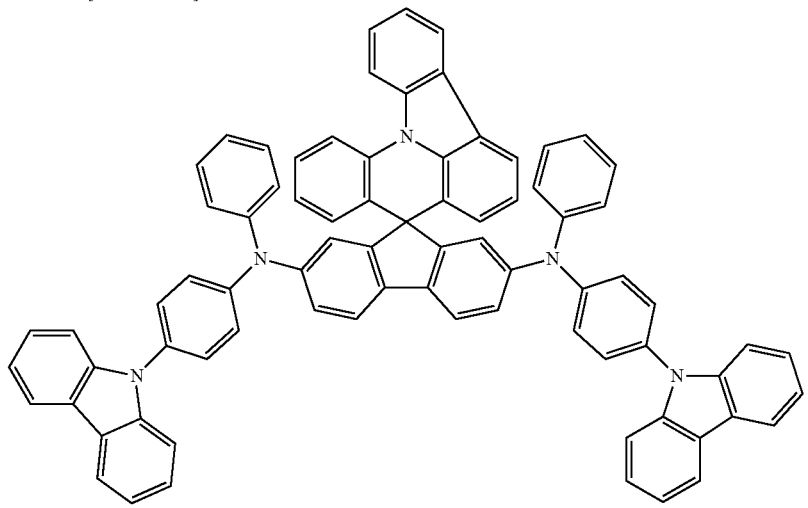

[Structural Formula 18]

Formula 17B (10.41 g, 31.13 mmol) and Formula b (7.97 g, 14.15 mmol) were dissolved in 150 ml of toluene, sodium-tertiary-butoxide (4.0 g, 42.45 mmol) and Pd[P(t-Bu)$_3$]$_2$ (0.07 g, 0.14 mmol) were added thereto, and refluxed for 5 hours under the nitrogen atmosphere. Distilled water was put into the reaction solution, the reaction was terminated, and the organic layer was extracted. After the column separation was carried out with normal-hexane/tetrahydrofurane=10/1 solvent, the agitation was performed in petroleum ether, and vacuum dried to obtain Structural Formula 18 (12.26 g, yield 81%).

MS: [M+H]$^+$=1070

Experimental Example 1

A glass substrate on which a thin film of indium tin oxide (ITO) was coated to a thickness of 1000 Å was immersed in distilled water having a detergent dissolved therein and washed with ultrasonic waves. In this case, the used detergent was a product commercially available from Fisher Co. and the distilled water was one which had been twice filtered by using a filter commercially available from Millipore Co. ITO was washed for 30 minutes, and then washing with ultrasonic waves was repeated twice for 10 minutes by using distilled water. After the completion of washing with distilled water, washing with ultrasonic waves was subsequently carried out by using solvents such as isopropyl alcohol, acetone, and methanol, and the resultant product was dried and transported to the plasma washing machine. In addition, the substrate was washed by using the oxygen plasma for 5 minutes, and the substrate was transported to the vacuum deposition machine.

On the ITO transparent electrode prepared as described above, the hole injection layer was formed by vacuum depositing the compound of Structural Formula 1 manufactured in Example 1 by heat to a thickness of 500 Å.

The hole transport layer was formed by vacuum depositing 4,4'-bis[N-(1-naphthyl)-N-phenylamino]biphenyl (NPB) (400 Å) of the following Formula that was the material transporting the hole on the hole injection layer.

[NPB]

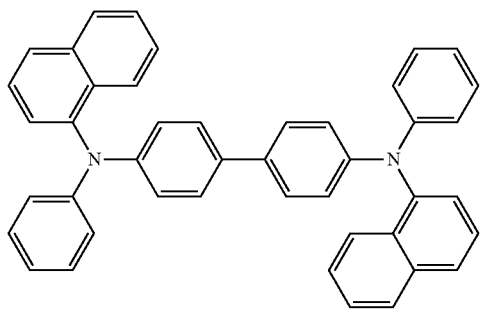

Subsequently, the light emitting layer was formed by vacuum depositing GH and GD shown below at a weight ratio of 20:1 in a film thickness of 300 Å on the hole transport layer.

[GH]

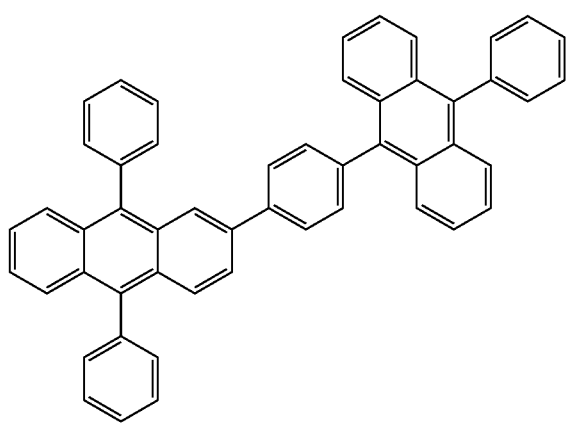

[GD]

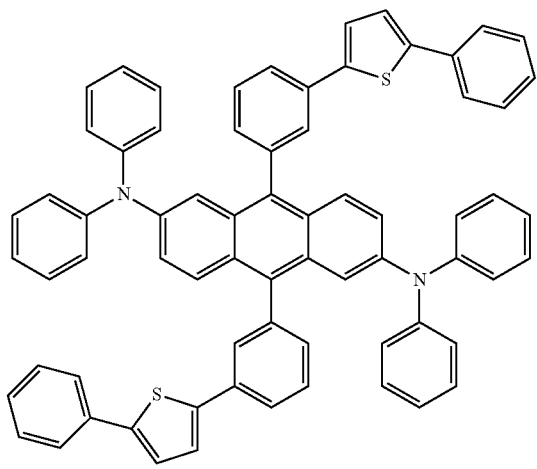

The electron transport layer was formed by depositing the electron transport layer material of the following Formula on the light emitting layer in a thickness of 200 Å.

[Electron Transport Layer Material]

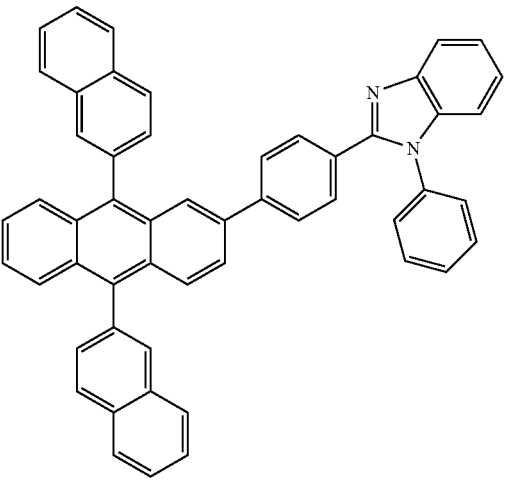 [SMILES: c1ccc(-n2c(-c3ccc(-c4ccc5c(-c6ccc7ccccc7c6)c6ccccc6c(-c6ccc7ccccc7c6)c5c4)cc3)nc3ccccc32)cc1]

On the electron transport layer, lithium fluoride (LiF) in a thickness of 12 Å and aluminum in a thickness of 2000 Å were subsequently deposited to form a cathode.

In the above process, a deposition rate of the organic material was maintained at 0.3 to 0.8 Å/sec. In addition, the deposition rate of lithium fluoride of the cathode was maintained at 0.3 Å/sec, and the deposition rate of aluminum was maintained at 1.5 to 2.5 Å/sec. The degree of vacuum during the deposition was maintained at 1 to $3 \times 10^{-7}$.

The manufactured device showed an electric field of 3.6 V at a positive direction current density of 10 mA/cm$^2$, and emitted green light in an efficiency of 31 cd/A. As described above, the light emission of the device operated at the above driving voltage means that the hole injection and transport layers perform the roles.

Experimental Example 2

The same method as Experimental Example 1 was performed to manufacture the organic light emitting diode, except that the compound of Structural Formula 2 manufactured in Example 2 was used as the material of the hole injection and transport layers.

The manufactured device showed an electric field of 3.6 V at a positive direction current density of 10 mA/cm$^2$, and emitted green light in an efficiency of 32 cd/A. As described above, the light emission of the device operated at the above driving voltage means that the hole injection role is performed.

Experimental Example 3

The same method as Experimental Example 1 was performed to manufacture the organic light emitting diode, except that the compound of Structural Formula 3 manufactured in Example 3 was used as the material of the hole injection and transport layers.

The manufactured device showed an electric field of 3.7 V at a positive direction current density of 10 mA/cm², and emitted green light in an efficiency of 31 cd/A. As described above, the light emission of the device operated at the above driving voltage means that the hole injection role is performed.

Experimental Example 4

The same method as Experimental Example 1 was performed to manufacture the organic light emitting diode, except that the compound of Structural Formula 4 manufactured in Example 4 was used as the material of the hole injection and transport layers.

The manufactured device showed an electric field of 3.7 V at a positive direction current density of 10 mA/cm², and emitted green light in an efficiency of 30 cd/A. As described above, the light emission of the device operated at the above driving voltage means that the hole injection role is performed.

Experimental Example 5

The same method as Experimental Example 1 was performed to manufacture the organic light emitting diode, except that the compound of Structural Formula 5 manufactured in Example 5 was used as the material of the hole injection and transport layers.

The manufactured device showed an electric field of 3.8 V at a positive direction current density of 10 mA/cm², and emitted green light in an efficiency of 30 cd/A. As described above, the light emission of the device operated at the above driving voltage means that the hole injection role is performed.

Experimental Example 6

The same method as Experimental Example 1 was performed to manufacture the organic light emitting diode, except that the compound of Structural Formula 7 manufactured in Example 6 was used as the material of the hole injection and transport layers.

The manufactured device showed an electric field of 3.7 V at a positive direction current density of 10 mA/cm², and emitted green light in an efficiency of 31 cd/A. As described above, the light emission of the device operated at the above driving voltage means that the hole injection role is performed.

Experimental Example 7

The same method as Experimental Example 1 was performed to manufacture the organic light emitting diode, except that the compound of Structural Formula 17 manufactured in Example 7 was used as the material of the hole injection and transport layers.

The manufactured device showed an electric field of 3.8 V at a positive direction current density of 10 mA/cm², and emitted green light in an efficiency of 31 cd/A. As described above, the light emission of the device operated at the above driving voltage means that the hole injection role is performed.

Experimental Example 8

The same method as Experimental Example 1 was performed to manufacture the organic light emitting diode, except that the compound of Structural Formula 18 manufactured in Example 8 was used as the material of the hole injection and transport layers.

The manufactured device showed an electric field of 3.8 V at a positive direction current density of 10 mA/cm², and emitted green light in an efficiency of 32 cd/A. As described above, the light emission of the device operated at the above driving voltage means that the hole injection role is performed.

The invention claimed is:
1. A compound of the following Formula 1:

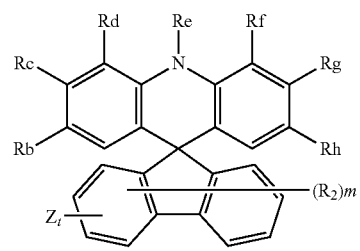

[Formula 1]

wherein
t is 1 or 2, and Z is represented by the following Formula 2a or Formula 2b;

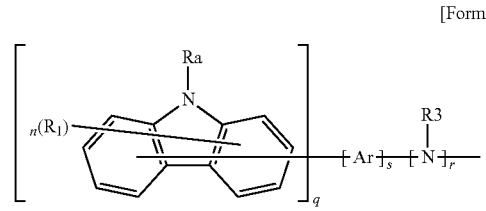

[Formula 2a]

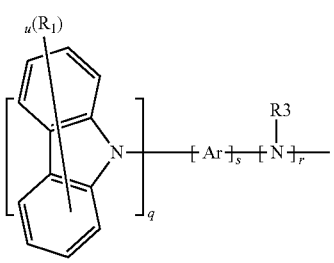

[Formula 2b]

n and m are independently an integer of 1 to 7, and u is an integer of 1 to 8, s an integer of 0 to 10, and r is 0, 1 or 2, q is an integer of 1 to 3, and when q is 2 or more, substituent groups in a bracket are the same as or different from each other, $R^1$ to $R^3$ are independently selected from the group consisting of hydrogen, deuterium, a substituted or unsubstituted aryl group, a substituted or unsubstituted heterocyclic group, and a substituted or unsubstituted arylamine group, in the case where n or u is 2 or more, $R^1$s are the same as or different from each other and adjacent $R^1$s may be connected to each other to form a monocycle or a fused cycle including an aliphatic cycle, an aromatic cycle or a hetero cycle, and in the case where m is 2 or more, $R^2$s are the same as or different from each other, and adjacent $R^2$s may be connected to each other to form a monocycle or a fused cycle including an aliphatic cycle, an aromatic cycle or a hetero cycle, Ar is selected from the group consisting of a substituted or unsubstituted arylene group, a substituted or unsubstituted heterocyclic group, and a substituted or unsubstituted arylamine group, and in the case where s is 2 or more, Ar are the same as or different from each other, Ra to Rh are independently selected from the group consisting of hydrogen, deuterium, a substituted or unsubstituted alkyl group, a substituted or unsubstituted aryl group, a substituted or unsubstituted heterocyclic group, and a substituted or unsubstituted arylamine group, and adjacent groups of Ra to Rh may be connected to each other to form a monocycle or a fused cycle including an aliphatic cycle, an aromatic cycle or a hetero cycle.

2. The compound according to claim 1, wherein Formula 1 is represented by the following Formula 3 or 4:

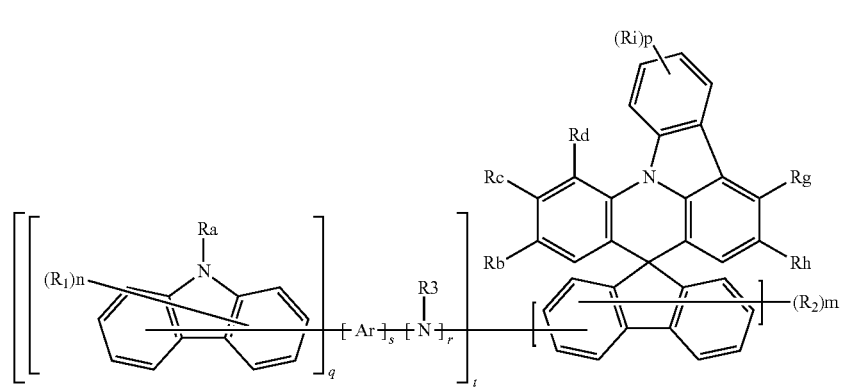

[Formula 3]

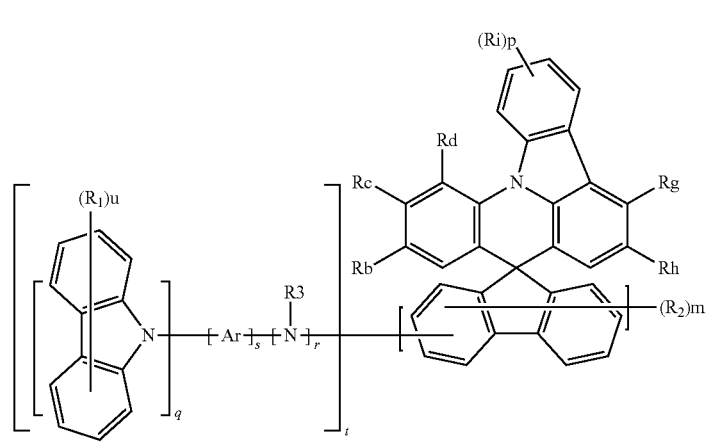

[Formula 4]

wherein n, m, u, s, r, q, $R^1$ to $R^3$, Ar, Ra to Rd, and Rg are the same as those defined in Formula 1, p is an integer in the range of 1 to 4, Ri is independently selected from the group consisting of hydrogen, deuterium, a substituted or unsubstituted alkyl group, a substituted or unsubstituted aryl group, a substituted or unsubstituted heterocyclic group, and a substituted or unsubstituted arylamine group, or may be connected to the adjacent substituent group to form a monocycle or a fused cycle including an aliphatic cycle, an aromatic cycle or a hetero cycle, and in the case where p is 2 or more, R is are the same as or different from each other.

3. The compound according to claim 1, wherein Formula 1 is represented by the following Formulas 5 to 20:

[Formula 5]
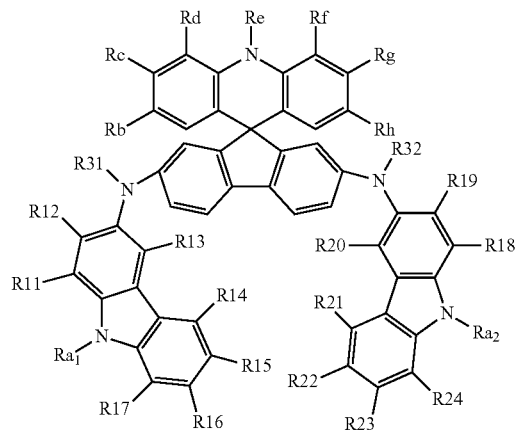
[Formula 6]
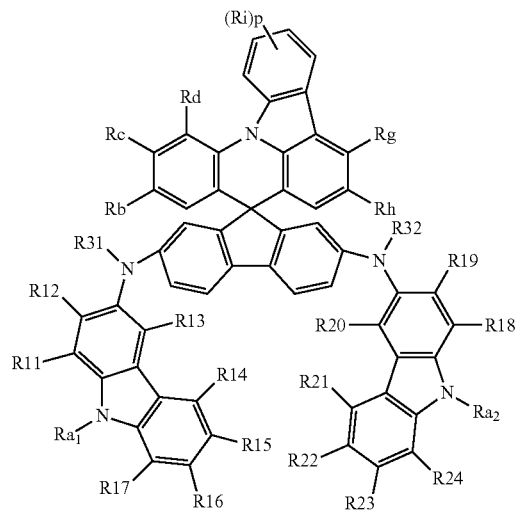
[Formula 7]
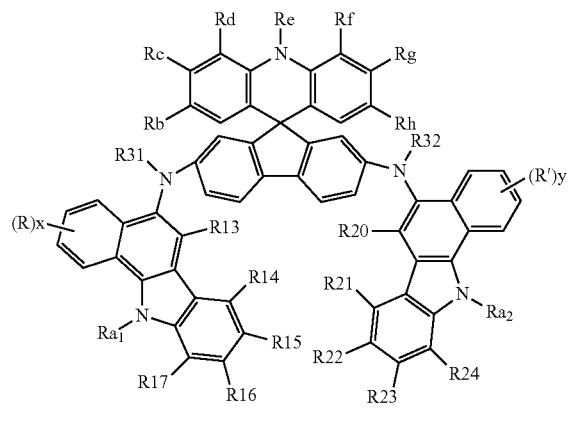
[Formula 8]
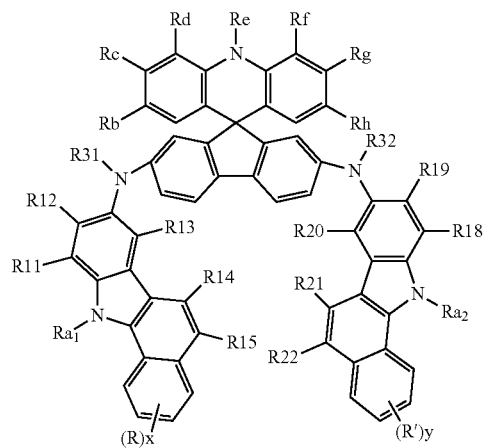
[Formula 9]
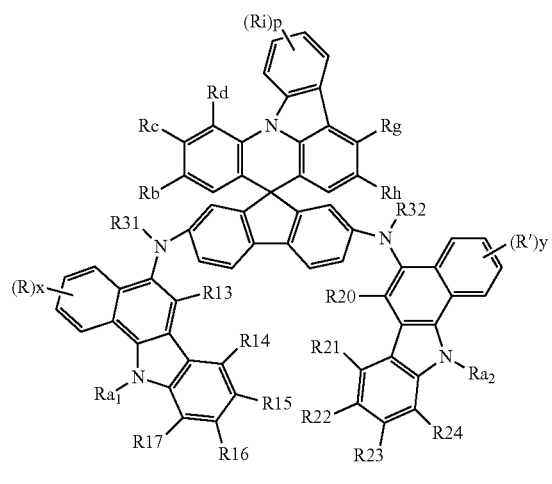
[Formula 10]
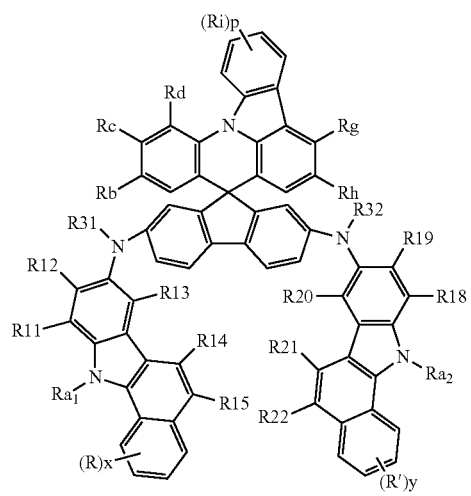

[Formula 11]
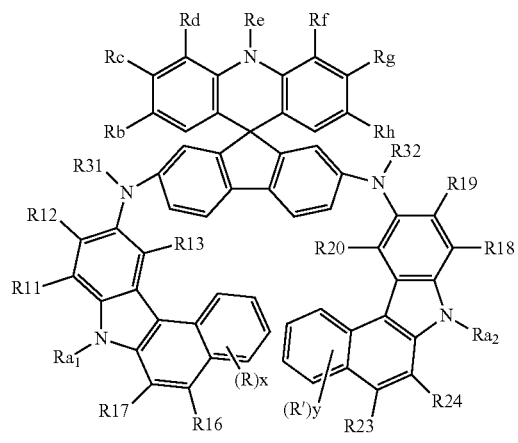
[Formula 12]
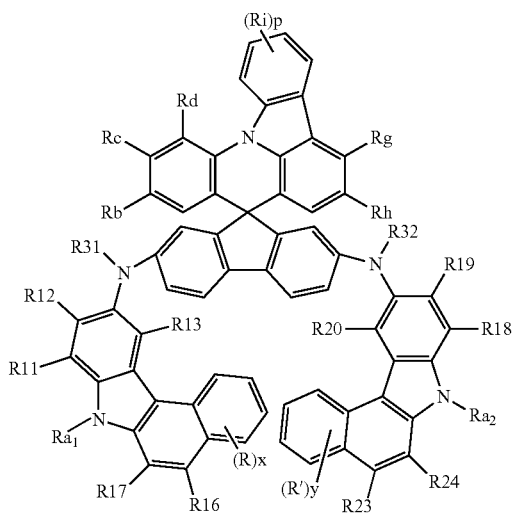
[Formula 13]
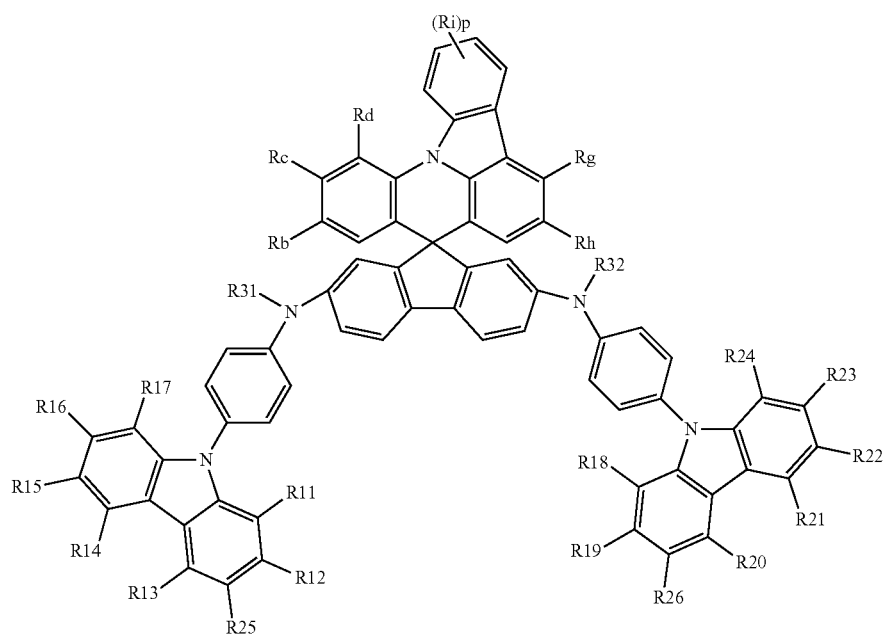

[Formula 14]
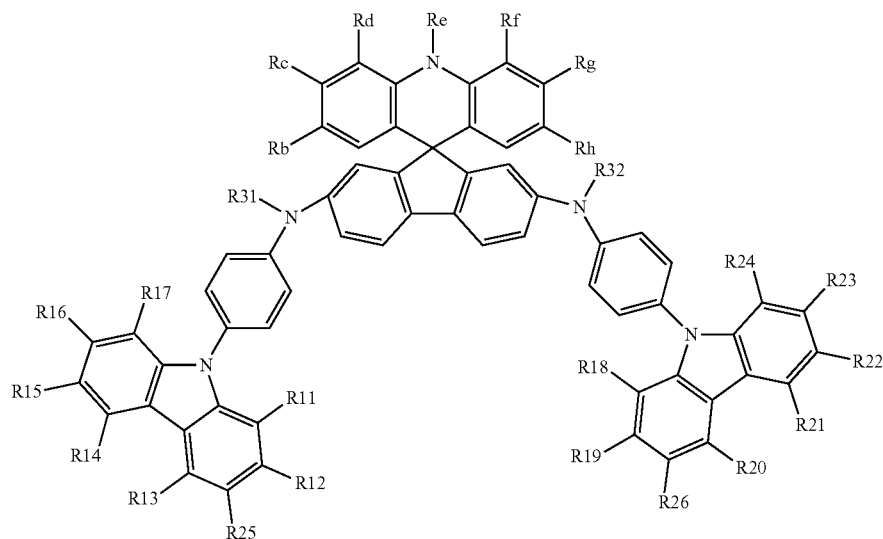
[Formula 15]
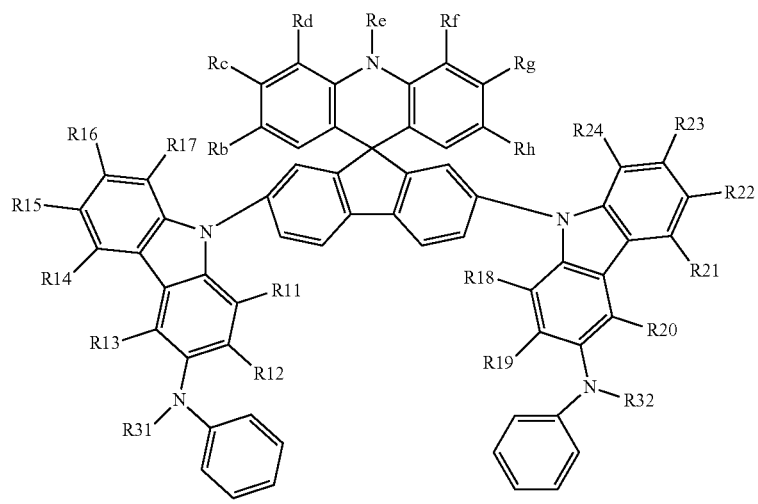
[Formula 16]
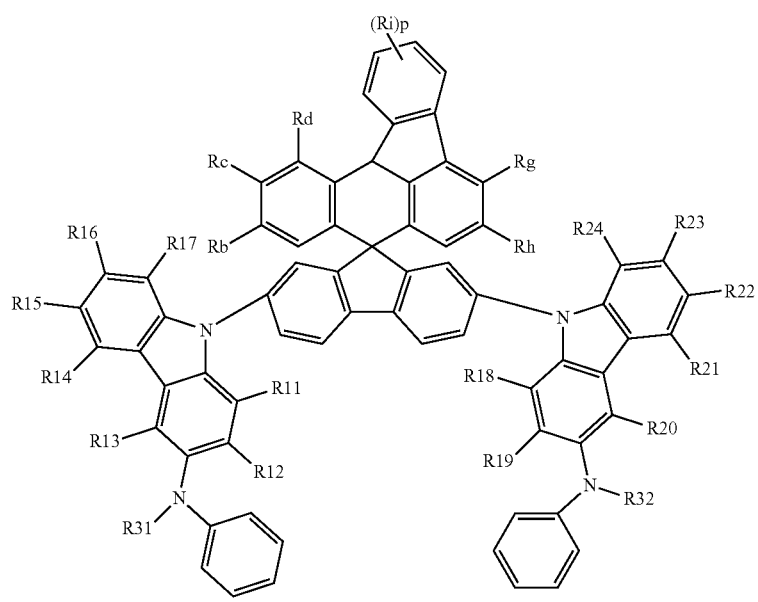

-continued
[Formula 17]
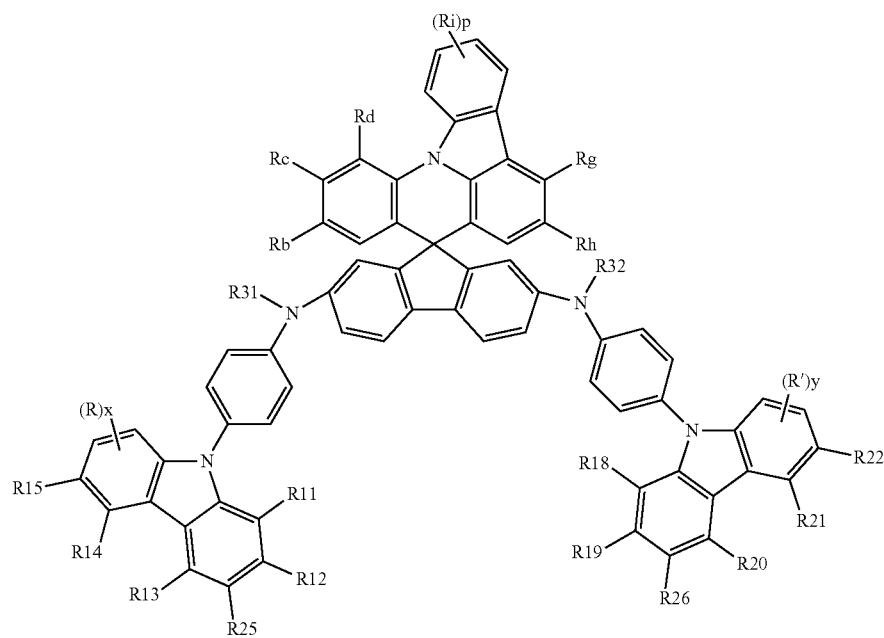
[Formula 18]
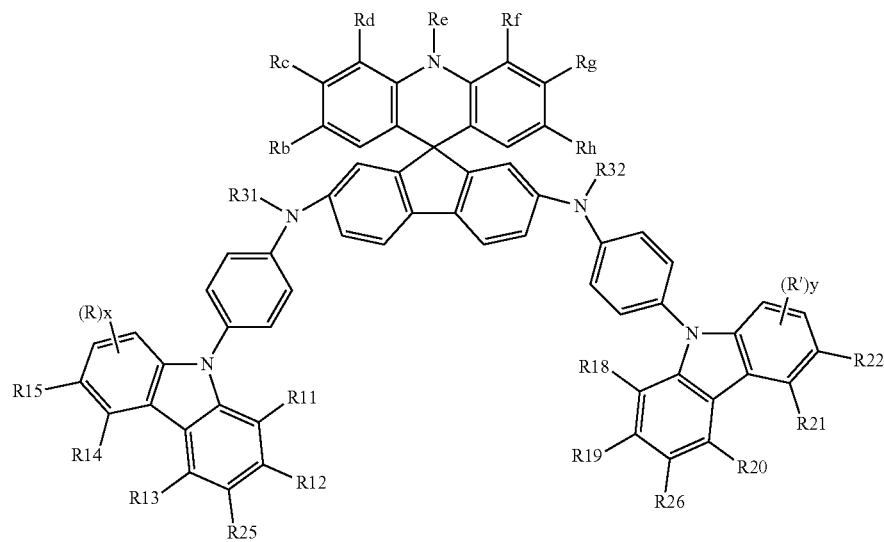

[Formula 19]

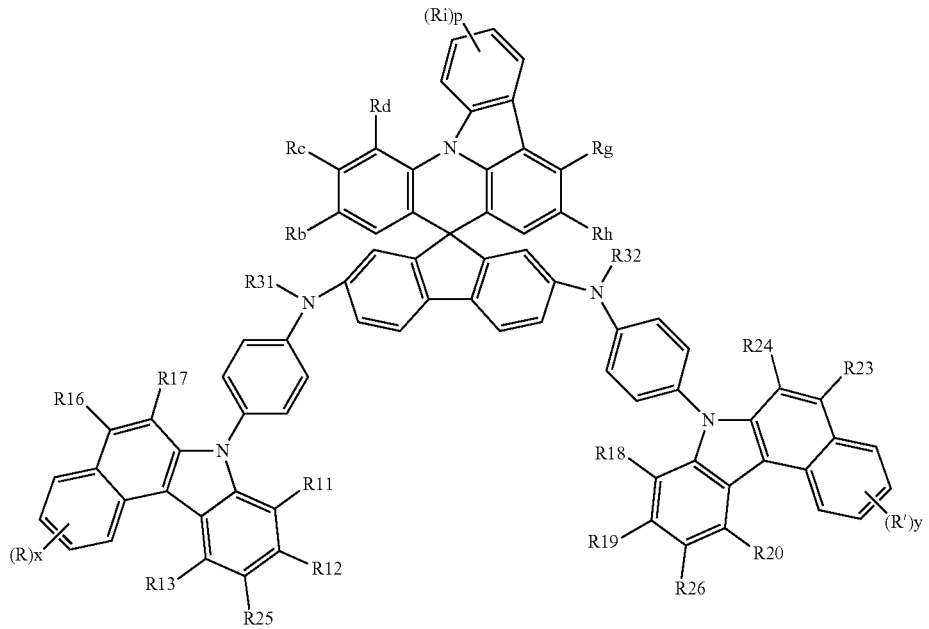

[Formula 20]

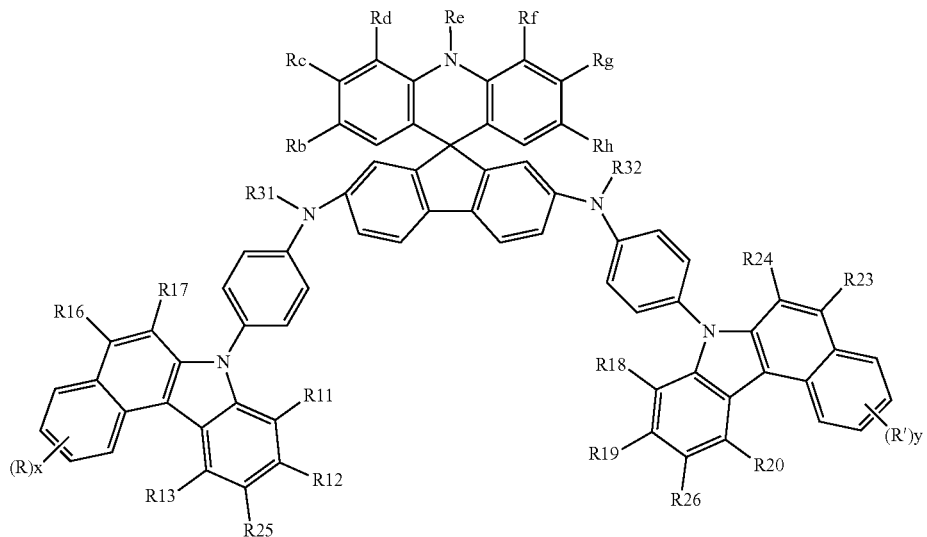

wherein

Rb to Rh are the same as those defined in Formula 1,

Ri and p are the same as those defined in Formulas 3 and 4,

Ra1, Ra2, R11 to R26, R31, R32, R and R' are independently selected from the group consisting of hydrogen, deuterium, a substituted or unsubstituted alkyl group, a substituted or unsubstituted aryl group, a substituted or unsubstituted heterocyclic group, and a substituted or unsubstituted arylamine group, and may be connected to adjacent groups to form a monocycle or fused cycle including an aliphatic cycle, an aromatic cycle or a hetero cycle, and x and y are independently an integer of 1 to 4, in the case where x is 2 or more, Rs are the same as or different from each other, and in the case where y is 2 or more, R's are the same as or different from each other.

4. The compound according to claim 1, wherein in Formula 1, R3, Ra and Rd are an aryl group, t is 2, and Rb to Rc, Re to Rg, R1 and R2 are hydrogen.

5. The compound according to claim 2, wherein in Formula 3 or 4, R3 and Ra are an aryl group, t is 2, and Rb to Rc, Rg to Ri, R1, and R2 are hydrogen.

6. The compound according to claim 1, wherein Formula 1 is represented by the following Structural Formula:

[Structural Formula 1]
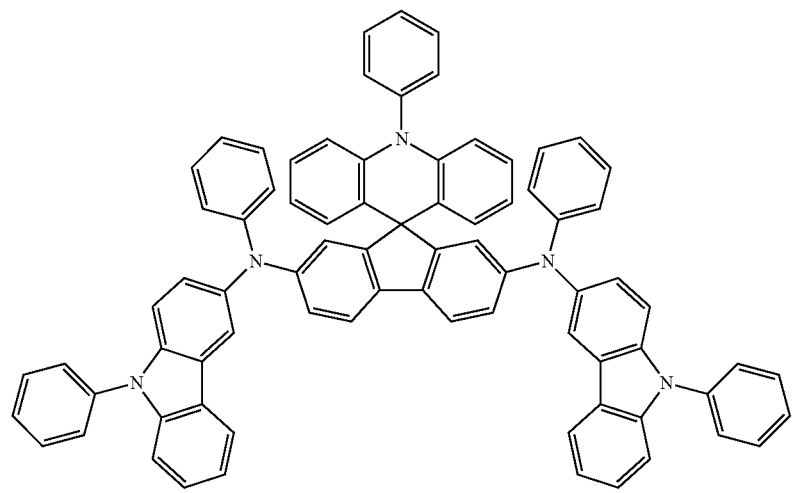
[Structural Formula 2]
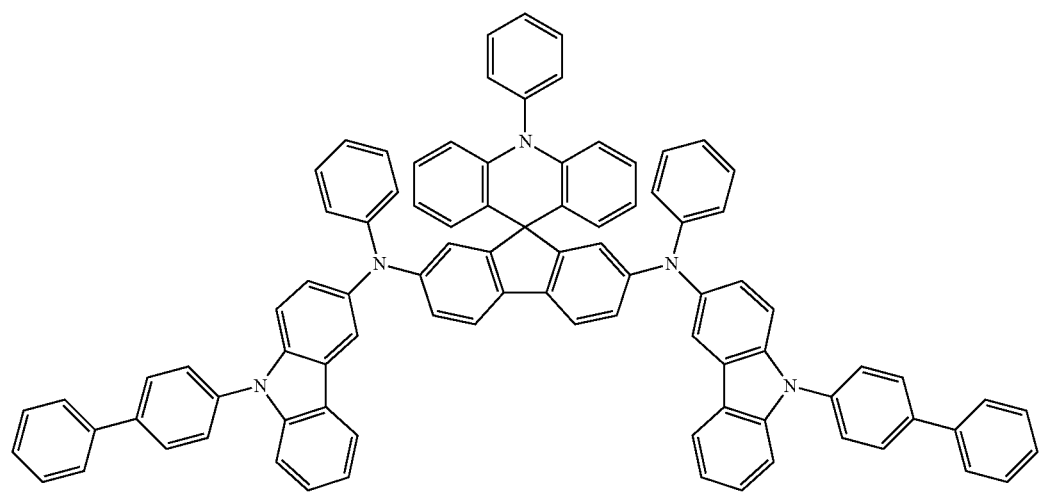
[Structural Formula 3]
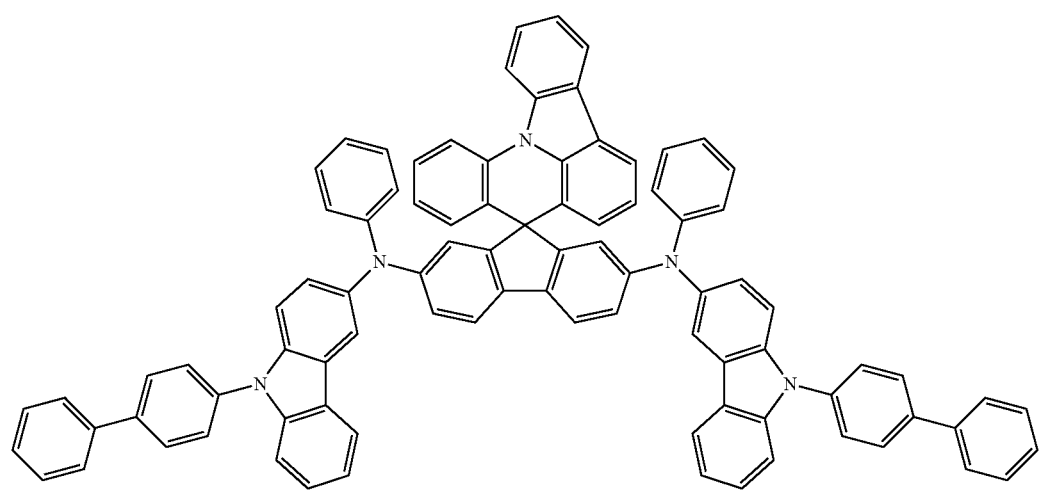

[Structural Formula 4]
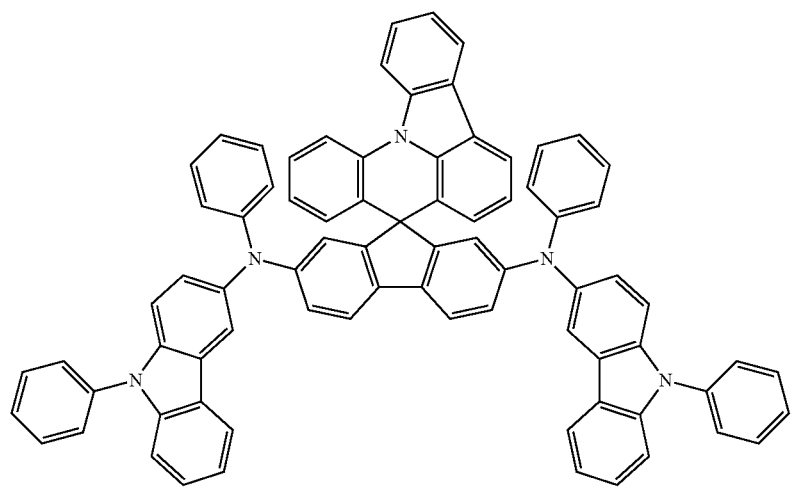
[Structural Formula 5]
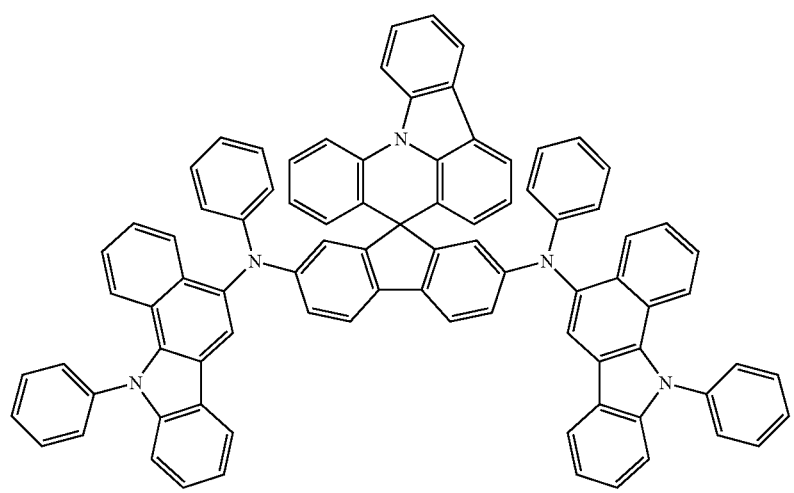
[Structural Formula 6]
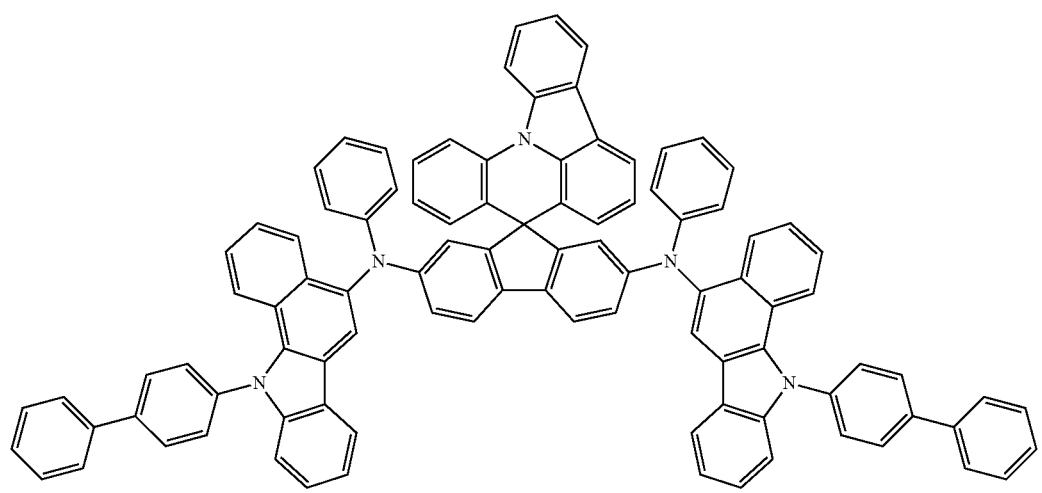

[Structural Formula 7]
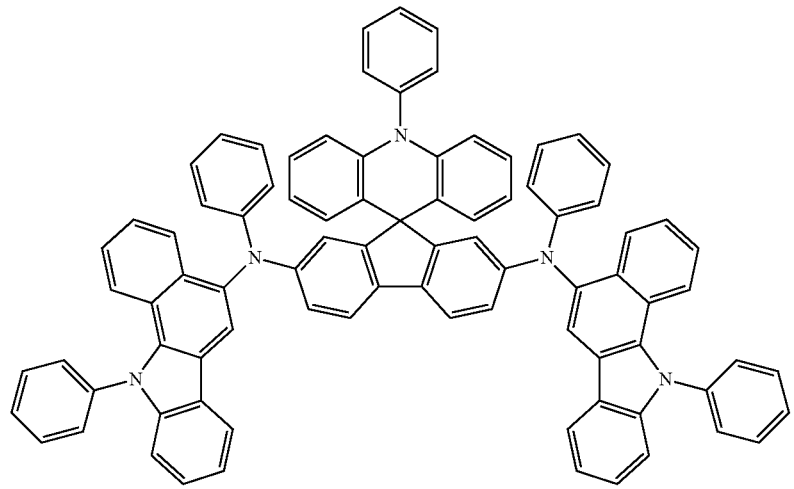
[Structural Formula 8]
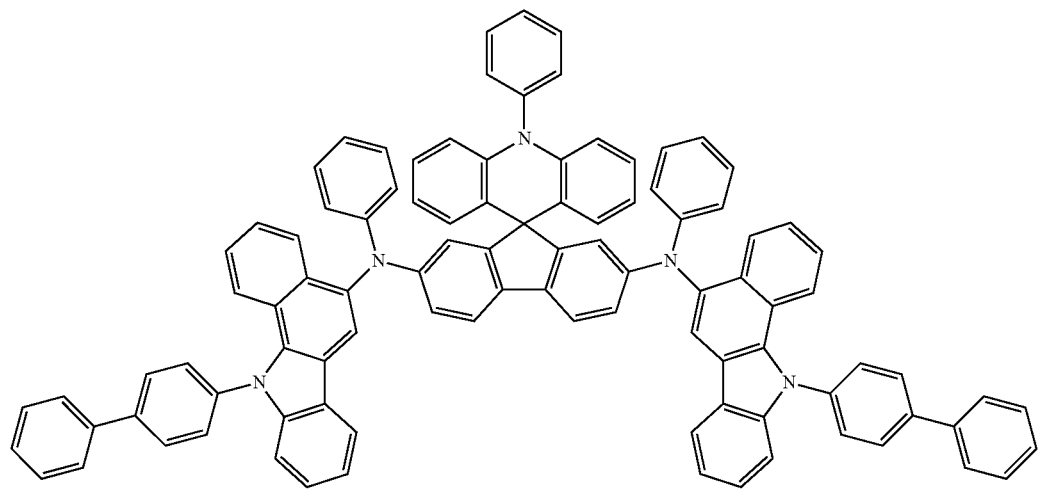
[Structural Formula 9]
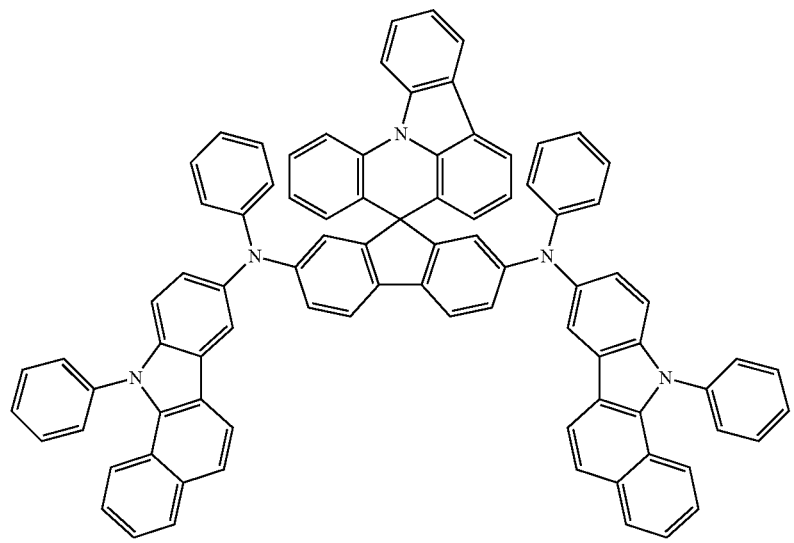

[Structural Formula 10]
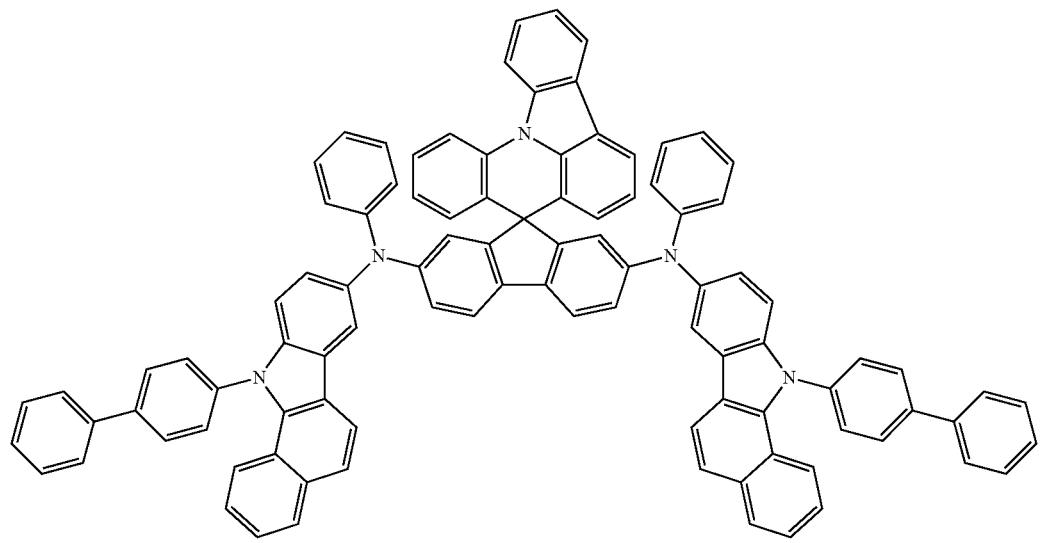
[Structural Formula 11]
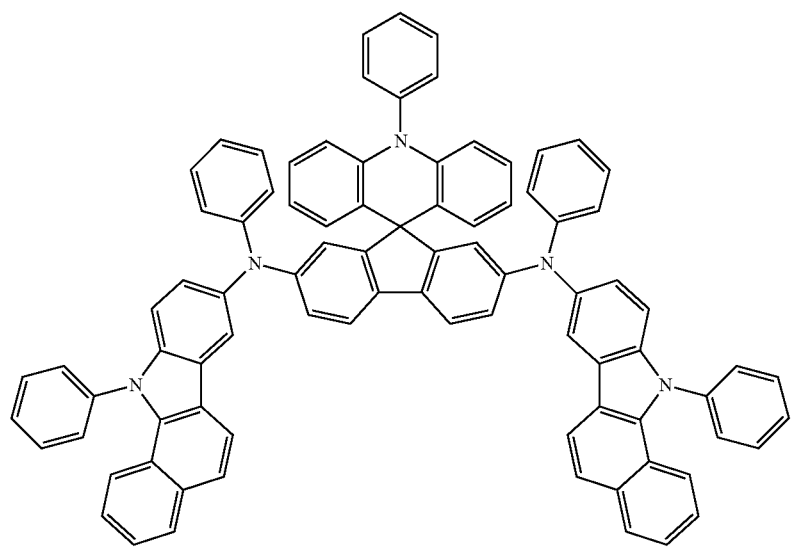
[Structural Formula 12]
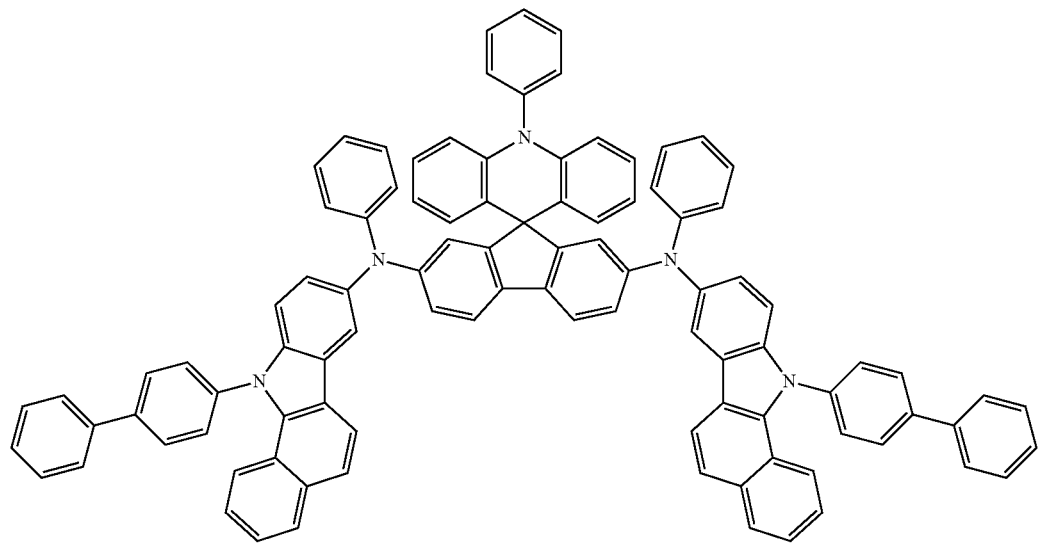

[Structural Formula 13]
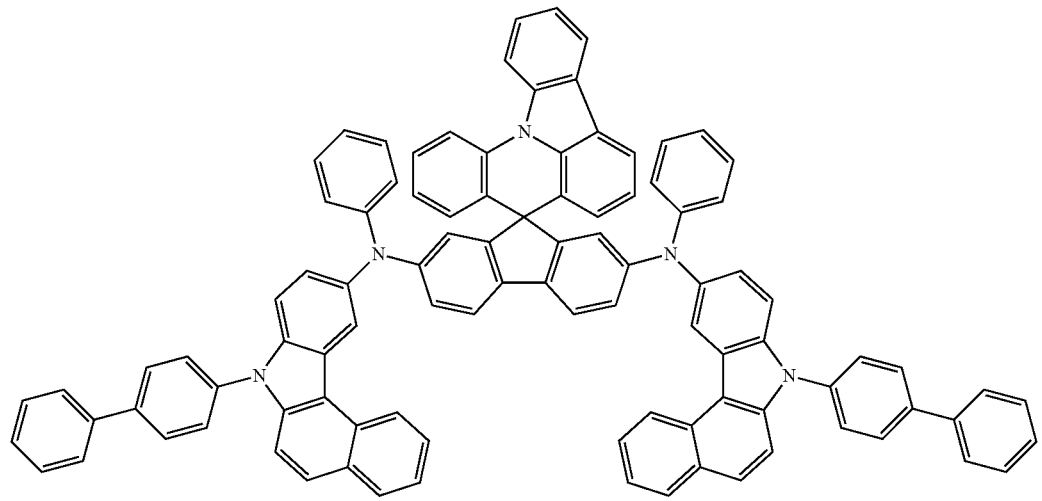
[Structural Formula 14]
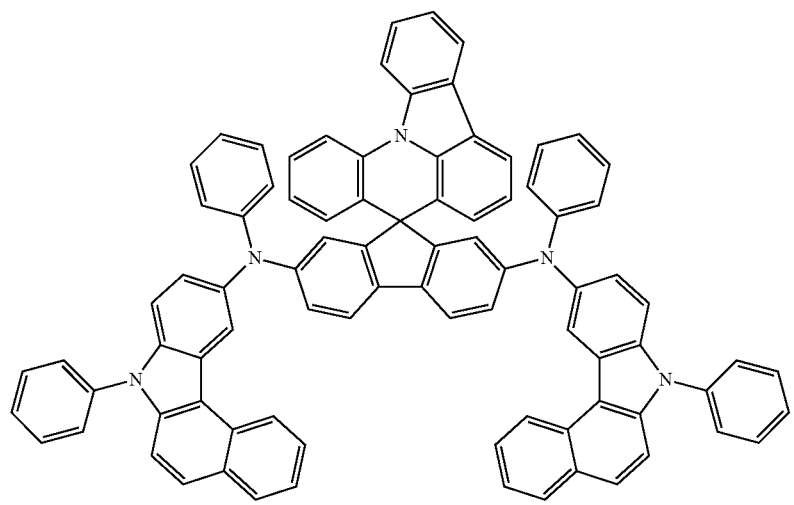
[Structural Formula 15]
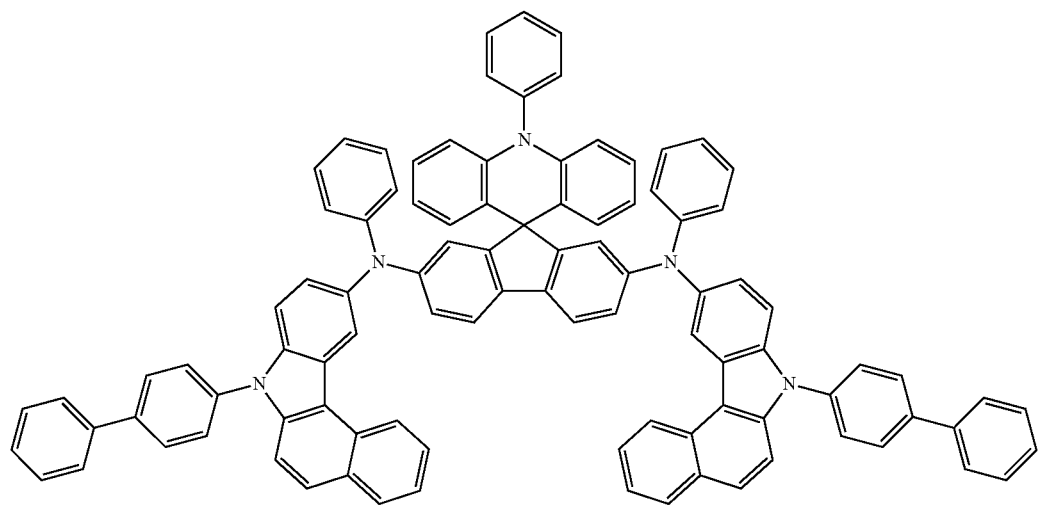

[Structural Formula 16]
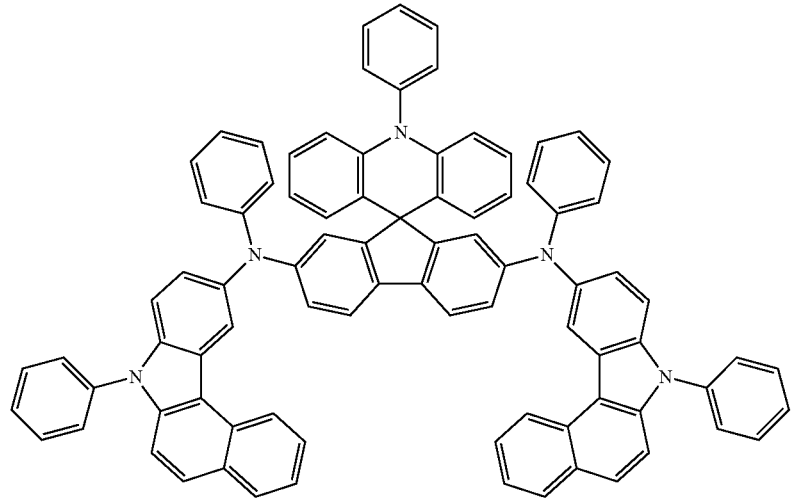
[Structural Formula 17]
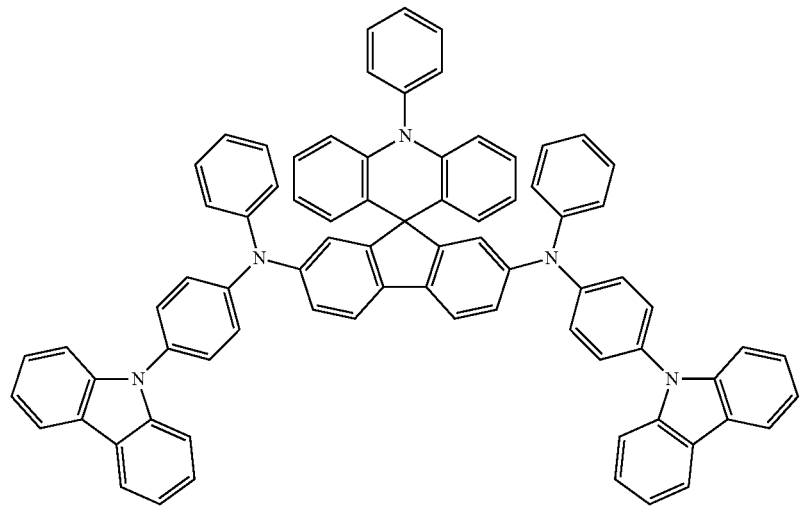
[Structural Formula 18]
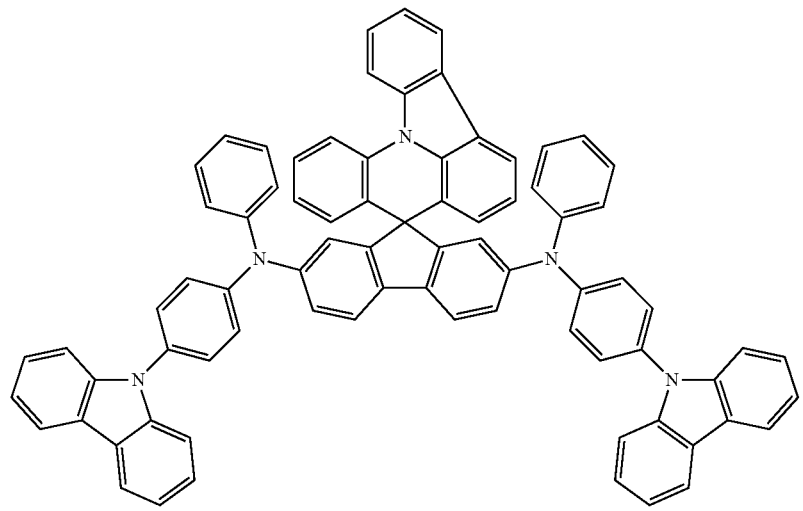

[Structural Formula 19]
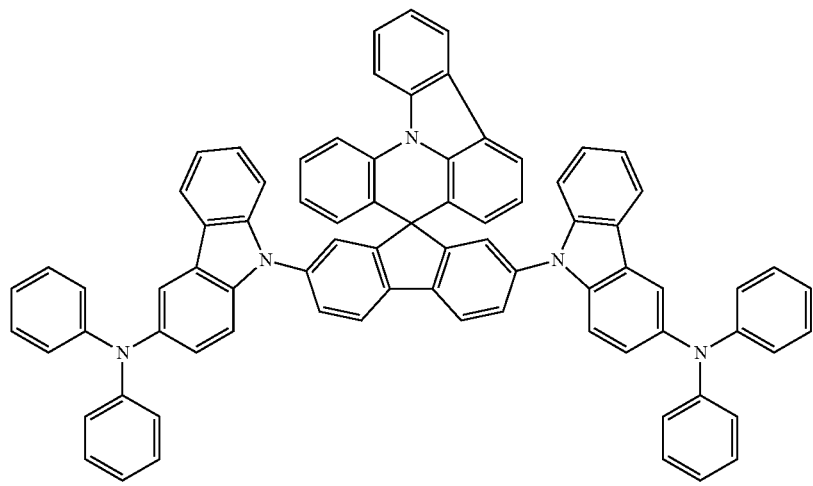
[Structural Formula 20]
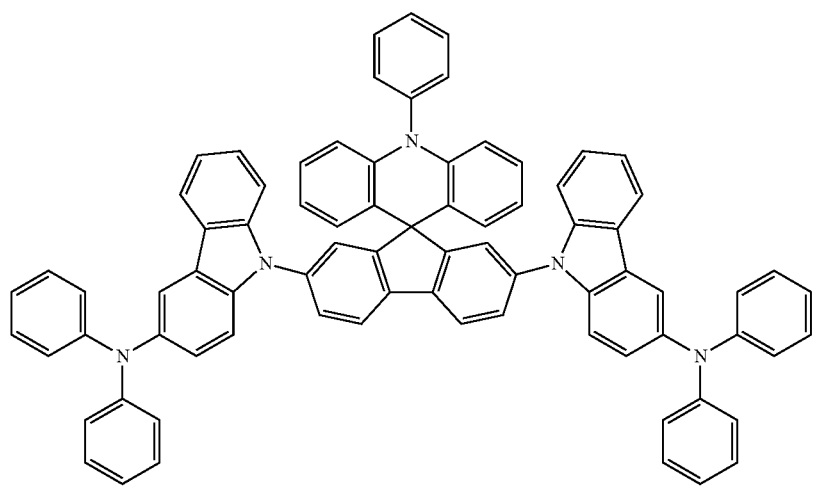
[Structural Formula 21]
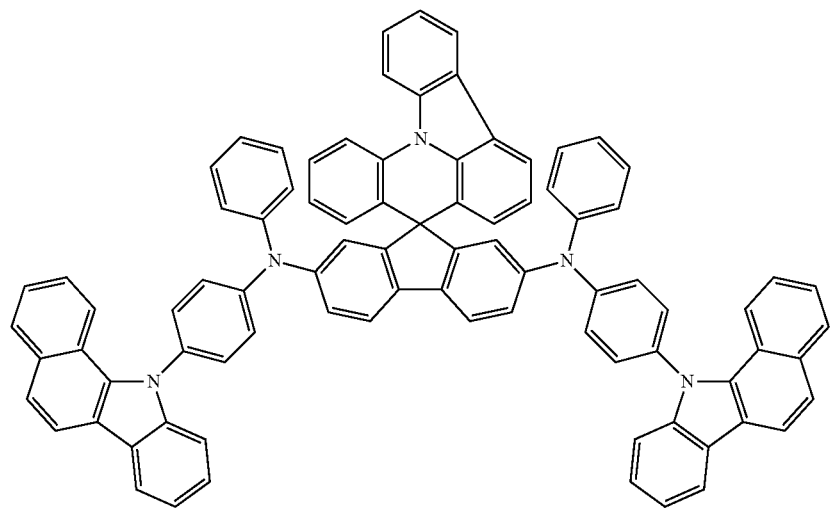

[Structural Formula 22]
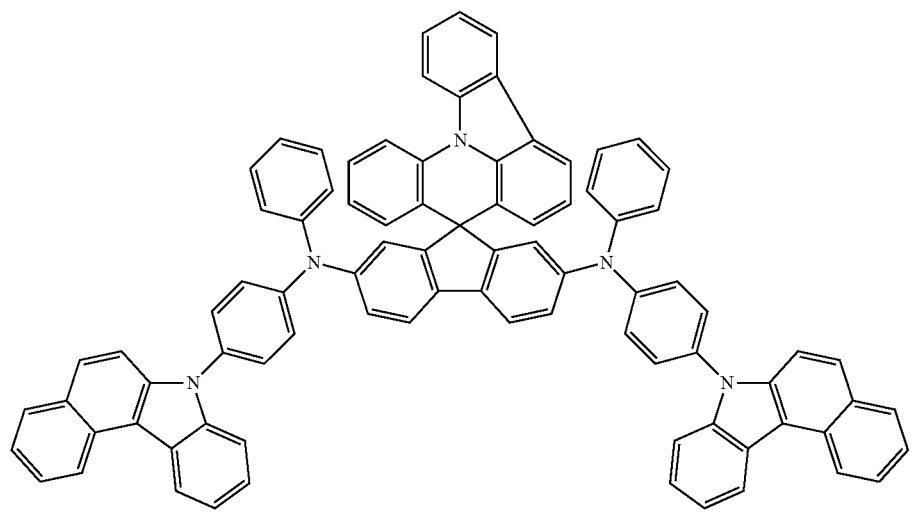
[Structural Formula 23]
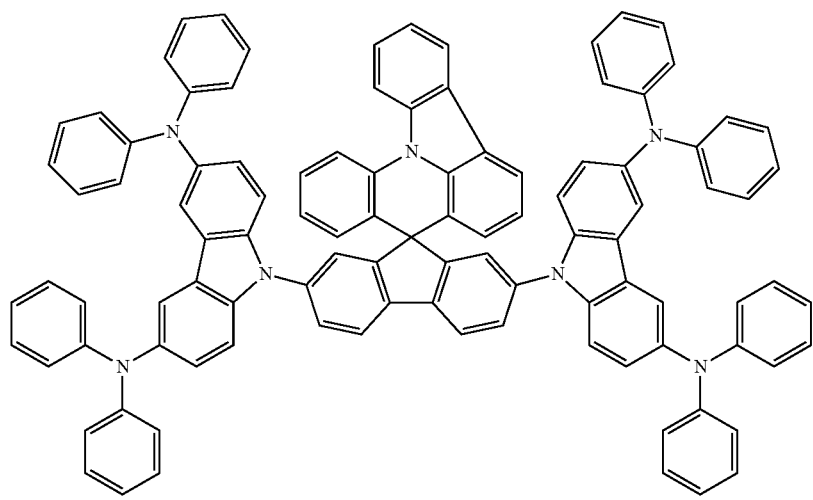
[Structural Formula 24]
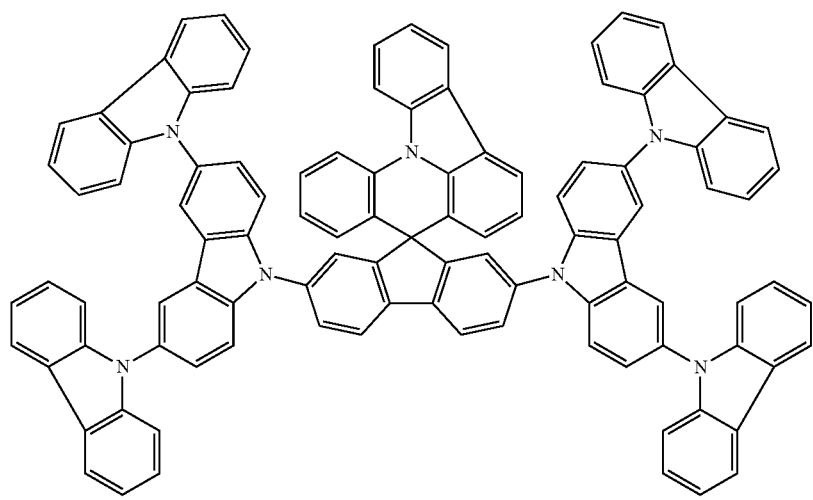

[Structural Formula 25]
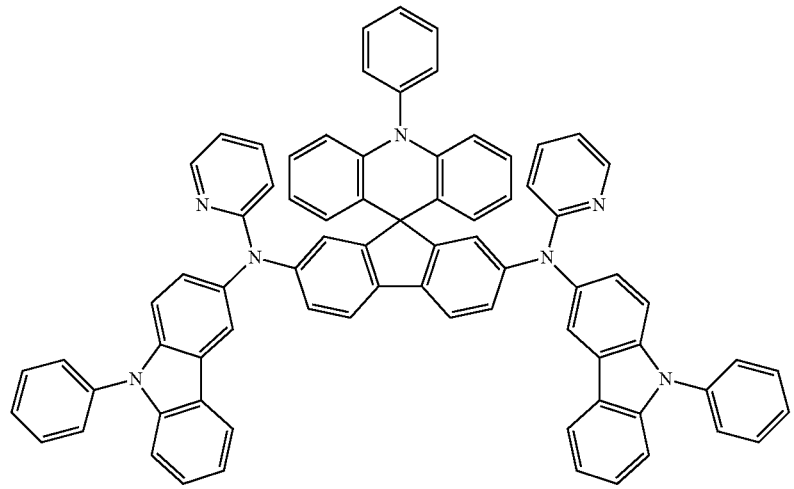
[Structural Formula 26]
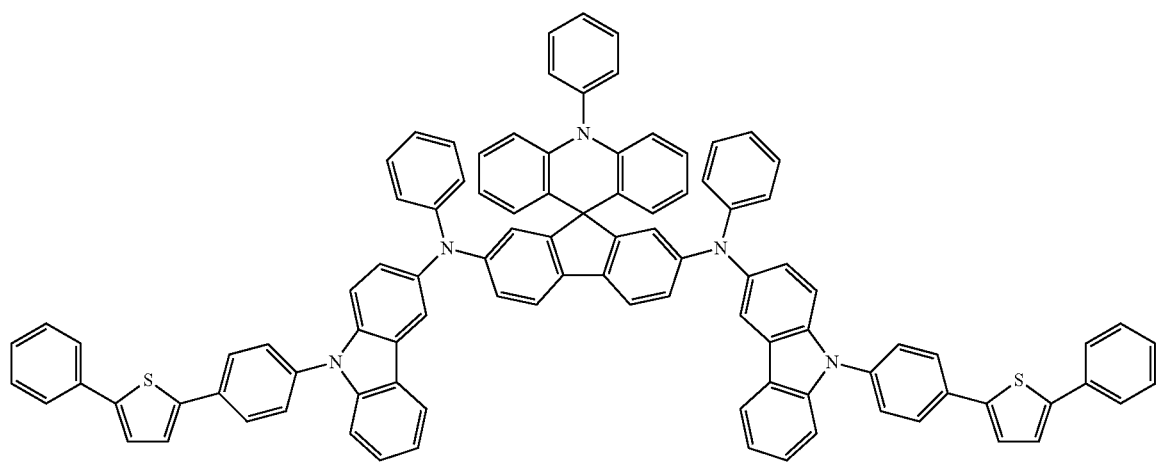
[Structural Formula 27]
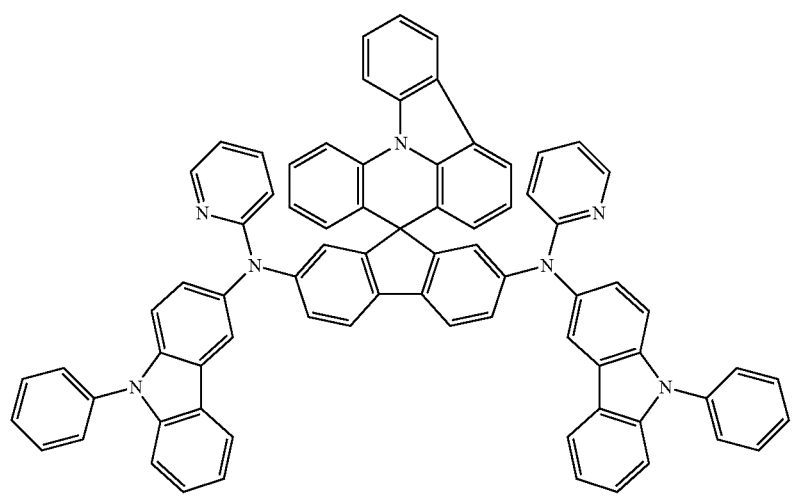

[Structural Formula 28]
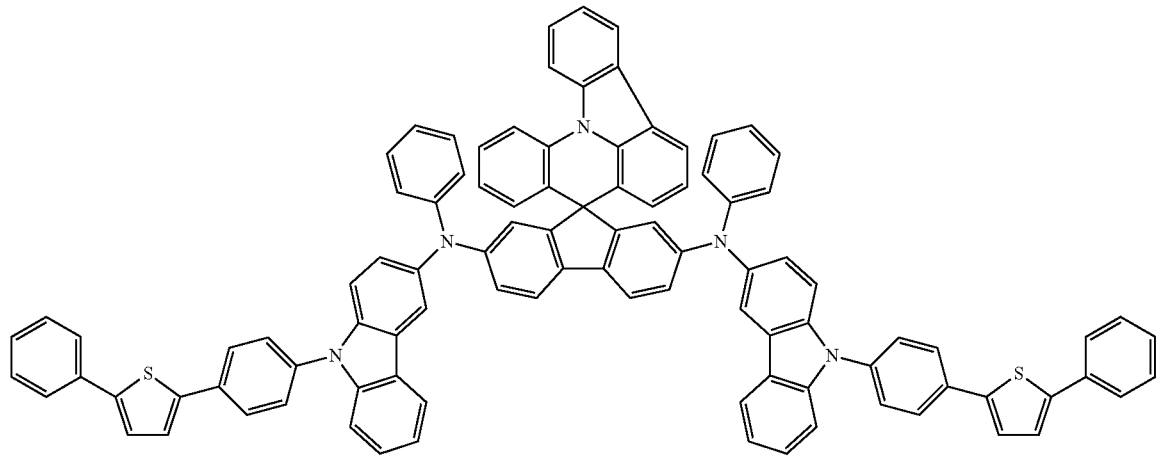
[Structural Formula 29]
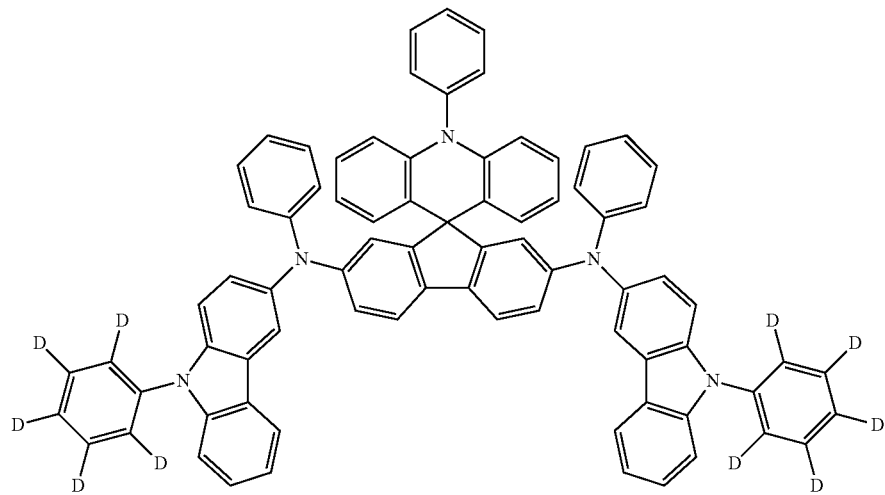
[Structural Formula 30]
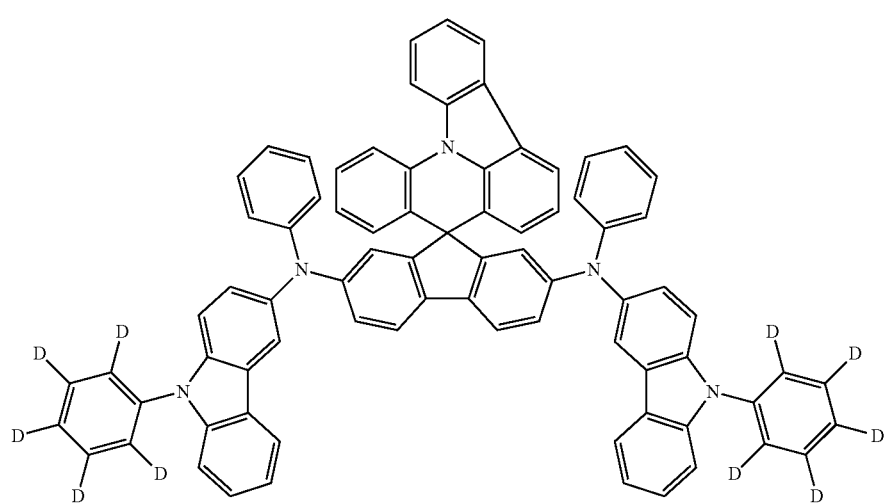

[Structural Formula 31]
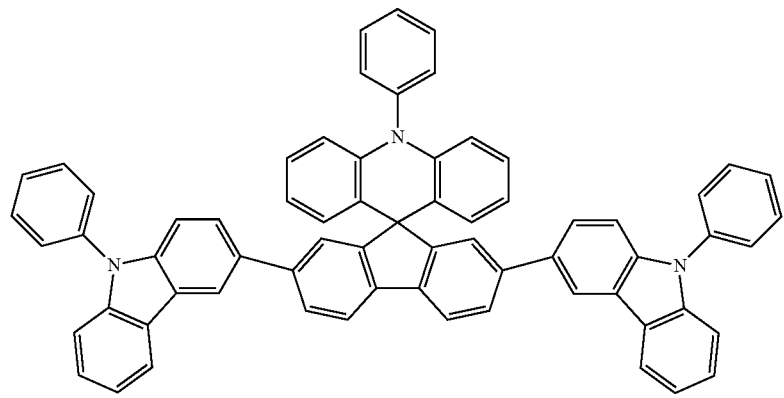
[Structural Formula 32]
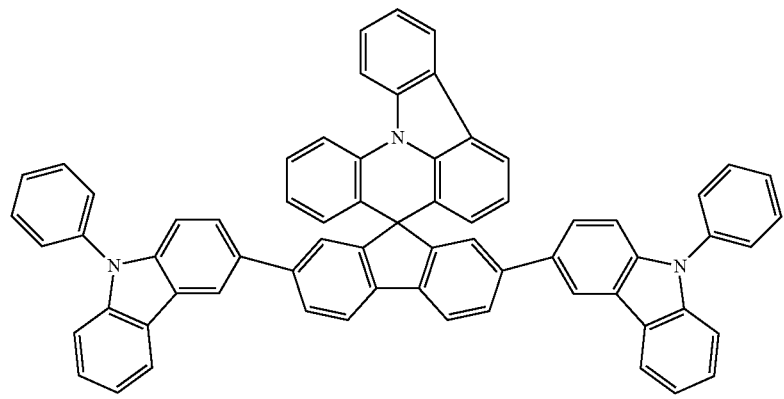
[Structural Formula 33]
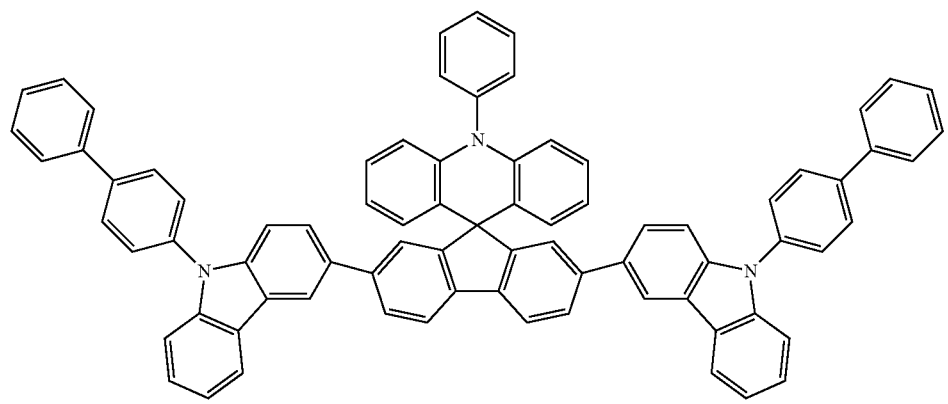
[Structural Formula 34]
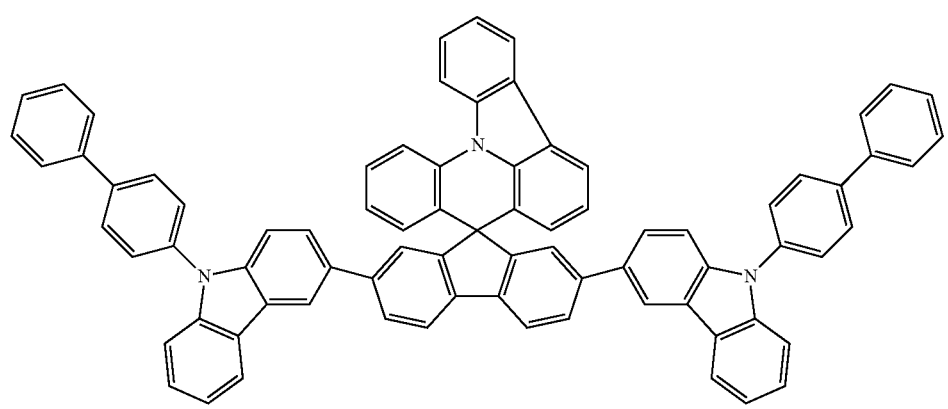

-continued
[Structural Formula 35]
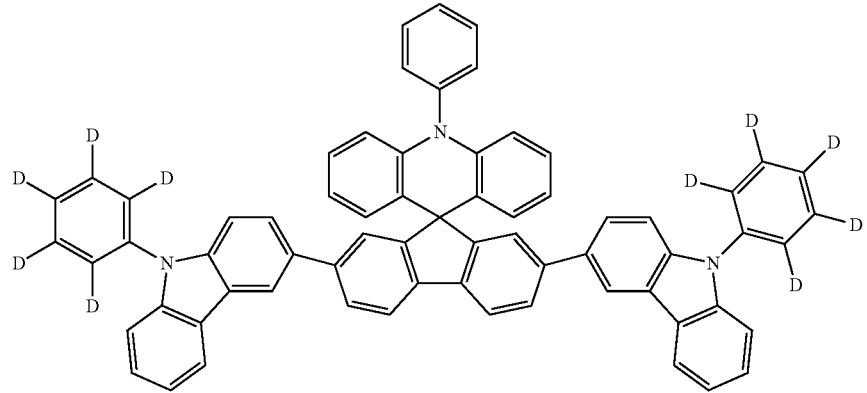
[Structural Formula 36]
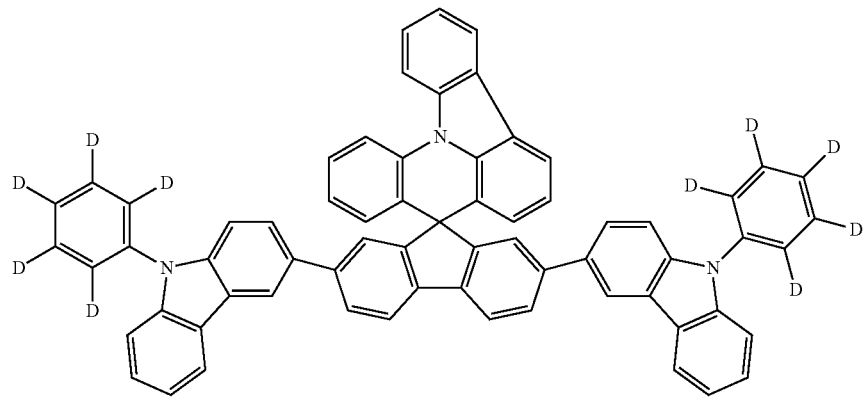
[Structural Formula 37]
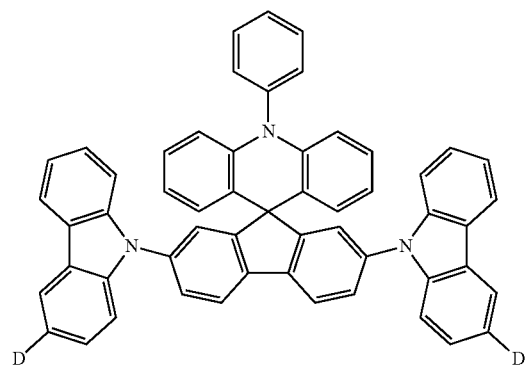
[Structural Formula 38]
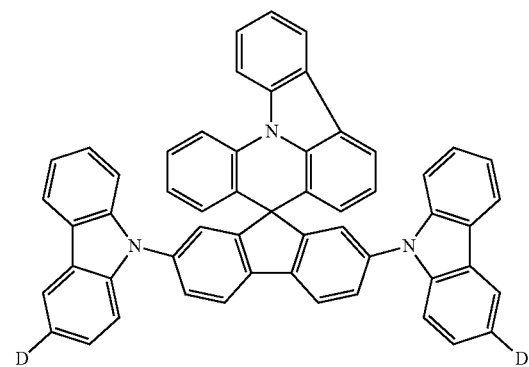

[Structural Formula 39]

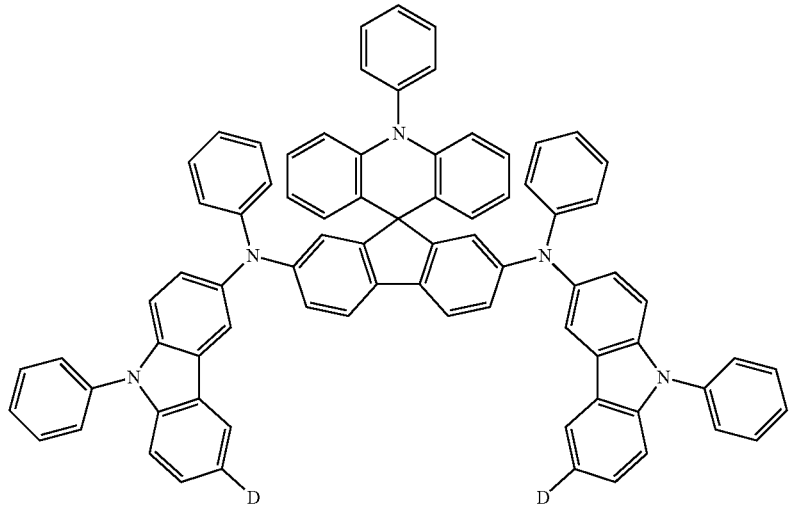

[Structural Formula 40]

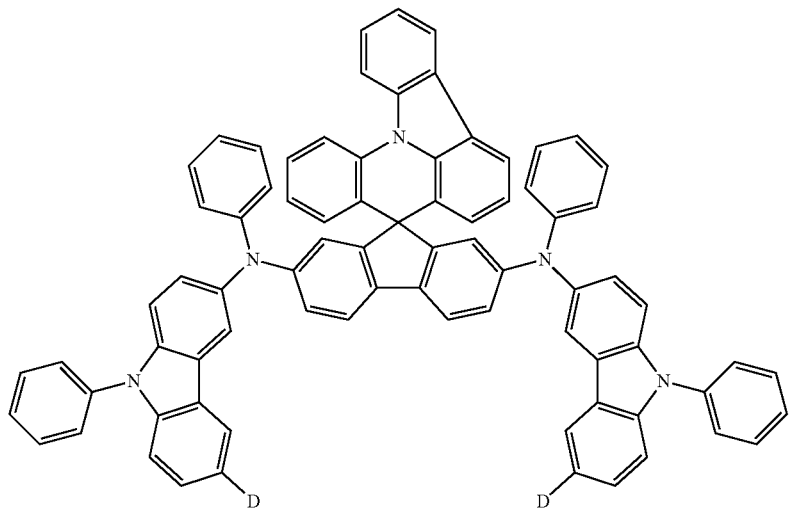

7. An organic electronic device comprising a first electrode, a second electrode, and one or more organic material layers that are disposed between the first electrode and the second electrode, wherein one or more layers of the organic material layers comprise the compound of Formula 1 according to claim 1.

8. The organic electronic device according to claim 7, wherein the organic material layer comprises a hole injection layer, a hole transport layer, a hole injection and transport layer or a hole extraction layer comprising the compound of Formula 1.

9. The organic electronic device according to claim 7, wherein the organic material layer comprises a hole injection layer comprising the compound of Formula 1.

10. The organic electronic device according to claim 8, wherein the organic electronic device comprises an electron transport layer comprising a compound having a functional group selected from an imidazole group, an oxazole group, a thiazol group, a quinoline group and a phenanthroline group.

11. The organic electronic device according to claim 7, wherein the organic electronic device is selected from the group consisting of an organic light emitting diode, an organic solar cell, an organic photoconductor (OPC) drum, and an organic transistor.

12. An organic electronic device comprising a first electrode, a second electrode, and one or more organic material layers that are disposed between the first electrode and the second electrode, wherein one or more layers of the organic material layers comprise the compound of Formula 1 according to claim 2.

13. An organic electronic device comprising a first electrode, a second electrode, and one or more organic material layers that are disposed between the first electrode and the second electrode, wherein one or more layers of the organic material layers comprise the compound of Formula 1 according to claim 3.

14. An organic electronic device comprising a first electrode, a second electrode, and one or more organic material layers that are disposed between the first electrode and the second electrode, wherein one or more layers of the organic material layers comprise the compound of Formula 1 according to claim 4.

15. An organic electronic device comprising a first electrode, a second electrode, and one or more organic material layers that are disposed between the first electrode and the second electrode, wherein one or more layers of the organic material layers comprise the compound of Formula 1 according to claim 5.

16. An organic electronic device comprising a first electrode, a second electrode, and one or more organic material layers that are disposed between the first electrode and the second electrode, wherein one or more layers of the organic material layers comprise the compound of Formula 1 according to claim 6.

* * * * *